United States Patent
Jang et al.

(10) Patent No.: US 12,184,413 B2
(45) Date of Patent: Dec. 31, 2024

(54) DEVICE AND METHOD FOR ENCODING OR DECODING POLAR CODE IN COMMUNICATION SYSTEM

(71) Applicant: SAMSUNG ELECTRONICS CO., LTD., Suwon-si (KR)

(72) Inventors: Min Jang, Suwon-si (KR); Hongsil Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/086,443

(22) Filed: Dec. 21, 2022

(65) Prior Publication Data

US 2023/0119851 A1    Apr. 20, 2023

Related U.S. Application Data

(63) Continuation of application No. PCT/KR2021/008126, filed on Jun. 28, 2021.

(30) Foreign Application Priority Data

Jun. 26, 2020  (KR) .................. 10-2020-0078673

(51) Int. Cl.
*H04L 1/00* (2006.01)
*H03M 13/13* (2006.01)

(52) U.S. Cl.
CPC .......... *H04L 1/0057* (2013.01); *H03M 13/13* (2013.01)

(58) Field of Classification Search
CPC ... H04L 1/0057; H04L 1/0067; H04L 1/0071; H04L 1/0041; H04L 1/0045; H04L 1/0065; H04L 1/08; H03M 13/13; H03M 13/2906; H03M 13/6306; H03M 13/27; H03M 13/2792; H03M 13/6368
See application file for complete search history.

(56) References Cited

U.S. PATENT DOCUMENTS

| | | | |
|---|---|---|---|
| 10,469,201 B2 | 11/2019 | Ahn et al. |
| 10,644,829 B2 | 5/2020 | Zhang et al. |
| 10,868,569 B2 | 12/2020 | Sadiq et al. |
| 10,958,379 B2 | 3/2021 | Kim et al. |
| 10,972,132 B2 | 4/2021 | Jang et al. |

(Continued)

FOREIGN PATENT DOCUMENTS

| KR | 10-2018-0107703 A | 10/2018 |
|---|---|---|
| KR | 10-2019-0111991 A | 10/2019 |

(Continued)

OTHER PUBLICATIONS

Communication issued Jan. 8, 2024 by the European Patent Office for European Patent Application No. 21828508.8.

(Continued)

*Primary Examiner* — Cynthia Britt
(74) *Attorney, Agent, or Firm* — Sughrue Mion, PLLC

(57) ABSTRACT

A method of a transmitting device in a wireless communication system, includes: obtaining an encoded bit stream from information bits using a polar code; transmitting a first signal generated through a first modulation of the encoded bit stream; performing reverse mapping on the encoded bit stream; and transmitting a second signal generated through a second modulation of the reverse-mapped encoded bit stream.

10 Claims, 36 Drawing Sheets

(56) References Cited

U.S. PATENT DOCUMENTS

| | | | |
|---|---|---|---|
| 11,342,945 B2 | 5/2022 | Chen et al. | |
| 2010/0203826 A1* | 8/2010 | Xue | H04L 27/3461 |
| | | | 455/17 |
| 2016/0248547 A1 | 8/2016 | Shen et al. | |
| 2018/0331788 A1 | 11/2018 | Kim et al. | |
| 2019/0044544 A1* | 2/2019 | Liao | H04L 1/0057 |
| 2019/0140663 A1* | 5/2019 | Noh | H04L 1/007 |
| 2020/0052809 A1 | 2/2020 | Hong et al. | |
| 2020/0127761 A1* | 4/2020 | Wang | H03M 13/6356 |
| 2020/0162196 A1 | 5/2020 | Jeong et al. | |
| 2020/0163052 A1* | 5/2020 | Ko | H04J 11/0079 |
| 2021/0058792 A1* | 2/2021 | Bhushan | H04L 63/0428 |
| 2023/0113300 A1* | 4/2023 | Li | H04L 1/1893 |
| | | | 714/726 |
| 2024/0073958 A1* | 2/2024 | Baldemair | H04W 74/0833 |

FOREIGN PATENT DOCUMENTS

| | | |
|---|---|---|
| KR | 10-2019-0123801 A | 11/2019 |
| KR | 10-2020-0004300 A | 1/2020 |
| KR | 10-2020-0006560 A | 1/2020 |
| KR | 10-2338508 B1 | 12/2021 |
| WO | 2019099319 A1 | 5/2019 |

OTHER PUBLICATIONS

International Search Report dated Sep. 17, 2021, issued by the International Searching Authority in International Application No. PCT/KR2021/008126 (PCT/ISA/210).

Written Opinion dated Sep. 17, 2021, issued by the International Searching Authority in International Application No. PCT/KR2021/008126 (PCT/ISA/237).

MediaTek Inc., "Polar rate-matching design and performance," R1-1713705, 3GPP TSG RAN WG1 RAN1 Meeting #90, Prague, Czech, Aug. 21-25, 2017, Total 7 pages.

Communication dated Sep. 28, 2023, issued by the European Patent Office in European Application No. 21828508.8.

Communication dated Jun. 16, 2024, issued by the Korean Intellectual Property Office in Korean Patent Application No. 10-2020-0078673.

* cited by examiner

DEVICE AND METHOD FOR ENCODING OR DECODING POLAR CODE IN COMMUNICATION SYSTEM

CROSS-REFERENCE TO RELATED APPLICATIONS

This application is a by-pass continuation application of International Application No. PCT/KR2021/008126, filed on Jun. 28, 2021, which based on and claims priority to Korean Patent Application No. 10-2020-0078673, filed on Jun. 26, 2020, in the Korean Intellectual Property Office, the disclosures of which are incorporated by reference herein in their entireties.

BACKGROUND

1. Field

The disclosure relates to a communication system, and more particularly, to an apparatus and a method for encoding or decoding a polar code in a wireless communication system.

2. Description of Related Art

To satisfy a wireless data traffic demand, which is growing after a $4^{th}$ generation (4G) communication system is commercialized, efforts are exerted to develop an advanced $5^{th}$ generation (5G) communication system or a pre-5G communication system. For this reason, the 5G communication system or the pre-5G communication system is referred to as a beyond 4G network communication system or a post long term evolution (LTE) system.

To achieve a high data rate, the 5G communication system considers its realization in an extremely high frequency. To mitigate a path loss of propagation and to extend a propagation distance in a frequency range (FR) 1 bandwidth high frequency near 6 GHz and the extremely high frequency band over 6 GHZ, the 5G communication system is discussing beamforming, massive multiple-input multiple-output (MIMO), full dimensional (FD)-MIMO, array antenna, analog beamforming, and large scale antenna techniques.

Also, for network enhancement of the system, the 5G communication system is developing techniques such as evolved small cell, advanced small cell, cloud radio access network (RAN), ultra-dense network, device to device (D2D) communication, wireless backhaul, moving network, cooperative communication, coordinated multi-points (COMP), and receive interference cancellation.

Besides, the 5G system developed hybrid frequency shift keying and quadrature amplitude modulation (FQAM) and sliding window superposition coding (SWSC) as advanced coding modulation (ACM) schemes, and filter bank multi carrier (FBMC), non-orthogonal multiple access (NOMA), and sparse code multiple access (SCMA) as advanced access technologies.

Internet is evolving from a human-centered connection network in which humans create and consume information, to an Internet of things (IoT) network which exchanges and processes information between distributed components such as objects. Internet of everything (IoE) technology that combines IoT technology with big data processing technology through connection with a cloud server is also emerging. To implement the IoT, technology elements such as sensing technology, wired and wireless communication and network infrastructure, service interface technology, and security technology are required, and techniques such as a sensor network for connection between objects, machine-to-machine (M2M), and machine type communication (MTC) are recently studied. The IoT environment may be applied to fields such as a smart home, a smart building, a smart city, a smart car or a connected car, a smart grid, health care, smart home appliances, and advanced medical services through convergence and composition between intelligent internet technology (IT) technology which creates new values in human life by collecting and analyzing data generated from the connected objects and various industries.

Hence, various attempts for applying the 5G communication system to the IoT network are being made. For example, the technologies such as sensor network, M2M, and MTC are implemented by, for example, beamforming, multiple input multiple output (MIMO), and array antenna which are the 5G communication technologies. Applying a cloud radio access network (RAN) as the big data processing technology as aforementioned may be said to be an example of the convergence of the 5G technology and the IoT technology.

If data is transmitted and received between a transmitter and a receiver in a communication and broadcasting system, data errors may generally occur due to noise existing in a communication channel. There are error detection codes and error correcting codes (ECC) schemes as coding schemes designed to correct the error generated by the communication channel at the receiver. In particular, the ECC used for the communication between the transmitter and the receiver is referred to as channel coding. The ECC scheme_transmits data bits to transmit by adding a redundant bit, and the receiver perform a decoding operation for correcting an error included the data bits to transmit by utilizing the redundant bit.

There are various schemes for the ECC scheme. For example, convolutional coding, turbo coding, low-density parity-check (LDPC) coding, and polar coding are present. In particular, the turbo coding, the LDPC coding, and the polar coding are excellent coding having performance almost close to theoretical channel capacity and are utilized in various communication systems.

The polar coding (or polar code) among such ECC schemes is the first code theoretically proven to achieve point-to-point channel capacity with low decoding complexity based on channel polarization occurring in successive cancellation (SC) decoding. In addition, it is confirmed that the polar code exhibits excellent performance if SC-list (SCL) decoding is used. Particularly, if a concatenated outer code such as a Cyclic Redundancy Check (CRC) code and the SCL decoding are used; better performance compared to other existing channel codes has been identified. Third Generation Partnership Project (3GPP) New Radio (NR) has agreed to use the polar code in transmitting control information over a control channel.

SUMMARY

Provided are an apparatus and a method for performing symbol-level rate-matching in repetition using a polar code in a communication system.

In addition, provided are an apparatus and a method for using a different demultiplexer (DEMUX) for a repeated bit stream, in repetition using a polar code in a wireless communication system. In addition, provided are an apparatus and a method for using a different reverse interleaver for a repeated bit stream, in repetition using a polar code in a wireless communication system.

In addition, provided are an apparatus and a method for using a reverse DEMUX for some bits set through inner segmentation, to support a low code rate in using a polar code in a wireless communication system. In addition, provided are an apparatus and a method for using a reverse interleaver for some bits set through inner segmentation, to support a low code rate in using a polar code in a wireless communication system.

According to an aspect of the disclosure, a method of a transmitting device in a wireless communication system, includes: obtaining an encoded bit stream from information bits using a polar code; transmitting a first signal generated through a first modulation of the encoded bit stream; performing reverse mapping on the encoded bit stream; and transmitting a second signal generated through a second modulation of the reverse-mapped encoded bit stream.

The reverse mapping may be performed on the encoded bit stream through a reverse demultiplexer (DEMUX).

The reverse mapping performed on the encoded bit stream may include a cyclic shift of a designated size.

The reverse mapping performed on the encoded bit stream may include interleaving according to a transmit count of the encoded bit stream.

The first modulation of the encoded bit stream may be 16 quadrature amplitude modulation (QAM), 64 QAM, 256 QAM, or 1024 QAM.

According to an aspect of the disclosure, a method of a receiving device in a wireless communication system, includes: receiving a first signal generated through a first modulation of a bit stream; receiving a second signal generated through reverse-mapping and a second modulation of the bit stream; and obtaining information bits of the bit stream by combining the first signal and the second signal based on the reverse mapping, wherein the bit stream is encoded using a polar code.

The reverse mapping of the bit stream may be performed through a reverse demultiplexer (DEMUX).

The reverse mapping of the bit stream may include cyclic shift of a designated size.

The reverse mapping may include interleaving according to a transmit count of the bit stream.

The first modulation may be 16 quadrature amplitude modulation (QAM), 64 QAM, 256 QAM, or 1024 QAM.

According to an aspect of the disclosure, a transmitting device in a wireless communication system, includes: at least one transceiver; and at least one processor configured to: obtain an encoded bit stream from information bits using a polar code, transmit a first signal generated through a first modulation of the encoded bit stream, perform reverse mapping on the encoded bit stream, and transmit a second signal generated through a second modulation of the reverse-mapped encoded bit stream.

According to an aspect of the disclosure, a receiving device in a wireless communication system, includes: at least one transceiver; and at least one processor configured to: receive a first signal generated through a first modulation of a bit stream, receive a second signal generated through reverse mapping and a second modulation of the bit stream, and obtain information bits of the bit stream by combining the first signal and the second signal based on the reverse mapping, wherein the bit stream is encoded using a polar code.

According to an aspect of the disclosure, a method of a transmitting device in a wireless communication system, the method including: obtaining an encoded bit stream from information bits using a polar code; obtaining an output bit sequence through a rate matching of the encoded bit stream; performing a first interleaving on a first bit sequence of the output bit sequence; performing a second interleaving on a second bit sequence other than the first bit sequence in the output bit sequence; obtaining a code sequence based on concatenation of a first result of the first interleaving and a second result of the second interleaving; and transmitting a signal according to the code sequence to a receiving device, wherein the second interleaving is a reverse operation of the first interleaving.

According to an aspect of the disclosure, a method of a receiving device in a wireless communication system, includes: receiving a signal according to a code sequence from a transmitting device; performing a first deinterleaving on a first code sequence of the code sequence; performing a second deinterleaving on a second code sequence excluding the first code sequence in the code sequence; obtaining an output bit sequence by concatenating a first result of the first deinterleaving and a second result of the second deinterleaving; and obtaining information bits by de-rate matching and polar-decoding the output bit sequence, wherein the second deinterleaving is a reverse operation of the first deinterleaving.

An apparatus and a method according to one or more embodiments of the present disclosure, may improve error correction performance, by performing a reverse mapping technique on bit streams encoded using a polar code.

Effects obtainable from the present disclosure are not limited to the above-mentioned effects, and other effects which are not mentioned may be clearly understood by those skilled in the art of the present disclosure through the following descriptions.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
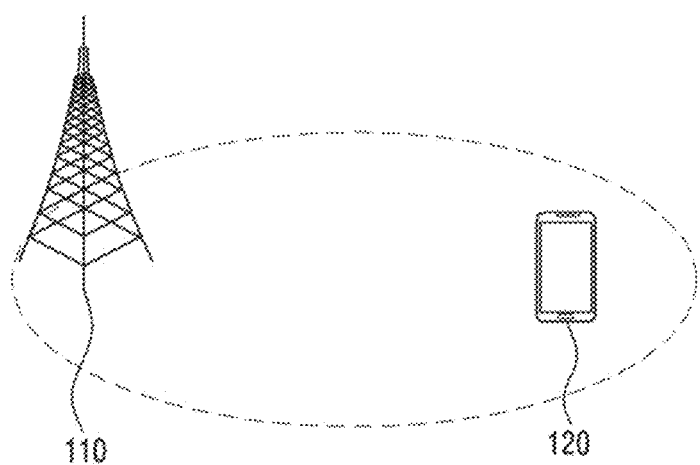
FIG. 1 illustrates a wireless communication system according to one or more embodiments of the present disclosure.

Terms used in the present disclosure are used for describing particular embodiments, and may not intend to limit the scope of other embodiments. A singular expression may include a plural expression, unless they are definitely different in a context. All terms used herein, including technical and scientific terms, may have the same meaning as those commonly understood by a person skilled in the art of the present disclosure. Terms defined in a generally used dictionary among the terms used in the present disclosure may be interpreted to have the meanings equal or similar to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

Various embodiments of the present disclosure to be described below explain a hardware approach by way of example. However, since the various embodiments of the present disclosure include a technology using both hardware and software, various embodiments of the present disclosure do not exclude a software-based approach. Hereinafter, embodiments of the present disclosure will be described in detail with reference to the accompanying drawings.

In describing the embodiments, technical contents well known in the technical field of the present disclosure and not directly related to the present disclosure shall be omitted in the explanation. This is to more clearly provide the subject matter of the present disclosure by omitting unnecessary descriptions without obscuring the subject matter of the present disclosure.

For the same reason, some components in the accompanying drawings are exaggerated, omitted, or schematically illustrated. Also, a size of each component does not entirely reflect an actual size. The same reference number is given to the same or corresponding element in each drawing.

Advantages and features of the present disclosure, and methods for achieving them will be clarified with reference to embodiments described below in detail together with the accompanying drawings. However, the present disclosure is not limited to the embodiments disclosed below, but may be implemented in various different forms, the embodiments are provided to only complete the present disclosure of the present disclosure and to allow those skilled in the art to which the present disclosure pertains to fully understand a category of the disclosure, and the present disclosure is solely defined within the scope of the claims. The same reference numeral refers to the same element throughout the specification.

At this time, it will be understood that each block of the process flowchart illustrations and combinations of the flowchart illustrations may be executed by computer program instructions. Since these computer program instructions may be mounted on the processor of a general purpose computer, a special purpose computer or other programmable data processing apparatus, the instructions executed by the processor of the computer or other programmable data processing equipment may generate means for executing functions described in the flowchart block(s). Since these computer program instructions may also be stored in a computer-usable or computer-readable memory which may direct a computer or other programmable data processing equipment to function in a particular manner, the instructions stored in the computer-usable or computer-readable memory may produce a manufacture article including instruction means which implement the function described in the flowchart block(s). Since the computer program instructions may also be loaded on a computer or other programmable data processing equipment, a series of operations may be performed on the computer or other programmable data processing equipment to produce a computer-executed process, and thus the instructions performing the computer or other programmable data processing equipment may provide operations for executing the functions described in the flowchart block(s).

In addition, each block may represent a portion of a module, a segment or code which includes one or more executable instructions for implementing a specified logical function(s). Also, it should be noted that the functions mentioned in the blocks may occur out of order in some alternative implementations. For example, two blocks shown in succession may in fact be executed substantially concurrently or the blocks may sometimes be executed in the reverse order depending on corresponding functionality.

At this time, the term '~unit' as used in the present embodiment means software or a hardware component such as a field programmable gate array (FPGA) or an application-specific integrated circuit (ASIC), and '~unit' performs specific roles. However, '~unit' is not limited to software or hardware. '~unit' may be configured to reside on an addressable storage medium and configured to reproduce on one or more processors. Accordingly, '~unit' may include, for example, components such as software components, object-oriented software components, class components and task components, processes, functions, attributes, procedures, sub-routines, segments of program code, drivers, firmware, microcode, circuitry, data, databases, data structures, tables, arrays, and variables. The functionalities provided in the components and '~unit' may be combined to fewer components and '~units' or may be further separated into additional components and '~units'. Furthermore, the components and '~units' may be implemented to reproduce one or more central processing units (CPUs) within a device or a security multimedia card.

Hereafter, one or more embodiments will be described in detail with reference to the accompanying drawings. In so doing, it should be noted that the same components are indicated by the same reference numerals in the accompanying drawings. In addition, it should be noted that the drawings of the present disclosure attached below are provided to help understanding of the present disclosure, and the present disclosure is not limited to forms or arrangements illustrated in the drawings of the present disclosure. In addition, detailed descriptions of well-known functions and configurations which may obscure the subject matter of the present disclosure will be omitted. It should be noted in the following description that only parts necessary for understanding operations according to one or more embodiments of the present disclosure will be described, and descriptions on other parts will be omitted not to obscure the subject matter of the present disclosure.

Hereinafter, the present disclosure relates to an apparatus and a method for encoding and decoding a polar code in a communication system. Specifically, the present disclosure describes a technique for improving error correction performance through a reverse-mapping technique, in signal processing using the polar code in the communication system.

Terms indicating parameters, terms (e.g., a parity check bit) indicating redundancy bits, terms indicating information bits, terms indicating channels, terms indicating control information, terms indicating network entities, and terms indicating components of a device used in the following explanation are illustrated for convenience of the description. Accordingly, the present disclosure is not limited to the terms to be described, and other terms having equivalent technical meanings may be used.

In addition, the present disclosure describes one or more embodiments using terms used in some communication standard (e.g., 3rd Generation Partnership Project (3GPP)), which are merely exemplary for explanations. One or more embodiments of the present disclosure may be easily modified and applied in other communication system.

FIG. 1 illustrates a wireless communication system according to one or more embodiments of the present disclosure. A wireless communication environment 100 of FIG. 1 illustrates a base station 110 and a terminal 120, as some of nodes which use a radio channel.

The base station 110 is a network infrastructure which provides wireless connection to the terminal 120. The base station 110 has coverage defined as a specific geographic area based on a signal transmission distance. The base station 110 may be referred to as, besides the base station, a massive multiple-input multiple-output (MIMO) unit (MMU), an 'access point (AP)', an 'eNodeB (eNB)', a '5th generation (5G) node', a '5G NodeB (NB)', a 'wireless point', a 'transmission/reception point (TRP)', an 'access unit', a 'distributed unit (DU)', a 'TRP', a 'radio unit (RU), a remote radio head (RRH) or other term having technically equivalent meaning. The base station 110 may transmit a downlink signal or receive an uplink signal.

The terminal 120 is a device is used by a user, and communicates with the base station 110 over the radio channel. In some cases, the terminal 120 may be operated without user's involvement. That is, the terminal 120 may be a device which performs machine type communication (MTC), and may not be carried by the user. The terminal 120 may be referred to as, beside the terminal, a 'user equipment (UE)', a 'mobile station', a 'subscriber station', a 'customer premises equipment (CPE)', a 'remote terminal', a 'wireless terminal', an 'electronic device', a 'vehicle terminal' a 'user device' or other term having technically identical meaning.

Although not depicted in FIG. 1, the terminal 120 may also perform direct communication with other terminal, in addition to the communication between the base station 110 and the terminal 120. For example, vehicle communication of the terminal 120 shown in FIG. 1 and another terminal may be supported. In the vehicle communication, long term evolution (LTE) system has completed standardization of vehicle-to-everything (V2X) technology based on a device-to-device (D2D) communication structure in 3GPP Release 14 and Release 15, and exerts efforts to develop the V2X technology based on 5G new radio (NR).

A transmitting stage and a receiving stage may be variously defined according to a link formed between the communication nodes. In the present disclosure, the transmitting stage and a 'transmitting device' are used interchangeably. Also, the receiving stage and a 'receiving device' are used interchangeably.

According to an embodiment, the transmitting stage may be the base station 110 and the receiving stage may be the terminal 120. Also, according to another embodiment, the receiving stage may be the base station 110 and the transmitting stage may be the terminal 120. In addition, according to another embodiment, both the transmitting stage and the receiving stage may be terminals. Hereinafter, the present disclosure describes an entity transmitting a signal as the transmitting stage and an entity receiving a signal as the receiving stage, which are merely functional expressions to describe the signal processing process, and is not construed as limiting a specific embodiment.

In the communication, an error correction function may be used for stable communication between the transmitting stage and the receiving stage. In this case, error correction coding used for the communication between a transmitter and a receiver is also called channel coding. The error correction coding includes various schemes. For example, there are convolutional coding, turbo coding, low-density parity-check (LDPC) coding, and polar coding. One or more embodiments of the present disclosure provide a solution for increasing transmission and reception performance, by using a polar code which is an excellent code having performance almost close to theoretical channel capacity.

The polar code is an error correcting code proposed by E. Arikan in 2008 and is a first error correcting code proven to achieve low coding/complexity performance and channel capacity which is a data transmission limit of any binary discrete memoryless channels (B-DMCs). The polar code is advantageous in error-correction performance and decoding complexity if transmitting a short-length code compared to other channel capacity-approaching codes such as turbo code and LDPC code. Due to this advantage, 3GPP NR, which is a 5G mobile communication standard, uses the polar code to transmit control information of a short length.

Figure 2A:
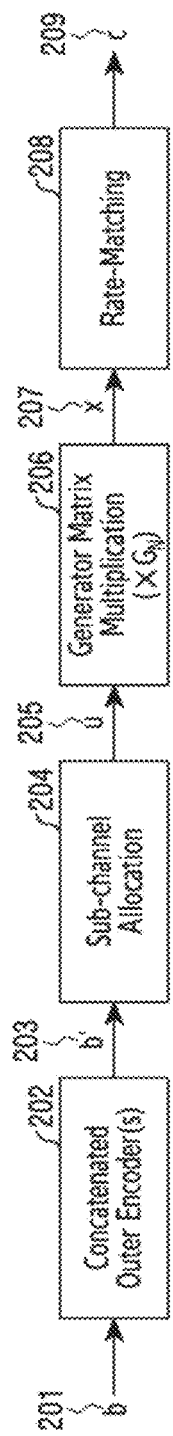
FIG. 2A illustrates an encoding example using a polar code of a transmitting stage (a transmitting device) in a communication system according to one or more embodiments of the present disclosure.

FIG. 2A illustrates an example of encoding using a polar code of a transmitting stage in a communication system according to one or more embodiments of the present disclosure. To explain one or more embodiments of the present disclosure, basic operations of polar code's encoding and decoding are described. According to embodiments, other operation may be added or the included operation may be omitted among the illustrated operations according to system requirements. It is assumed that the number of information bits to be transmitted by the transmitting stage is A, and the number of codeword bits encoded and transmitted over a channel is E. Hereafter, operations of the encoding performed by the transmitting stage are described with reference to FIG. 2A.

(1) Information Bit Sequence Generation

An information bit sequence $b=\{b_0, b_1, \ldots, b_{A-1}\}$ 201 of the length A to transmit is given, as illustrated in FIG. 2A. The transmitting stage may generate the information bit sequence b 201. This information bit sequence may be a part of the whole information to transmit, that is, a segment.

(2) Outer Code

The information bit sequence b 201 is first encoded with a concatenated outer coder 202 to improve performance. The transmitting stage may perform outer code concatenation. Such outer code is usually used to improve performance of a decoder which performs decoding in consideration of a plurality of codeword candidates such as SC-list (SCL) decoding of the polar code. The SCL decoding shall be described in detail in receiving stage operations of FIG. 2B. To this end, the outer code concatenated and used with the polar code includes an error detecting code such as a cyclic redundancy check (CRC) code or an error correcting code such as a BCH code, a parity check (PC) code, and a convolutional code. Only one outer code may be used, or two or more outer codes may be used in combination. For example, a polar code used for uplink control information among the polar codes defined in the 3GPP NR uses only a 11-bit CRC code if the information bit length is 20 bits or more according to the information bit length. If the information bit length is 19 bits or less, a 3-bit PC code and a 6-bit CRC code are used together. This outer coding is generally systematic coding, and adds a parity bit to the inputted bit sequence. It is provided that the length of the whole parity bits generated by one or more outer codes is B, and the length of the codeword generated by the outer coding is K=A+B. The bit sequence generated by the outer encoding is $b'=\{b_0', b_1', \ldots, b_{K-1}'\}$ 203. B=0 and b'=b if not considering the outer coding because the outer coding is not an essential operation for the polar coding.

(3) Sub-Channel Allocation

The bit sequence b' 203 is mapped to a bit sequence $u=\{u_0, u_1, \ldots, u_{N-1}\}$ 205 of the length N for the polar code encoding. Herein, N is a mother polar code size, is a power of 2, and is determined by a predetermined criterion among values greater than K. The bit sequence u 205 is referred to as a polar code encoder input bit sequence, and the bits of b' are mapped to u according to a predefined method and criterion. Each bit of the encoding input bit sequence u may be interpreted as if it passes through a split channel, a sub-channel which is a virtual channel of a different quality by the channel polarization by the operations of the transmitting stage and the receiving stage. In this case, each sub channel is also referred to as a 'synthetic channel.' Hence, to map the bits of b' to the bits of u passing through the sub-channel of good quality, the transmitting stage uses a symmetric capacity of each sub-channel, a Bhatacharayya parameter, a density evolution result, and so on. In addition, this process considers a rate-matching operation conducted later. Based on this characteristic, mapping b' to u is referred to as 'sub-channel allocation' 204. The transmitting stage may perform the sub-channel allocation 204. Herein, the bit of u corresponding to the sub-channel to which b' is mapped is often referred to as an 'unfrozen bit,' and the bit of u corresponding to other sub-channel is referred to a 'frozen bit.' As the name suggests, the frozen bit has a fixed value, and its value is usually 0.

(4) Generator Matrix Multiplication

The transmitting stage may generate an output bit sequence $x=\{x_0, x_1, \ldots, x_{N-1}\}$ 207, by multiplying the bit sequence u 205, which is the unfrozen bit, by a generator matrix. The transmitting stage generates the encoding output bit sequence $x=\{x_0, x_1, \ldots, x_{N-1}\}$ 207 of the same length N by multiplying 206 the encoding bit sequence u 205 of the length N by the polar code generator matrix G. If the polar code was first proposed by Arikan, the generating matrix G was defined by [Equation 1a].

$$G = B_N F^{\otimes \log_2 N} \quad \text{[Equation 1a]}$$

In the above equation, $$F = \begin{bmatrix} 1 & 0 \\ 1 & 1 \end{bmatrix},$$

and the superscript operation⊗n denotes an n-time Kronecker power. For example, $$F^{\otimes 2} = \begin{bmatrix} F & 0 \\ F & F \end{bmatrix}, \text{ and } F^{\otimes 3} = \begin{bmatrix} F^{\otimes 3} & 0 \\ F^{\otimes 2} & F^{\otimes 2} \end{bmatrix}.$$

$B_N$ is an N×N bit-reversal permutation matrix. For example, $\{a_0, a_4, a_2, a_6, a_1, a_5, a_3, a_7\}$ with the index bit-reversal permutated is acquired by multiplying a 8-length vector $\{a_0, a_1, a_2, a_3, a_4, a_5, a_6, a_7\}$ and a 8×8 bit-reversal permutation matrix $B_8$. However, recent various documents and systems including the 3GPP NR consider a simple [Equation 1b] generation matrix excluding $B_N$.

$$G = F^{\otimes \log_2 N} \quad \text{[Equation 1b]}$$

Hereafter, the present disclosure assumes, unless otherwise mentioned, the generation matrix defined as $G = F^{\otimes \log_2 N}$. It should be noted that the description based on this assumption may be easily changed and explained with the polar code using a generation matrix defined as $G=B_N F^{\otimes \log_2 N}$ based on the bit-reversal permutation.

(5) Rate-Matching

Generating the bit sequence of the length E to transmit from the generated encoding output bit sequence $x=\{x_0, x_1, \ldots, x_{N-1}\}$ is referred to as rate-matching 208. A transmit bit sequence acquired through this rate-matching is expressed as $c=\{c_0, c_1, \ldots, c_{E-1}\}$ 209. The encoding output bit sequence x may be rematched to improve the polar code performance according to the rate-matching. As an example, in the 3GPP NR polar coding system, the encoding output bit sequence x is interleaved based on 32 sub-blocks, stored in a circular buffer, and sequentially extracted to, thus, generate the codeword sequence of the length E. If the length E of the codeword is smaller than the size N of the polar code mother code, either puncturing or shortening is conducted. If some bits of the encoding output bit sequence x are punctured, some of the sub-channel experienced by the encoding input bit sequence x become incapable, and the sub-channel allocation is performed in consideration of such an incapable bit. To shorten some bits of the encoding output bit sequence x, some bits of the encoding input bit sequence u also need to shorten, and the sub-channel allocation: is conducted in consideration of this shortening bit. By contrast, if the length E of the codeword is greater than the polar code parent code size N, repetition is performed.

Figure 2B:
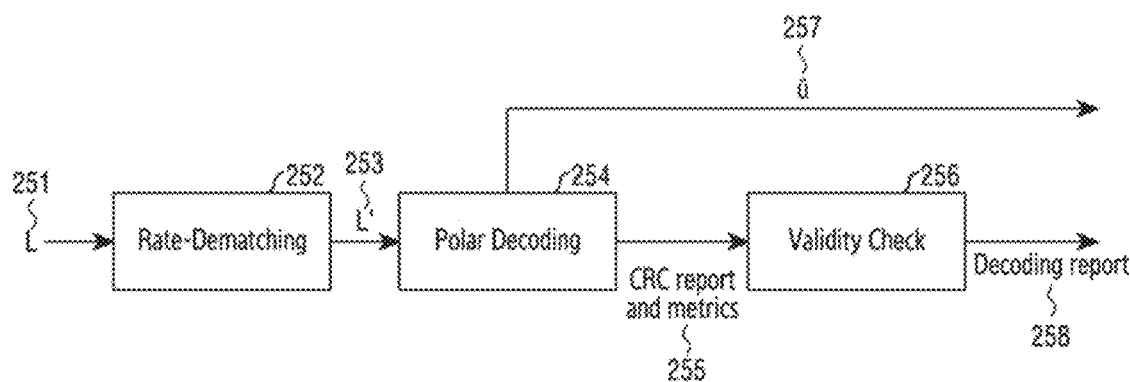
FIG. 2B illustrates a decoding example using a polar code of a receiving stage (receiving device) in a communication system according to one or more embodiments of the present disclosure.

FIG. 2B illustrates an example of decoding using the polar code in the receiving stage in the communication system according to one or more embodiments of the present disclosure. FIG. 2B shows the example that the receiving stage decodes a signal transmitted through the process of FIG. 2A. According to embodiments, other operation may be added or the operation included may be omitted among the illustrated operations according to system requirements.

(1) Demodulated LLR Generation

The receiving stage demodulates the received signal, and thus, obtains probability information corresponding to the transmitted bits c 209. The probability information is given as a value such as a probability vector, a likelihood ratio (LR), and a log-likelihood ratio (LLR). To simplify explanation, the LLR is considered below unless otherwise mentioned. However, it should be noted that this is only the example for describing the operations of the embodiments of the present disclosure, and all operations of the present disclosure are not limited to the LLR-based receiving stage. Hereafter, an LLR sequence corresponding to the transmit bit sequence c 209 is referred to as $L=\{l_0, l_1, \ldots, l_{E-1}\}$ 201.

(2) Rate-Dematching

The receiving stage may input the length-E LLR sequence L into a polar code decoder of the length N. The receiving stage may perform rate-dematching 252 of the rate-matching 208 of the transmitting stage. If puncturing occurs at the rate-matching stage of the transmitting stage, the LLR value for the corresponding bit is determined to 0. If shortening occurs, the LLR value for the corresponding bit is determined to a maximum value of the LLR value corresponding to the bit value 0. If repetition occurs for a specific bit, the LLR value for the corresponding bit is determined by combining all the corresponding LLR values. The length-N LLR sequence determined through this process is expressed as $L'=\{l'_0, l'_1, \ldots, l'_{N-1}\}$ 253.

(3) Outer Code Aided SC-Based Decoding

The receiving stage may decode the polar code. If the length-N LLR sequence L' is calculated or determined, the receiving stage performs SC-based decoding based on this (the length-N LLR sequence L'). The SC-based decoding includes general SC decoding, SCL decoding, and SC-stack (SCS) decoding. The SC-based decoding sequentially decodes each bit of the encoding input sequence bit by bit according to an index order. Hereafter, an operation related to the decoding (e.g., SCL decoding) at the receiving stage may be described as an operation of a decoder (e.g., an SCL decoder). Such decoders decode each bit in order of the index value of the encoding input bit sequence, that is, in order of $u_0, u_1, \ldots, u_{N-1}$. Specifically, decoding an i-th bit $u_i$ is carried out by the following procedures.

(1) Calculating a probability-based metric for 0 and 1 of the value $u_i$ such as LLR based on the received signal and estimates $\hat{u}_0, \hat{u}_1, \ldots, \hat{u}_{i-1}$ of the previously decoded bits.

(2) Estimating a bit value $\hat{u}_i$ based on the calculated probability-based metric.

(3) Reflecting the estimate $\hat{u}_i$ to the decoder based on successive cancellation for next bit decoding.

As above, decoding each bit is performed based on a bit value previously decoded and estimated. For example, decoding the bit $u_i$ uses the estimates $(\hat{u}_0, \ldots, \hat{u}_{i-1})$ of the previously decoded bits $(u_0, \ldots, u_{i-1})$ and their probability information or an accumulative value of values corresponding to the probability information. Herein, each partial bit sequence $(\hat{u}_0, \ldots, \hat{u}_{i-1})$ is referred to as a 'list' or a 'path.' The probability information accumulated while decoding each path or the value corresponding to the probability information is referred to as a 'path-metric (PM).' The SCL decoding is a scheme that performs decoding while maintaining L-ary lists $(\hat{u}_0, \ldots, \hat{u}_{i-1})$ where L is a list size determined in decoding the bit $u_i$. For example, the SCL decoder calculates the probability information of the value $u_i$ 0 and 1 based on the lists $(\hat{u}_0, \ldots, \hat{u}_{i-1})$ maintained up to now in the decoding. The decoder calculates the PM of 2L-ary lists $(\hat{u}_0, \ldots, \hat{u}_{i-1}, \{0 \text{ or } 1\})$ by updating the probability information of the bit value $u_i$ 0 and 1 or the value corresponding to the probability information to the PM of each list $(\hat{u}_0, \ldots, \hat{u}_{i-1})$ considered in calculating the probability information of each $u_i$. This value may be calculated in various manners, and a method proposed in "A. Balatsoukas-Stimming, M. B. Parizi, and A. Burg, "LLR-based successive cancellation list decoding for polar codes," (*IEEE Trans. Sig. Processing, no. 63, vol. 19, pp. 5165-5179* October 2015) is typically used. According to this scheme, the lower PM value, the higher probability of the bit sequence corresponding to the corresponding list. A set of PMs for L-ary lists is expressed as $\{PM_k\}_{k=1, \ldots, L}$. If $u_i$ is a frozen bit, the estimate $\hat{u}_i$ is determined to a determined bit value mutually agreed by the transmitter/receiver irrespective of the calculated PM. If $u_i$ corresponds to an information bit among unfrozen bits, L-ary lists $(\hat{u}_0, \ldots, \hat{u}_{i-1}, \hat{u}_i)$ determined to have a high probability based on the PM value is selected among 2L-ary lists. The SCL decoder proceeds the decoding while maintaining L-ary lists in each bit decoding in this manner. If completing every bit decoding, the SCL decoder selects a codeword having the highest probability from the L-ary lists obtained finally based on the PM. As described above, the list having the lowest PM value is estimated as a final encoding input bit sequence $\hat{u}=(\hat{u}_0, \ldots, \hat{u}_{N-1})$. If L is set to 1, the SCL decoder operates identically to a basic SC decoder. The receiving stage may improve error correction performance by utilizing the concatenated outer coding in the middle of or after the SCL decoding. For example, If the CRC code is used in concatenation, the receiving stage estimates the codeword satisfying a CRC code constraint condition and having the highest probability as a final decoding result among the L-ary lists obtained after the decoding. After the series of the decoding operations mentioned above, a CRC check result, a metric value including the PM or the like of each list, and the estimated encoding input bit sequence $\hat{u}=(\hat{u}_0, \ldots, \hat{u}_{N-1})$ 257 are obtained.

(4) Decoding Validity Check

As illustrated in FIG. 2B, the receiving stage determines the validity check 256 based on various decoding results 255 obtained by the polar decoding 254. This process may be referred to as decoding validity check, post error detection, erasure decision, and so on. If the CRC code is concatenated and the SCL decoding utilizes the CRC check to select the final list, this result is basically utilized in the decoding validity check. If there is no list which has passed the CRC check, the receiving stage immediately reports decoding failure and terminates the series of the decoding processes. If there is a list passing the CRC check, the receiving stage may immediately output $\hat{u}=(\hat{u}_0, \ldots, \hat{u}_{N-1})$ as the decoding result, and instead of reporting decoding success, perform metric-based additional validity check to improve decoding validity check performance. If determining the decoding failure in the decoding validity check process, the receiving stage reports the decoding failure and terminates the decoding procedure. If determining decoding success in the decoding validity check process, the receiving stage reports the decoding success and proceeds a follow-up procedure such as outputting $\hat{u}=(\hat{u}_0, \ldots, \hat{u}_{N-1})$. The follow-up procedure includes extracting a message bit sequence $\{\hat{b}= (\hat{b}_0, \ldots, \hat{b}_{A-1})\}$ mapped to $\hat{u}$, and obtaining an estimated codeword bit sequence $\hat{c}=(\hat{c}_0, \ldots, \hat{c}_{E-1})$ by re-encoding $\hat{u}$ for a successive interference cancellation (SIC) operation of a Multi-Input Multi-Output (MIMO) system.

Figure 3:
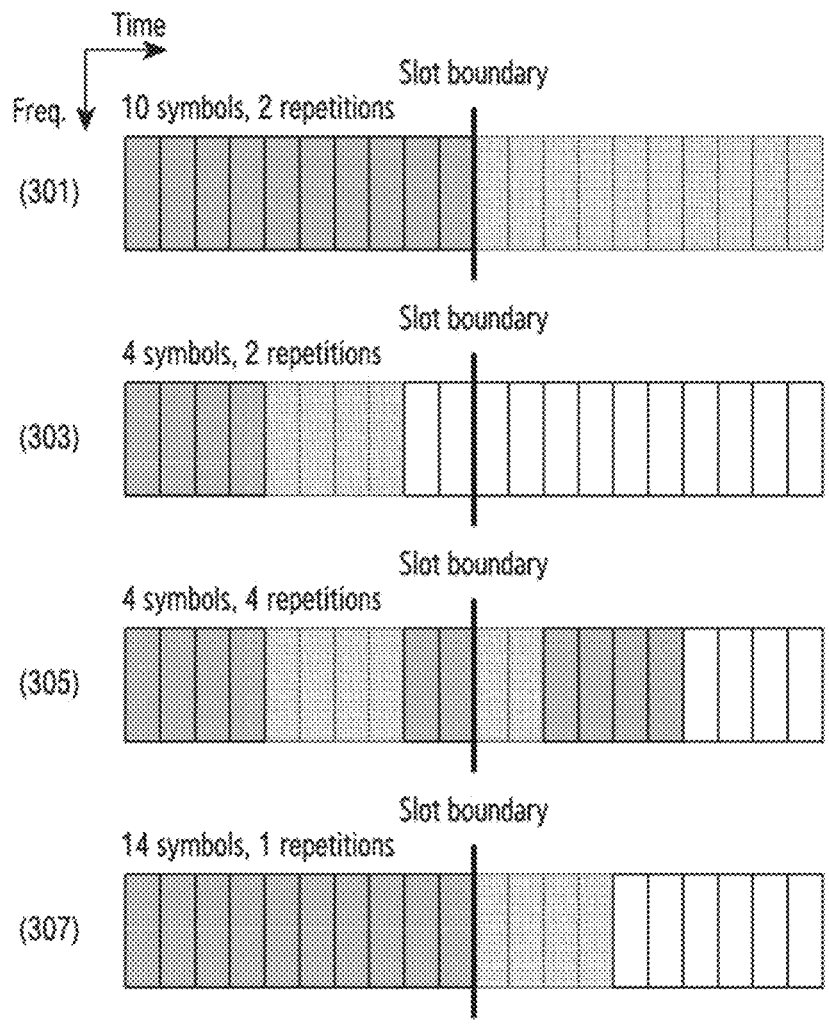
FIG. 3 illustrates an example of repeated transmission of uplink data in a communication system according to one or more embodiments of the present disclosure.

FIG. 3 illustrates an example of repeated transmission of uplink data in a communication system according to one or more embodiments of the present disclosure. FIG. 3 describes that specific data is repeatedly transmitted in a physical uplink share channel (PUSCH). The specific data may be repeatedly transmitted on a slot basis or may be repeatedly transmitted on a non-slot basis. In the NR communication system, a slot may include fourteen (14) orthogonal frequency division multiplexing (OFDM) symbols. Various combinations of a repetition start point S, a repeat count B, and the number of repetition symbols of PUSCH repetition L will be described based on the slot.

Referring to FIG. 3, a horizontal axis indicates time and a vertical axis indicates a frequency. A first transmission 301 corresponds to a slot based repeated transmission. In the first transmission, S=4, B=2, and L=10. Repeated transmission is performed in another slot. A second transmission 303 is a case where S=4, B=2, and L=4 and a repetition period and a repeat count transmitted through radio resource control (RRC) are identically applied. The repeated transmission is conducted in the same slot. A third transmission 305 is a case in which S=4, B=4, and L=4, and one repetition is transmitted through two slots at a slot boundary. In the third repetition, first two symbols are transmitted in the previous slot, and the latter two symbols are transmitted in the next slot. In this case, the number of the symbols is different between the repeated transmissions. A fourth transmission 307 is a case of S=4, B=1, and L=14, and since one repetition is divided into two repetitions at the slot boundary, the repetition is not performed with a parameter defined in the gNB, but the terminal may transmit symbols through two separate repetitions. Even in this case, the number of the symbols between the repeated transmissions is different.

In the repetition, since the number of resource elements (REs) transmitted in a current slot is smaller than the number of REs in a previous slot, the code rate may increase compared to the previous slot. If the number of the REs in the slot is small, an effective code rate may not be satisfied. If uplink control information (UCI) is piggybacked over the PUSCH and transmitted through a slot of a very small period due to the slot boundary, the reception performance of the UCI is degraded. Hence, it is required to increase its gain through UCI repeated transmission.

An uplink-shared channel (UL-SCH) and UCI may be transmitted over the PUSCH. According to an embodiment, the UL-SCH and the UCI may be muxed and transmitted at the same time. Also, according to an embodiment, only the UL-SCH may be transmitted. Also, according to an: embodiment, the UCI alone may be transmitted. If the PUSCH repeated transmission is defined as described in FIG. 3, UL-SCH data transmitted over the PUSCH is repeatedly transmitted. If the repeated transmission of the PUSCH is defined as above, UCI data may also be transmitted repeatedly. In such repeated transmission, a combining gain may be obtained only by using the same mother code in the repeated transmission period. Thus, if transmitting the UL-SCH, a transport block size (TBS) and the code rate are determined based on one of the repetition periods, and the mother code needs to be determined based on the values. Even if transmitting the UCI, the transmitting stage needs to determine a rate matching size based on one of the repetition periods and determine the mother code based on it.

Hereafter, a method of determining the mother code if transmitting the UCI over the PUSCH shall be described in more detail. The size N of the generator matrix multiplication 206 block of the transmission process of FIG. 2A is the mother code size, and is determined based on the number of the output bits E of the rate-matching 208 block and the number of the input bits A of the concatenated outer encoder(s) 202.

Denote by E the rate matching output sequence length as given in Subclause 5.4.1;

$$\text{If } E \leq (9/8) \cdot 2^{(\lceil \log_2 E \rceil - 1)} \text{ and } K/E < 9/16$$
$$n_1 = \lceil \log_2 E \rceil - 1;$$
$$\text{else}$$
$$n_1 = \lceil \log_2 E \rceil;$$
$$\text{end if}$$
$$R_{min} = 1/8$$
$$n_2 = \lceil \log_2(K/R_{min}) \rceil$$
$$n = \max\{\min\{n_1, n_2, n_{max}\}, n_{min}\}$$
$$\text{where } n_{min} = 5.$$

UE is not expected to be configured with $K+n_{PC}>E$, where $n_{PC}$ is the number of parity check bits defined in Subclause 5.3.1.2.

The number of the output bits E of the rate-matching 208 block is determined based on the number of the allocated REs. Considering the repeated transmission shown in FIG. 3, the number of the allocated REs differs in each repeated transmission. Hence, it is required to design the same mother code size for each repetition in the UCI/PUSCH repeated transmission.

(5) Symbol Rate-Matching Technique

Figure 4:
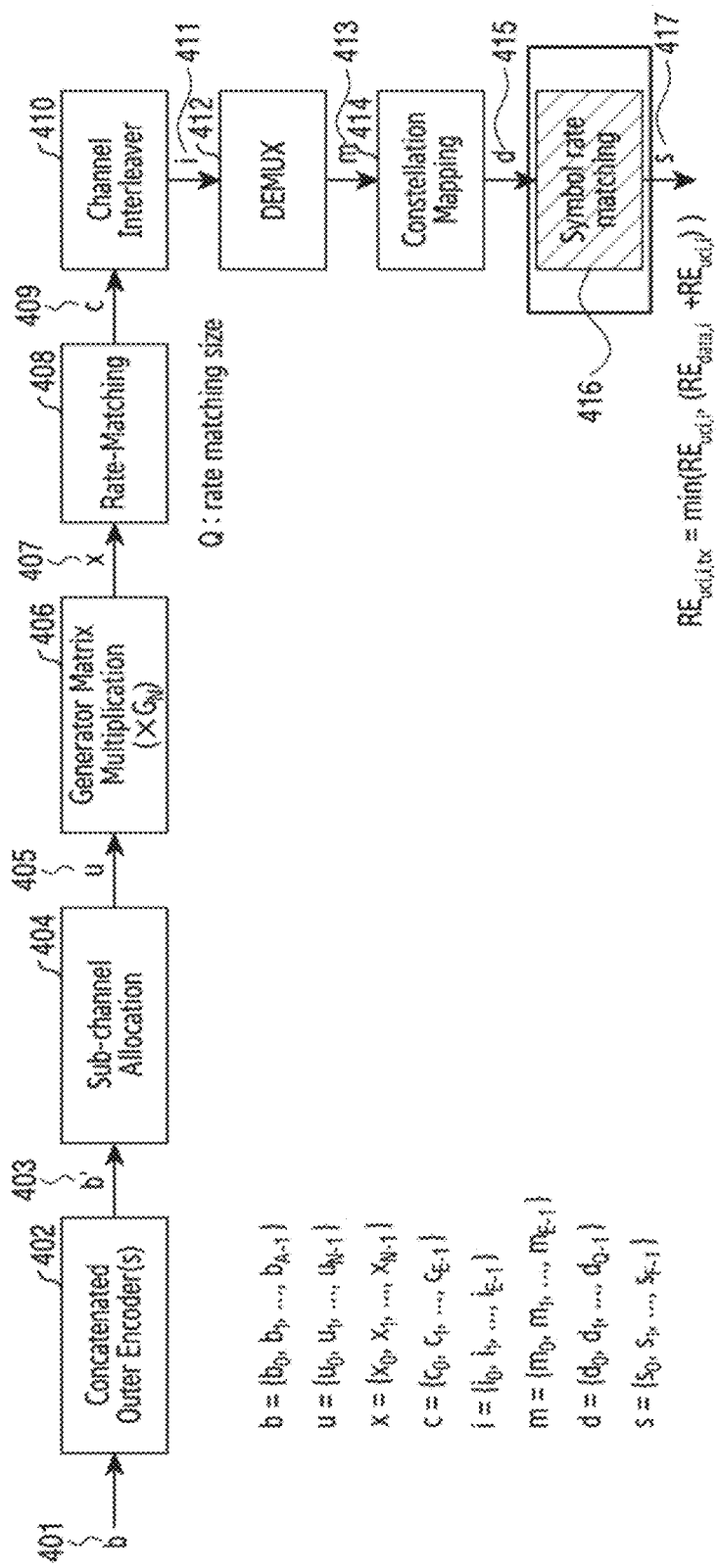
FIG. 4 illustrates an example of a symbol rate-matching technique in a communication system according to one or more embodiments of the present disclosure.
Figure 5:
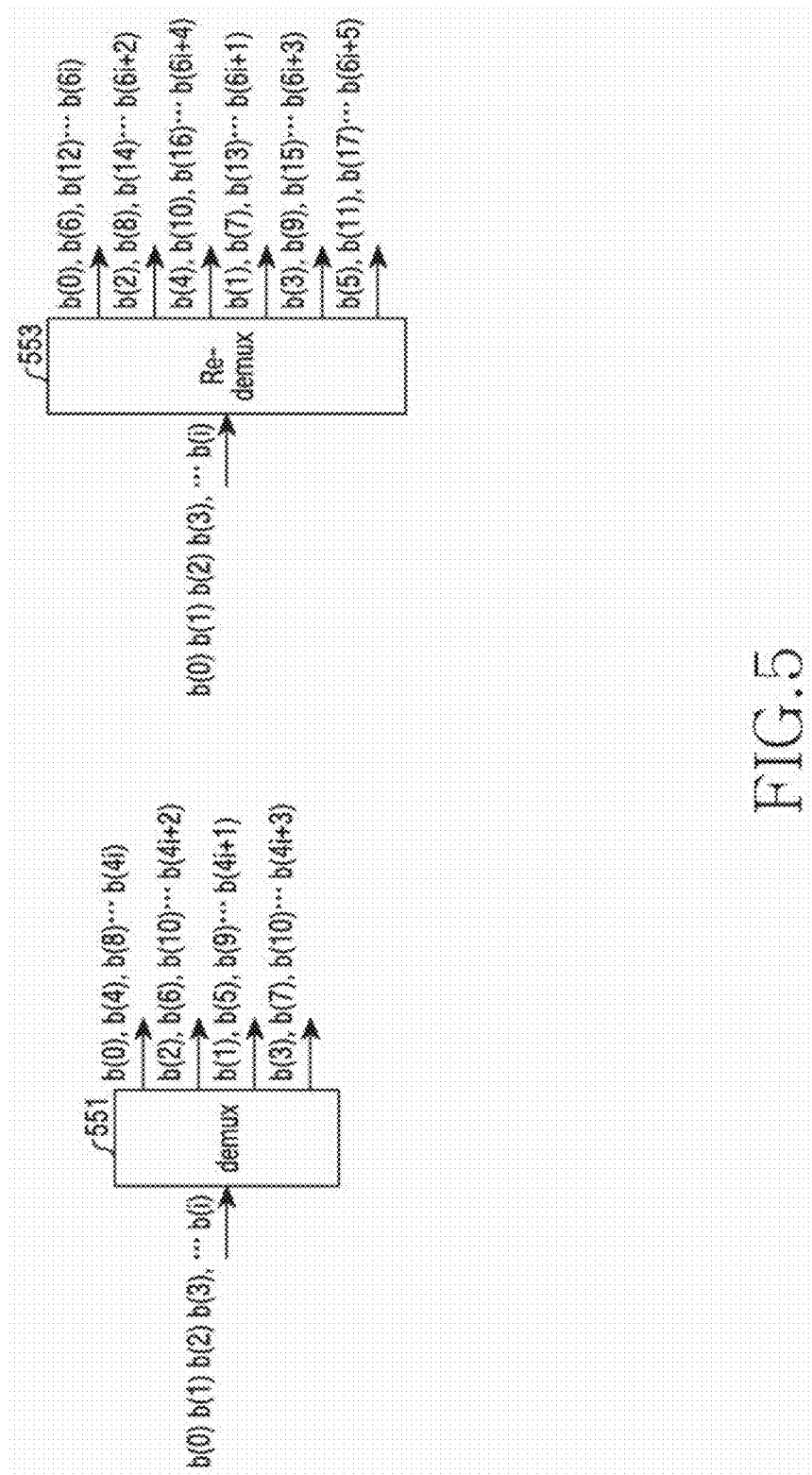
FIG. 5 illustrates an example of a demultiplexer (DEMUX) in a communication system according to one or more embodiments of the present disclosure.

FIG. 4 illustrates an example of a symbol rate-matching technique in a communication system according to one or more embodiments of the present disclosure. FIG. 4 describes a method for determining a rate matching size for each repeated transmission to have the same mother code size and a solution for defining the number of symbols transmitted in each repeated transmission. FIG. 4 expresses a transmission method for having the same mother code size for the repeated transmission.

Figure 6:
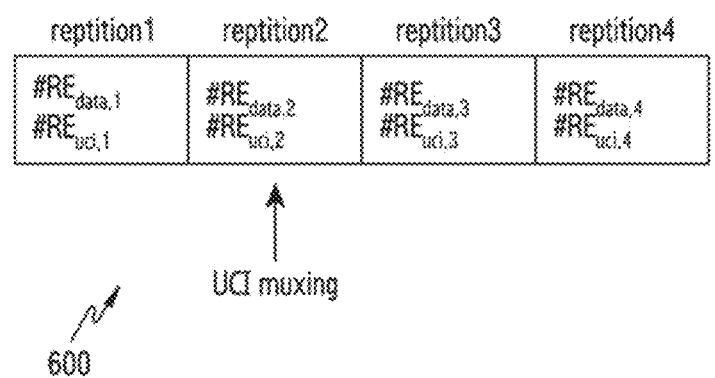
FIG. 6 illustrates an example of determining a size of a symbol sequence in a communication system according to one or more embodiments of the present disclosure.

Referring to FIG. 4, operations of a concatenated outer encoder 402, sub-channel allocation 404, generator matrix multiplication 406, and rate-matching 408 correspond to the operations of the concatenated outer encoder 202, the sub-channel allocation 204, the generator matrix multiplication 206, and the rate matching 208 of FIG. 2A, and descriptions thereof shall be omitted. Hereafter, blocks added in FIG. 6 compared to FIG. 2A will be described in detail.

(6) Channel Interleaver

The rate-matching output bit stream $c=\{c_0, c_1, \ldots, c_{E-1}\}$ of FIG. 4 is provided to a channel interleaver 410. The channel interleaver interleaves a final codeword bit sequence outputted from the rate-matching and then outputs an interleaved bit sequence $i=\{i_0, i_1, \ldots, i_{E-1}\}$ to the concatenated demultiplexer (DEMUX) 412. Herein, the interleaving is performed based on a set interleaving scheme. According to another embodiment, the interleaving may not be performed if needed.

The interleaver prevents the polar code output bit stream from being mapped to modulation symbols in a specific pattern or on a regular basis. If a signal is transmitted based on a higher-order modulation scheme, several bits constituting one symbol each may have different reliability. For example, if using a 16 quadrature amplitude modulation (QAM) modulation scheme, the transmitting stage may receive 4 bits ($s_0$, $s_1$, $s_2$, $s_3$) and generate a signal $$d = d_r + jd_i = \frac{1}{\sqrt{10}}\{(1 - 2s_0)[2 - (1 - 2s_2)] + j(1 - 2s_1)[2 - (1 - 2s_3)]\}.$$

With respect to the four bits ($s_0$, $s_1$, $s_2$, $s_3$) constituting the 16 QAM, the first two bits $s_0$ and $s_1$ may denote a sign of a real value and an imaginary value respectively and the last two bits $s_2$ and $s_3$ may denote a size of the real value and the imaginary value respectively according to the mapping order. Accordingly, the reliability of $s_0$ and $s_1$ is higher than the reliability of $s_2$ and $s_3$. If bits having similar reliability are continuously connected on a decoding graph of the polar decoder, decoding performance may be degraded. More specifically, if polar coded bits mapped to first bits of the four bits constituting the modulation symbol are constant at an exponential interval of 2, it is highly likely that bits having the same or similar reliability are connected on the graph of the polar decoder. Thus, the decoding performance of the polar code may be improved by connecting bits having various reliability without connecting bits having similar reliability based on the channel interleaver.

The channel interleaving technique defined in the 3GPP NR is as follows.

The bit sequence $e_0, e_1, e_2, \ldots, \rho_{k-1}$ is interleaved into bit sequence $f_0, f_1, f_2, \ldots f_{k-1}$, as follows:

```
If I_sga = 1
    Denote T as the smallest integer such that
    T(T + 1)/2 ≥ E;
    k = 0;
    for i - 0 to T - 1
        for J = 0 to T - 1 - i
            if k < E
                v_i,j - e_i;
            else
                v_i,j=<NULL>;
            end if
            k = k + 1;
        end for
    end for
    k = 0;
    for J = 0 to T - 1
        for i = 0 to T - 1 - j
            if v_i,j ≠<NULL>
                f_k = v_i;
                h = k + 1
            end if
        end for
    end for
else
    for i - 0 to E - 1
        f_i = e_i;
    end for
end if.
```

(7) DEMUX

The DEMUX 412 receives the output bit sequence $i=\{i_0, i_1, \ldots, i_{E-1}\}$ of the channel interleaver, demuxes it according to the order of mapping to the modulation symbol and thus outputs a bit sequence $m=\{m_0, m_1, \ldots, m_{E-1}\}$. For the input bit sequence $i=\{i_0, i_1, \ldots, i_{E-1}\}$, the output bit sequence $m=\{m_0, m_1, \ldots, m_{E-1}\}$ satisfies the following equation.

If using binary phase shift keying (BPSK)/quadrature phase shift keying (QPSK) modulation scheme, the output bit sequence may be defined by Equation 2.

$$m_k=i_k \text{ where } k=0,1,\ldots,E \qquad \text{<Equation 2>}$$

If using the 16 QAM modulation scheme, the output bit sequence may be defined by Equation 3. For example, a DEMUX 551 represents a DEMUX for the 16 QAM modulation scheme having the modulation order of 4.

$$m_{4k}=i_{4k} \text{ where } k=0,1,\ldots,E/4$$

$$m_{4k+1}=i_{4k+2} \text{ where } k=0,1,\ldots,E/4$$

$$m_{4k+2}=i_{4k+1} \text{ where } k=0,1,\ldots,E/4$$

$$m_{4k+3}=i_{4k+3} \text{ where } k=0,1,\ldots,E/4 \qquad \text{<Equation 3>}$$

If using the 64 QAM modulation scheme, the output bit sequence may be defined by Equation 4. For example, a DEMUX 553 represents a DEMUX for the 16 QAM modulation scheme with the modulation order of 6.

$$m_{6k}=i_{6k} \text{ where } k=0,1,\ldots,E/6$$

$$m_{6k+1}=i_{6k+2} \text{ where } k=0,1,\ldots,E/6$$

$$m_{6k+2}=i_{6k+4} \text{ where } k=0,1,\ldots,E/6$$

$$m_{6k+3}=i_{6k+1} \text{ where } k=0,1,\ldots,E/6$$

$$m_{6k+4}=i_{6k+3} \text{ where } k=0,1,\ldots,E/6$$

$$m_{6k+5}=i_{6k+5} \text{ where } k=0,1,\ldots,E/6 \qquad \text{<Equation 4>}$$

If using a 256 QAM modulation scheme, the output bit sequence may be defined by Equation 5.

$$m_{8k}=i_{8k} \text{ where } k=0,1,\ldots,E/8$$

$$m_{8k+1}=i_{8k+2} \text{ where } k=0,1,\ldots,E/8$$

$$m_{8k+2}=i_{8k+4} \text{ where } k=0,1,\ldots,E/8$$

$$m_{8k+3}=i_{8k+6} \text{ where } k=0,1,\ldots,E/8$$

$$m_{8k+4}=i_{8k+1} \text{ where } k=0,1,\ldots,E/8$$

$$m_{8k+5}=i_{8k+3} \text{ where } k=0,1,\ldots,E/8$$

$m_{8k+6}=i_{8k+5}$ where $k=0,1,\ldots,E/8$ $m_{8k+7}=i_{8k+7}$ where $k=0,1,\ldots,E/8$  <Equation 5>

(8) Constellation Mapping

The output bit sequence m={$m_0, m_1, \ldots, m_{E-1}$} of the DEMUX 412 is mapped to modulation symbols which are complex numbers to output a complex symbol sequence d={$d_0, d_1, \ldots, d_{Q-1}$}. The modulation symbols may be defined as in the following equations.

If the BPSK modulation scheme is used, the complex symbol sequence may be defined by Equation 6.

$$d_i = \frac{1}{\sqrt{2}}\left\{(1-2\cdot m_i) + j\frac{1}{\sqrt{2}}\{(1-2\cdot m_i)\right.$$  <Equation 6>

If the QPSK modulation scheme is used, the complex symbol sequence may be defined by Equation 7.

$$d_i = \frac{1}{\sqrt{2}}\left\{(1-2\cdot m_{2i}) + j\frac{1}{\sqrt{2}}\{(1-2\cdot m_{2i+1})\right.$$  <Equation 7>

If the 16 QAM modulation scheme is used, the complex symbol sequence may be defined by Equation 8.

$$d_i = \frac{1}{\sqrt{10}}\{(1-2\cdot m_{4i})[2-(1-2\cdot m_{4i+1})]\} +$$  <Equation 8>

$$j\frac{1}{\sqrt{10}}\{(1-2\cdot m_{4i+2})[2-(1-2\cdot m_{4i+3})]\}$$

As shown in Equation 8, the bit $m_{4i}$ and the bit $m_{4i+2}$ determine the sign of the real and imaginary values respectively. The bit $m_{4i+1}$ and the bit $m_{4i+3}$ determine the sign of the real and imaginary values respectively. Hence, reception reliability of the bit $m_{4i}$ and the bit $m_{4i+2}$ is higher than reception reliability of the bit $m_{4i+1}$ and the bit $m_{4i+3}$. Reception channel distributions of the bit $m_{4i}$ and the bit $m_{4i+2}$ are identical. Reception channel distributions of the bit $m_{4i+1}$ and the bit $m_{4i+3}$ are identical. Reception channel distributions of the bit $m_{4i}$ and the bit $m_{4i+1}$ may differ.

If the 64 QAM modulation scheme is used, the complex symbol sequence may be defined by Equation 9.

$$d_i =$$  <Equation 9>

$$\frac{1}{\sqrt{42}}\{(1-2\cdot m_{6i})[4-(1-2\cdot m_{6i+1})[2-(1-2\cdot m_{6i+2})]]\} +$$

$$j\frac{1}{\sqrt{42}}\{(1-2\cdot m_{6i+3})[4-(1-2\cdot m_{6i+4})[2-(1-2\cdot m_{6i+5})]]\}$$

If the 256 QAM modulation scheme is used, the complex symbol sequence may be defined by Equation 10.

$$d_i = \frac{1}{\sqrt{170}}\{(1-2\cdot m_{8i})$$  <Equation 10>

$$[8-(1-2\cdot m_{8i+1}[4-(1-2\cdot m_{8i+2})[2-(1-2\cdot m_{8i+3})]]]\}$$

$$j\frac{1}{\sqrt{170}}\{(1-2\cdot m_{8i+4})$$

$$[8-(1-2\cdot m_{8i+5}[4-(1-2\cdot m_{8i+6})[2-(1-2\cdot m_{8i+7})]]]\}$$

According to an embodiment, the DEMUX 412 and the constellation mapping 414 may be integrated into one. That is, the input bit sequence i={$i_0, i_1, \ldots, i_{E-1}$} of the DEMUX may be inputted and the output complex symbol sequence d={$d_0, d_1, \ldots, d_{E-1}$} of the constellation mapping may be generated as shown in the following equations.

If the BPSK modulation scheme is used, the output complex symbol sequence of constellation mapping may be defined by Equation 11.

$$d_k = \frac{1}{\sqrt{2}}\left\{(1-2\cdot i_k) + j\frac{1}{\sqrt{2}}\{(1-2\cdot i_k)\right.$$  <Equation 11>

If the QPSK modulation scheme is used, the output complex symbol sequence of constellation mapping may be defined by Equation 12.

$$d_k = \frac{1}{\sqrt{2}}\left\{(1-2\cdot i_{2k}) + j\frac{1}{\sqrt{2}}\{(1-2\cdot i_{2k+1})\right.$$  <Equation 12>

If the 16 QAM modulation scheme is used, the output complex symbol sequence of constellation mapping may be defined by Equation 13.

$$d_k = \frac{1}{\sqrt{10}}\{(1-2\cdot i_{4k})[2-(1-2\cdot i_{4k+2})]\} +$$  <Equation 13>

$$j\frac{1}{\sqrt{10}}\{(1-2\cdot i_{4k+1})[2-(1-2\cdot i_{4k+3})]\}$$

If the 64 QAM modulation scheme is used, the output complex symbol sequence of constellation mapping may be defined by Equation 14.

$$d_k =$$  <Equation 14>

$$\frac{1}{\sqrt{42}}\{(1-2\cdot i_{6k})[4-(1-2\cdot i_{6k+2})[2-(1-2\cdot i_{6k+4})]]\} +$$

$$j\frac{1}{\sqrt{42}}\{(1-2\cdot i_{6k+1})[4-(1-2\cdot i_{6k+3})[2-(1-2\cdot i_{6k+5})]]\}$$

If using the 256 QAM modulation scheme, the output complex symbol sequence of constellation mapping may be defined by Equation 15.

$$d_i = \frac{1}{\sqrt{170}}\{(1-2\cdot i_{8k})$$  <Equation 15>

$$[8-(1-2\cdot i_{8k+2}[4-(1-2\cdot i_{8k+4})[2-(1-2\cdot i_{8k+6})]]]\} +$$

$$j\frac{1}{\sqrt{170}}\{(1-2\cdot i_{8k+1})$$

$$[8-(1-2\cdot i_{8k+3}[4-(1-2\cdot i_{8k+5})[2-(1-2\cdot i_{8k+7})]]]\}$$

(9) Symbol Rate Matching

According to one or more embodiments, the transmitting stage may perform symbol rate matching 416. The transmitting stage may receive the complex symbol sequence d={$d_0, d_1, \ldots, d_{Q-1}$} of the constellation mapping and output a complex symbol sequence s={$s_0, s_1, \ldots, s_{F-1}$} 417. The size E of the input symbol sequence and the output symbol sequence F are predefined values in the system, and may be the same or different values.

If the value E is smaller than F, some of the output symbols of the constellation mapping 414 may be repeatedly transmitted. If the value E is greater than F, some of the output symbols of the constellation mapping 414 may be symbol punctured and not transmitted. As mentioned in the rate-matching block 208 of FIG. 2A, if some bits of the encoded output bit sequence x are punctured, some of the sub-channel experienced by the encoding input bit sequence u becomes incapable and the sub-channel allocation process is conducted in consideration of these incapable bits. However, since the rate matching is based on the modulated symbol generated after the codeword rate matching, the symbol rate matching 417 does not affect the above sub-channel allocation.

FIG. 6 illustrates an example of determining a size of a symbol sequence in a communication system according to one or more embodiments of the present disclosure. If channel coding using a polar code, that is, polar coding is performed, N-ary bits are outputted in total (e.g., $d_0, d_1, d_2, \ldots, d_{N-1}$). Herein, N may be a power of 2. N may be referred to as the parent code size, as described above. E denotes the size of the rate matching applied to bits outputted through the polar coding. If determining E, the number Q of modulation and constellation mapping REs is used. For example, in UCI including a hybrid automatic repeat request (HARQ)-acknowledge (ACK) feedback transmitted on the PUSCH, $E_{UCI}$ may be determined based on the following equation:

<Equation>

$$Q'_{ACK} = \min\left\{ \left\lceil \frac{(0_{ACK} + L_{ACK}) \cdot \beta^{PUSCH}_{offset}}{R \cdot Q_m} \right\rceil, \left\lceil \alpha \cdot \sum_{l=l_0}^{N^{PUSCH}_{symb,all}-1} M^{UCI}_{sc}(l) \right\rceil \right\}$$

$$E_{UCI} = N_L \cdot Q'_{ACK} \cdot Q_m$$

$O_{ACK}$ denotes the number of HARQ-ACK bits. $\beta^{PUSCH}_{offset}$ denotes the number of CRC bits (may be fixed or determined according to a payload size A), $\beta^{PUSCH}_{offset}$ denotes a beta offset value, R denotes a PUSCH code rate, $Q_m$ denotes a modulation order of the PUSCH, α denotes a scaling parameter, and $M_{sc}^{UCI}(l)$ denotes the number of REs in a symbol l. In addition, $N_{smb,all}^{PUSCH}$ denotes the total number of OFDM symbols for PUSCH transmission. $N_L$ denotes the number of transport layers of the PUSCH.

The value E may be determined in various manners with respect to several repetitions. In some embodiments, the value E is determined based on a resource value assigned to a repetition in which the UCI is muxed among repetitions. Assume four (4) repetitions as shown in FIG. 6. For example, the transmitting stage (e.g., the terminal) may determine E based on a muxing slot. If UCI muxing occurs in a second repetition, the transmitting stage may determine E based on a size of the resource (e.g., the number of REs) allocated to the repetition #2. As another example, the transmitting stage may determine E based on the size of the resource (e.g., the number of REs) allocated to the longest slot. As yet another example, the transmitting stage may determine E based on the size (e.g., the number of REs) of resources allocated to the corresponding slot, in each slot.

As still another situation of the repeated transmission, carrier aggregation (CA) may be considered. The PUSCH slot may be repeatedly transmitted in first CC, and the PUCCH may be transmitted at the same time in second CC. In this case, if a subcarrier spacing (SCS) of the PUSCH is greater than a SCS of the PUCCH, UCI information may also be repeatedly transmitted.

In some embodiments, the transmitting stage determines Q and E based on the greatest value of the allocated resource size (e.g., the number of REs) among the repetitions after the repetition in which the UCI is muxed. If this method is used, the transmitting stage may perform the polar coding using the greatest mother code size in all repetitions. In addition, in some other embodiments, the transmitting stage determines Q and E based on the smallest value of the allocated resource size (e.g., the number of REs) among the repetitions after the repetition in which the UCI is muxed. If this method is used, the transmitting stage may perform the polar coding using the smallest mother code size in all repetitions.

With respect to several repetitions, the value F may be determined in various manners.

In some embodiments, the transmitting stage may determine the value F based on the resource size (e.g., the number of REs) value allocated to the repetition in which the UCI is muxed among the repetitions. Considering that the allocated resource in the current repetition is smaller, F(i) of the i-th repetition is determined as follows.

$F(i) = \min(F(\text{mux\_idx}), (\text{NumRE\_UCI}(i)^*\text{Number of Layer})$ NumRE_UCI(i) denotes the resource size (e.g., the number of the REs) allocated to the UCI in the i-th repetition. F(mux_idx) denotes the number of symbols transmitting the UCI determined in the repetition of the muxing UCI.

In some embodiments, the transmitting stage may determine the value F based on a repetition to which the most resources (e.g., the number of REs) are allocated among the repetitions. In consideration of the smaller resource allocated in the current repetition, F(i) of the i-th repetition is determined as follows.

$F(i) = \min(F(\text{long\_idx}), (\text{NumRE\_UCI}(i)^*\text{Number of Layer})$ The NumRE_UCI(i) denotes the resource size (e.g., the number of the REs) allocated in the i-th repetition. F(long_idx) denotes the number of the symbols transmitting the UCI determined in the repetition of the muxing UCI.

In some embodiments, the transmitting stage may determine the value F based on each repetition. F(i) of the i-th repetition is determined as below in consideration of the smaller resource allocated in the current repetition.

$F(i) = (\text{NumRE\_UCI}(i)^*\text{Number of Layer})$

The NumRE_UCI(i) denotes the resource size (e.g., the number of the REs) allocated in the i-th repetition.

In FIG. 4, the blocks have been described in detail to explain their functions, but this is only the description according to the functional configuration and the separated block does not necessarily indicate the separate device configuration. According to an embodiment, at least two blocks shown in FIG. 4 may be integrated into one. For example, each block is the functional configuration, and the concatenated outer encoder 402, the sub-channel allocation 405, the generator matrix multiplication 406, the rate-matching 408, the channel interleaver 411, the DEMUX 412, the constellation mapping 414, and the symbol rate matching 417 may be implement as one processor. Also, for example, the sub-channel allocation 405 and the generator matrix multiplication 406 may be integrated into the polar encoder.

1. Channels and Reliability

Figure 7A:
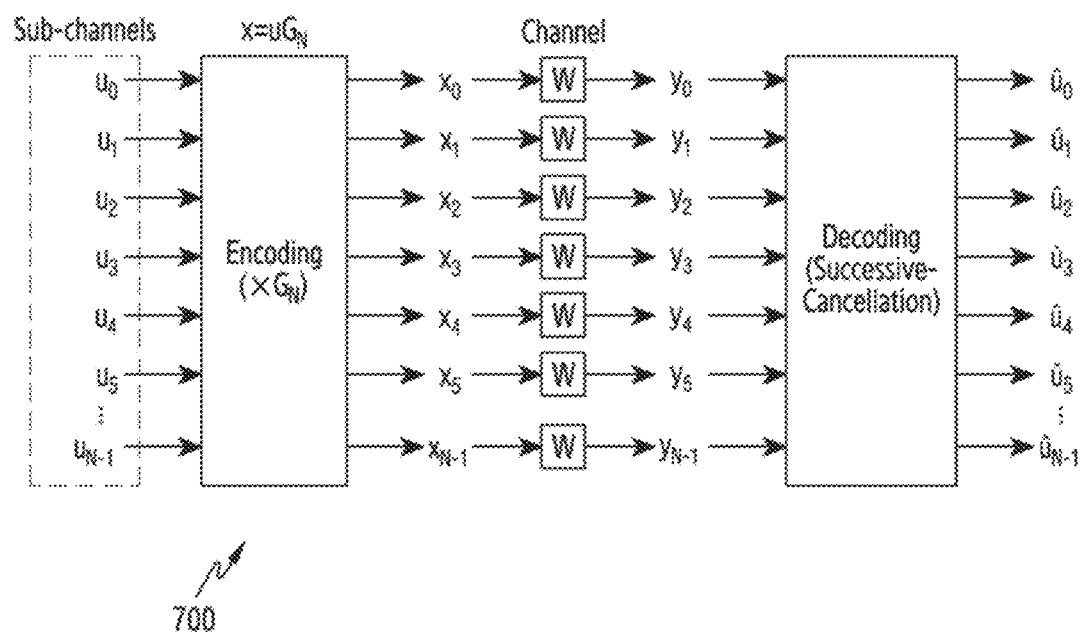
FIG. 7A illustrates a design principle of a polar code in a communication system according to one or more embodiments of the present disclosure.

FIG. 7A illustrates a design principle 700 of a polar code in a communication system according to one or more embodiments of the present disclosure. In FIG. 7A, a signal is transmitted through a polar code encoder, a channel, and a polar code decoder.

Referring to FIG. 7A, the transmitting stage may perform an encoding operation including generation matrix multiplication. The receiving stage may perform a decoding operation through the SC.

N-ary information bits $u_0, u_1, \ldots, u_{N-1}$ corresponding to sub-channels respectively are inputted to the polar encoder. The encoder generates N-ary encoded bits $x_0, x_1, \ldots, x_{N-1}$ using a generation matrix (e.g., G of Equation 1b). The generated bits are transmitted over a channel W. A decoder may receive and decode the bits transmitted over the channel. The decoder estimates N-ary information bits û through the polar decoding. At this time, reliability distribution of $y_i (0 <= i < N-1)$ may differ depending on which bits of bits constituting the modulation symbol the encoded bits $x_0, x_1, \ldots, x_{N-1}$ are mapped to.

Figure 7B:
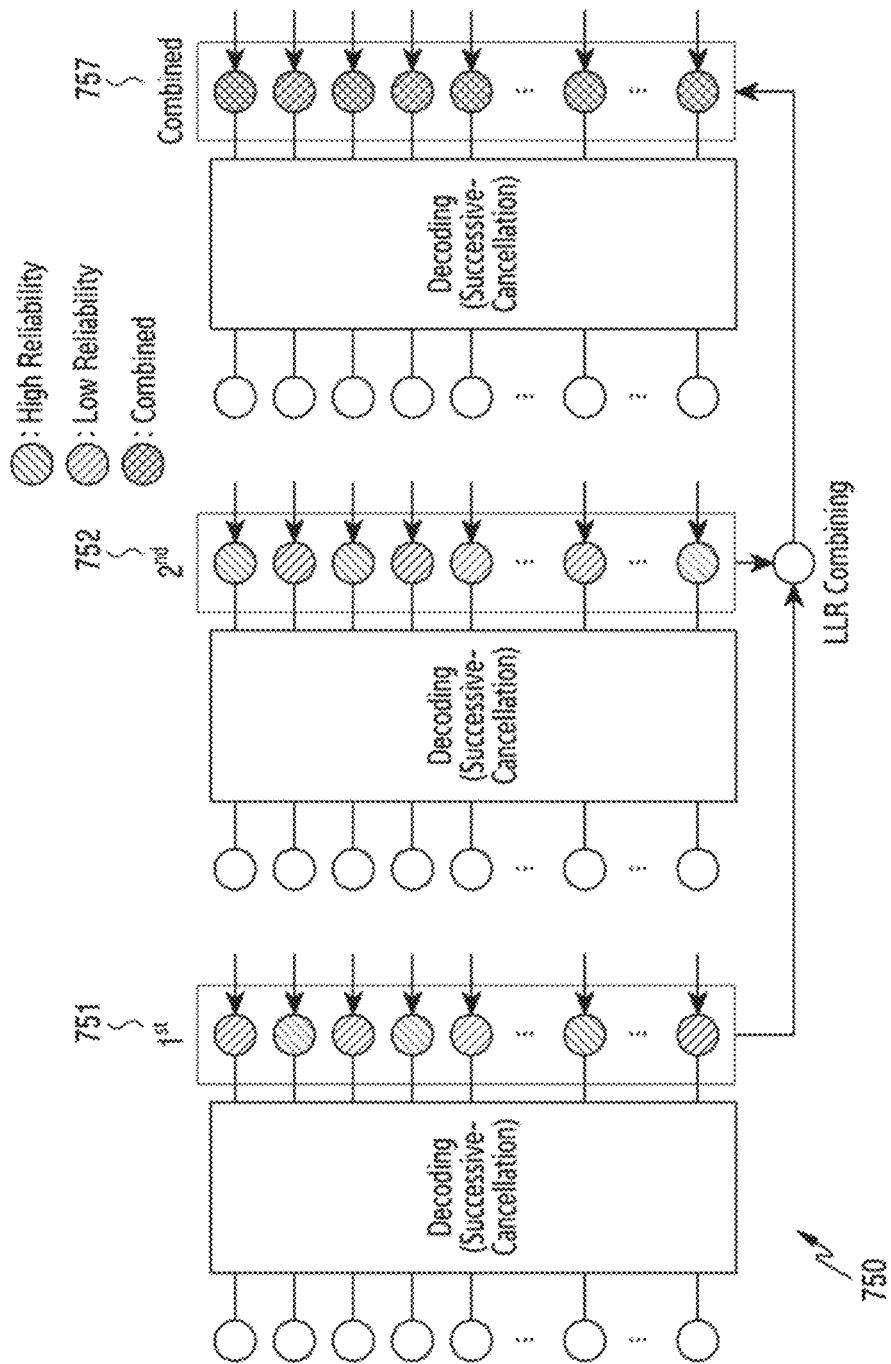
FIG. 7B illustrates an example of reliability combining using a polar code in a communication system according to one or more embodiments of the present disclosure.

FIG. 7B illustrates an example of reliability combining using the polar code in the communication system according to one or more embodiments of the present disclosure. FIG. 7B explains different reliability mapping and corresponding LLR combining in each of two repeated transmissions.

Referring to FIG. 7B, in an initial transmission 751, the receiving stage may perform the decoding. In so doing, values $x_i$ (i is an integer greater than or equal to 0 and less than N) transmitted from the transmitting stage pass the channel and thus obtain a specific reliability distribution at the receiving stage. In a retransmission 752, it is assumed that the transmitting stage transmits the values $x_i$ (i is an integer greater than or equal to 0 or less than N) over different channels. That is, FIG. 7B shows that the reliability distribution of values $y_i$ is changed if the values $x_i$ are mapped to other bits among bits constituting the modulation symbol in the repeated transmission. In the retransmission 752, the receiving stage experiences a reliability distribution different from the reliability distribution of the initial transmission 751. According to an embodiment, the reliability distribution in the retransmission 752 may be the reverse of the reliability distribution of the initial transmission 751. If combining LLRs of the repeated y values, the receiving stage may identify that the LLR distribution of $y_i$ inputted to the decoder may be uniformly changed. While FIG. 7B describes the two reliability distribution types, a similar effect may be obtained by mapping transmission bits to bits having different reliability distributions even if there are more than two types of the reliability distribution.

In the LDPC code or the Turbo code, an incremental redundancy (IR) technique uses a method of transmitting bits punctured in the initial transmission in the retransmission for HARQ transmission. However, in the polar code technique, the transmitting stage does not input an information word, by processing information bits related to the bits punctured in the initial transmission as incapable bits. However, in the retransmission, the incapable bits processed in a previous transmission (e.g., initial transmission) are no longer incapable bits. Accordingly, in the retransmission, performance if the transmitting stage transmits the punctured bits may be degraded compared to substituting the information word to the incapable bits. Thus, the polar code may maintain stable performance by using a chase combining technique rather than using the IR technique based on the punctured bits.

If using the chase combining technique, it is meaningful to provide a method for improve the performance. Hence, one or more embodiments of the present disclosure suggest a transmission method for ensuring excellent performance, if a signal (i.e., a bit stream) using the polar code is repeatedly transmitted in several slots or several time transmission intervals (TTI), or if retransmission like HARQ is necessary. Also, an embodiment of the present disclosure proposes a solution for ensuring excellent performance, even if the polar code is repeatedly transmitted in one slot or one TTI. In addition, yet another embodiment of the present disclosure proposes a method for improving an encoding gain of the polar code if repetition is performed as above.

In the 3GPP NR system, the position where the information bit is mapped and the position where the frozen bit is mapped, in the sub-channel allocation 204 of FIG. 2A, are designed on the assumption that the distribution of the decoder input channel is uniform. Hence, the transceiving method which makes the LLR distribution of the input signal of the polar decoder as uniform as possible may improve the decoding performance of the polar code at the receiving stage. One or more embodiments of the present disclosure are to propose a transceiving method which makes LLR distribution as uniform as possible after soft combining of the receiving stage if repeated transmission, retransmission or repetition occurs in the rate matching (i.e., E>N).

2. Reliability Based DEMUX Management Technique

Figure 8:
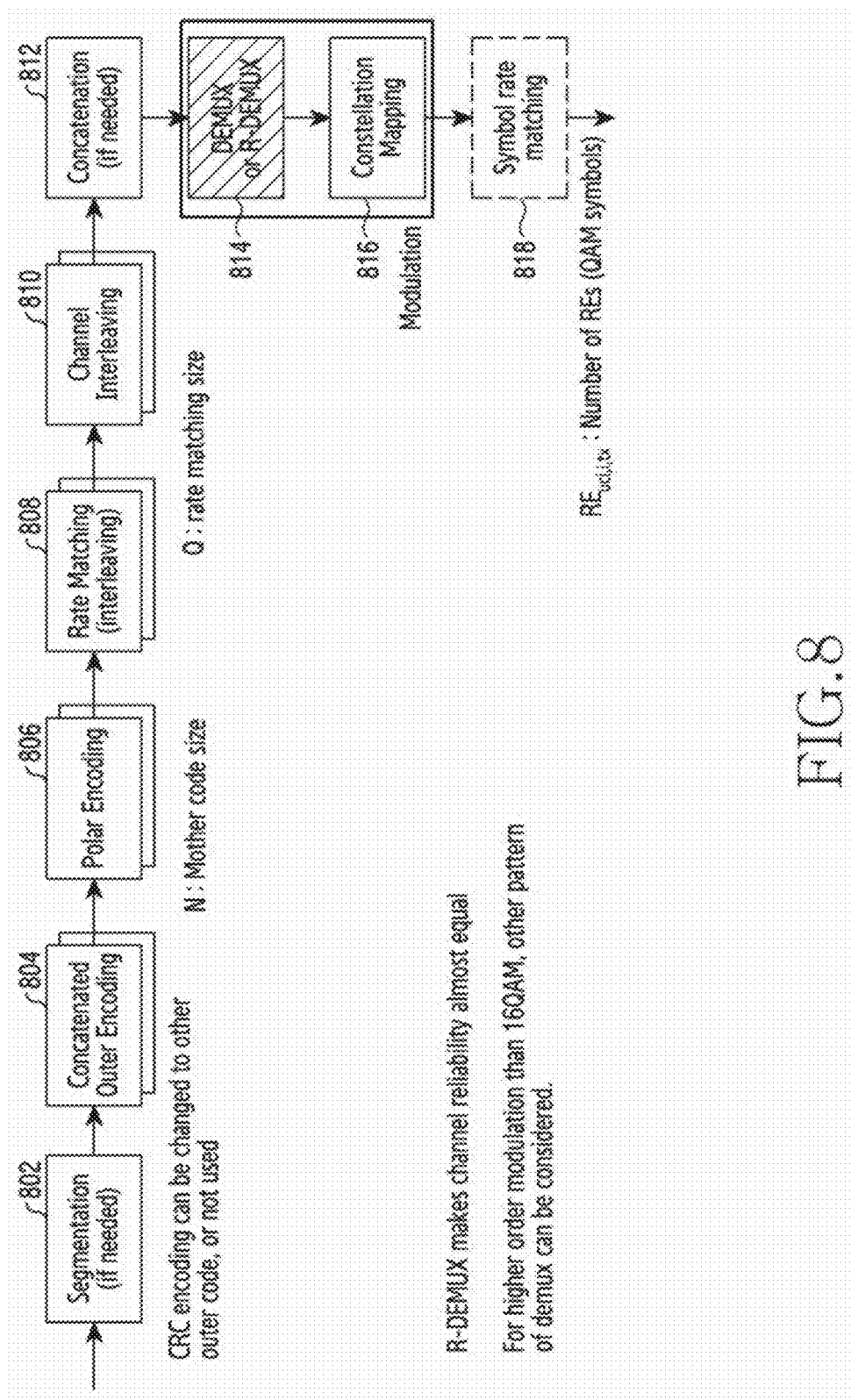
FIG. 8 illustrates an example of reliability based DEMUX management in a communication system according to one or more embodiments of the present disclosure.

FIG. 8 illustrates an example of a reliability based DEMUX management technique in a communication system according to one or more embodiments of the present disclosure. As mentioned earlier, the reliability based DEMUX management technique includes differently configuring a DEMUX output at the transmitting stage according to the transmit count at the transmitting stage, to achieve more uniform reliability distribution at the receiving stage. Instead of the operation of the DEMUX 412 of FIG. 4, a method for designing the DEMUX in various manners according to the transmit or repeat count (repetition count) is proposed.

Referring to FIG. 8, an operation of concatenated outer encoding 804 of FIG. 8 is the same as the concatenated outer encoder 402 of FIG. 4, and polar encoding 806 includes the operations of the sub-channel allocation 404, and the generator matrix multiplication 406 of FIG. 4. Operations of rate matching 808 and channel interleaving 810 of FIG. 8 are the same as the rate-matching 408 and the channel interleaving 410 of FIG. 4. In addition, operations of constellation mapping 816 and symbol rate matching 818 are the same as the constellation mapping 414 and the symbol rate matching 416 shown in FIG. 4. According to an embodiment, the transmitting stage may receive an information word bit stream and segment the information word into two or more segments according to a designated rule. According to an embodiment, the transmitting stage may output a single segment. Although this block is omitted in FIG. 2A and FIG. 4, it is noted that the corresponding block may be performed, if necessary.

According to one or more embodiments, the transmitting stage may operate various DEMUXs based on at least one of the repeat count and the transmit count. According to an embodiment, the transmitting stage may determine whether to use a DEMUX and a reverse DEMUX. That is, the DEMUX 412 of FIG. 4 may be replaced by a DEMUX or reverse DEMUX 814 in FIG. 8. Unlike FIG. 8, a plurality of DEMUX schemes, besides two types of the DEMUX, may be configured to correspond to the total repeat count or the total transmit count, and the transmitting stage may select and apply adequate DEUX schemes based on at least one of the repeat count or the transmit count. In this case, the plurality of the configured DEMUXs may be configured to uniformly distribute signals in probability, considering the total repeat count or the total transmit count. That is, the plurality of the configured DEMUXs may be designed not to force a symbol of a specific position to a specific channel, if considering the repeat count or the transmit count.

As an embodiment, the DEMUX used for the first transmission may use Equations 2, 3, 4, and 5. The second repeated transmission or the second transmission may use Equations 2, 16, 17, 18, 19, and 20. More specifically, the re-DEMUX may be configured to map bits mapped to bit positions of high reliability in the first transmission or the first repetition to bit positions of low reliability in the second transmission or the second repetition. The third transmission or the third repetition may use the same method as the first transmission, or may use a different mapping method. Yet another mapping method will be described below.

The BPSK/QPSK transmission uses the same DEMUX as the initial transmission. In an n-PSK modulation scheme such as BPSK or QPSK, the receiving stage has the same demodulation environment of each symbol. This is because the Euclidean distance between constellation points from the center of the constellation is the same. Accordingly, the same reliability may be formed between the constellation points. However, in the 16 QAM, the 64 QAM, and the 256 QAM to be described, since the Euclidean distance between the center point of the constellation and each constellation point is different, the channel reliability may be formed differently for each symbol.

If the 16 QAM modulation scheme is used, odd-numbered transmission may use the DEMUX based on Equation 3, and even-numbered transmission may use the DEMUX based on Equation 16 below. The DEMUX of Equation 16 may be defined as follows. In this case, Equation 16, which corresponds to the reverse of Equation 3, may be referred to as the re-DEMUX.

Figure 9A:
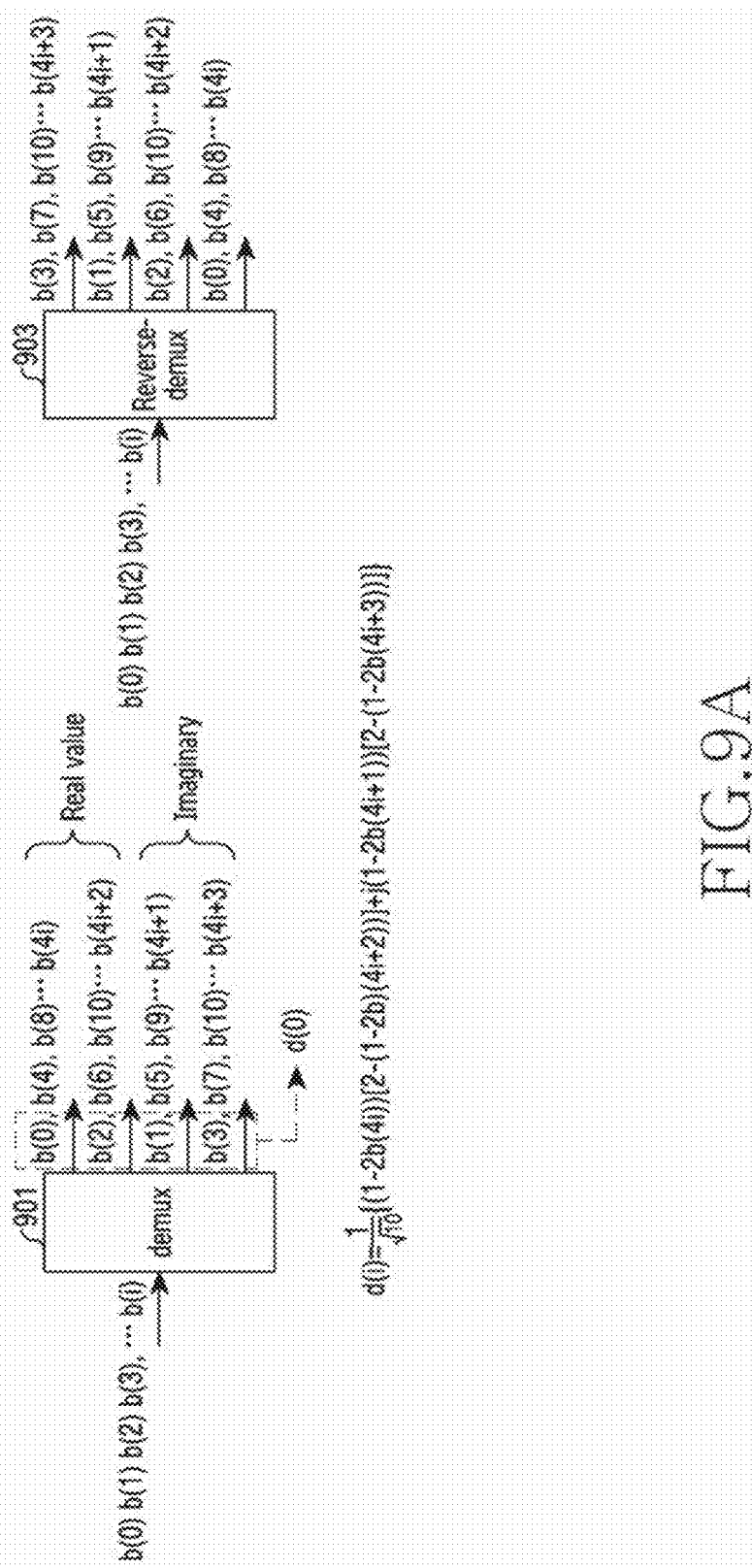
FIG. 9A through FIG. 9C illustrate examples of a DEMUX and a reverse DEMUX (re-DEMUX) in a communication system according to one or more embodiments of the present disclosure.

<Equation 16> mapping an even index of m to real and an odd index to imaginary, $m_{4k} = i_{4k+3}$ where $k=0,1,\ldots,E/4$ $m_{4k+1} = i_{4k+1}$ where $k=0,1,\ldots,E/4$ $m_{4k+2} = i_{4k+2}$ where $k=0,1,\ldots,E/4$ $m_{4k+3} = i_{4k}$ where $k=0,1,\ldots,E/4$ Referring to FIG. 9A, a DEMUX 901 for the 16 QAM is configured based on <Equation 3>. A re-DEMUX 903 for the 16 QAM is configured based on <Equation 16>. The transmitting stage may perform 16 QAM repeated transmissions by alternating the DEMUX 901 and the re-DEMUX 903.

If the 64 QAM modulation is used, the transmitting stage may use the DEMUX based on Equation 4 in an odd-numbered transmission and may use the DEMUX for an even-numbered transmission based on the following Equation 17. The DEMUX of Equation 17 may be defined as below. At this time, since Equation 17, which corresponds to the reverse of Equation 4, may be referred to as the re-DEMUX.

$m_{6k} = i_{6k+5}$ where $k=0,1,\ldots,E/6$ $m_{6k+1} = i_{6k+3}$ where $k=0,1,\ldots,E/6$ $m_{6k+2} = i_{6k+1}$ where $k=0,1,\ldots,E/6$ $m_{6k+3} = i_{6k+4}$ where $k=0,1,\ldots,E/6$ $m_{6k+4} = i_{6k+2}$ where $k=0,1,\ldots,E/6$ $m_{6k+5} = i_{6k}$ where $k=0,1,\ldots,E/6$  <Equation 17>

Figure 9B:
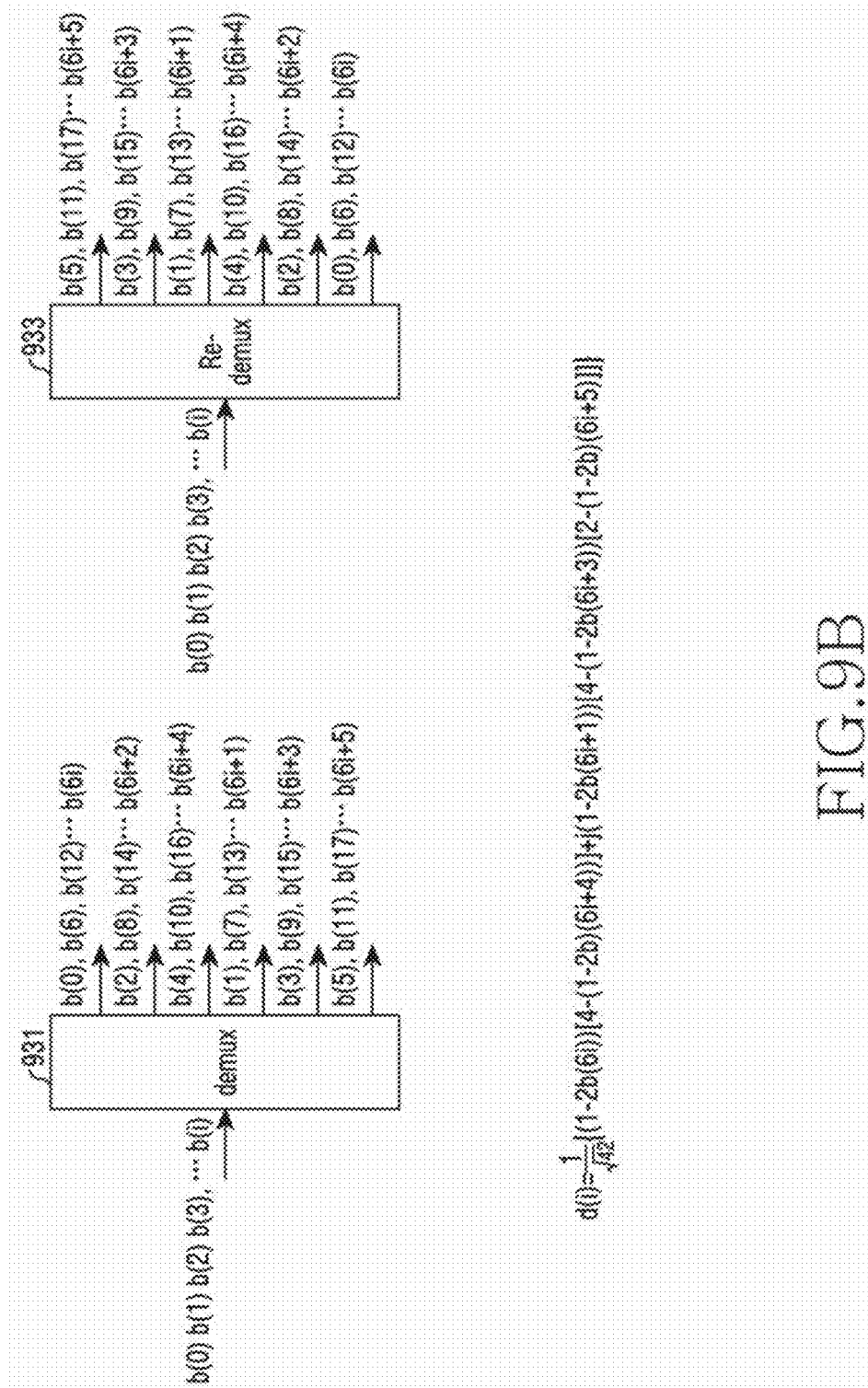

Referring to FIG. 9B, a DEMUX 931 for the 64 QAM is configured based on <Equation 4>. A re-DEMUX 933 for the 64 QAM is configured based on <Equation 17>. The transmitting stage may perform 64 QAM repeated transmissions by alternating the DEMUX 931 and the re-DEMUX 933.

If using the 256 QAM modulation scheme, the transmitting stage may use the DEMUX based on Equation 5 in an odd-numbered transmission and may use the DEMUX based on Equation 18 for an even-numbered transmission. The DEMUX of Equation 18 may be defined as below. In so doing, Equation 18, which corresponds to the reverse of Equation 5, may be referred to as the re-DEMUX.

$m_{8k} = i_{8k+7}$ where $k=0,1,\ldots,E/8$ $m_{8k+1} = i_{8k+5}$ where $k=0,1,\ldots,E/8$ $m_{8k+2} = i_{8k+3}$ where $k=0,1,\ldots,E/8$ $m_{8k+3} = i_{8k+1}$ where $k=0,1,\ldots,E/8$ $m_{8k+4} = i_{8k+6}$ where $k=0,1,\ldots,E/8$ $m_{8k+5} = i_{8k+4}$ where $k=0,1,\ldots,E/8$ $m_{8k+6} = i_{8k+2}$ where $k=0,1,\ldots,E/8$ $m_{8k+7} = i_{8k}$ where $k=0,1,\ldots,E/8$  <Equation 18>

Figure 9C:
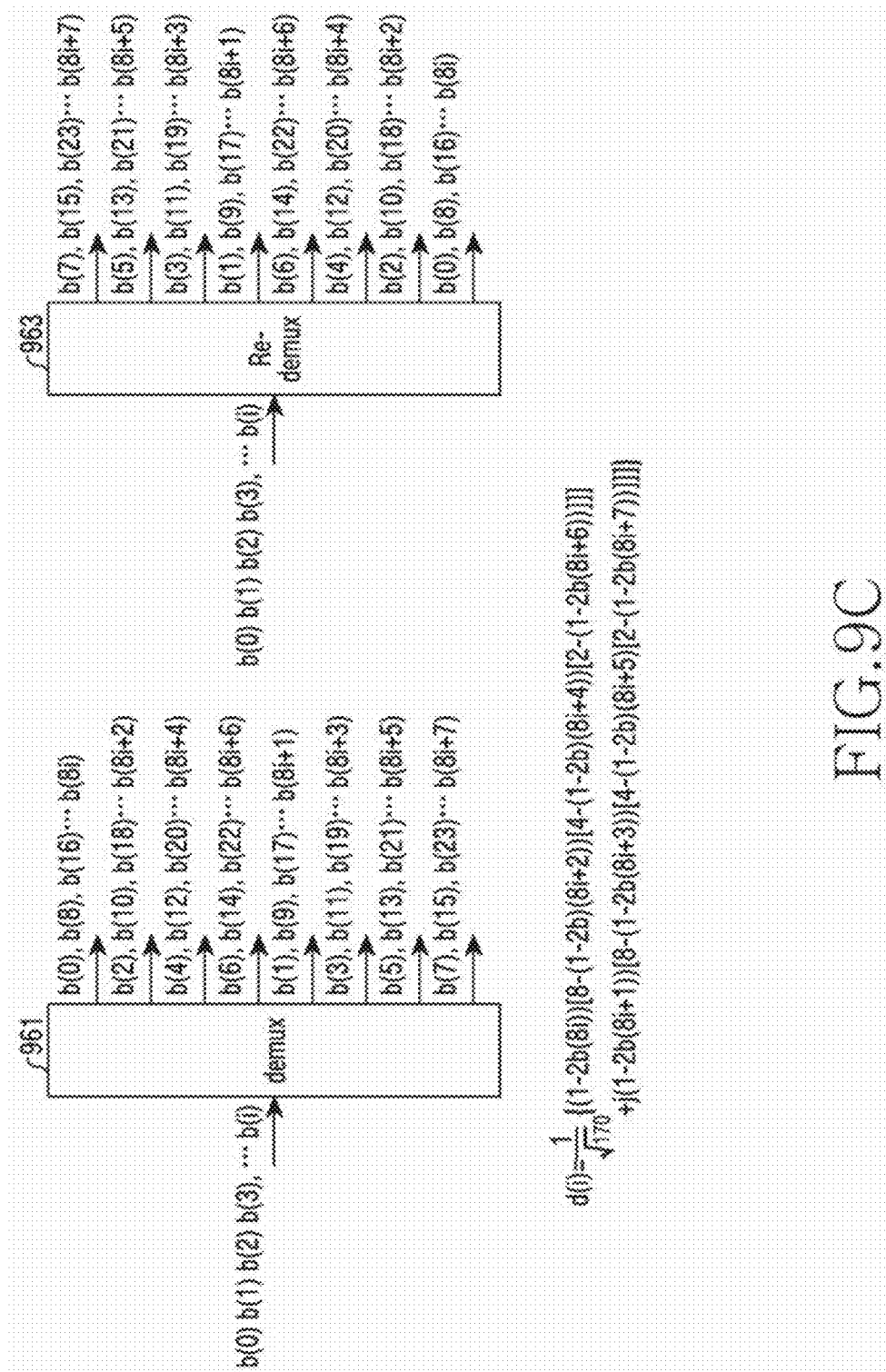

Referring to FIG. 9C, a DEMUX 961 for the 256 QAM is configured based on <Equation 5>. A re-DEMUX 963 for the 256 QAM is configured based on <Equation 18>. The transmitting stage may perform 256 QAM repeated transmissions by alternating the DEMUX 961 and the re-DEMUX 963.

In some embodiments, the DEMUX 814 and the constellation mapping 816 may be integrated into one. That is, by receiving an input bit sequence $i=\{i_0, i_1, \ldots, i_{E-1}\}$ of the DEMUX, the transmitting stage may generate an output complex symbol sequence $d=\{d_0, d_1, \ldots, d_{E-1}\}$ of the constellation mapping based on the following equations.

If using the 16 QAM modulation scheme, the transmitting stage may configure a modulated signal based on Equation 8 in odd-numbered transmission and may configure a modulated signal in an even-numbered transmission as shown in Equation 19 below.

$$d_k = \frac{1}{\sqrt{10}}\{(1 - 2 \cdot i_{4k+3})[2 - (1 - 2 \cdot i_{4k+1})]\} + j\frac{1}{\sqrt{10}}\{(1 - 2 \cdot i_{4k+2})[2 - (1 - 2 \cdot i_{4k})]\}$$

<Equation 19>

If using the 64 QAM modulation scheme, the transmitting stage may configure the modulated signal based on Equation 9 in an odd-numbered transmission and may configure the modulated signal in an even-numbered transmission based on the following Equation 20.

$$d_k = \qquad <\text{Equation 20}>$$

$$\frac{1}{\sqrt{42}}\{(1-2\cdot i_{6k+5})[4-(1-2\cdot i_{6k+3})[2-(1-2\cdot i_{6k+1})]]\} +$$

$$j\frac{1}{\sqrt{42}}\{(1-2\cdot i_{6k+4})[4-(1-2\cdot i_{6k+2})[2-(1-2\cdot i_{6k})]]\}$$

If using the 256 QAM modulation scheme, the transmitting stage may configure the modulated signal based on Equation 10 in an odd-numbered transmission and may configure the modulated signal in an even-numbered transmission based on the following Equation 21.

$$d_k = \frac{1}{\sqrt{170}}\{(1-2\cdot i_{8k+7}) \qquad <\text{Equation 21}>$$

$$[8-(1-2\cdot i_{8k+5})[4-(1-2\cdot i_{8k+3})[2-(1-2\cdot i_{8k+1})]]]\} +$$

$$j\frac{1}{\sqrt{170}}\{(1-2\cdot i_{8k+6})$$

$$[8-(1-2\cdot i_{8k+4})[4-(1-2\cdot i_{8k+2})[2-(1-2\cdot i_{8k})]]]\}$$

FIG. 8 have described the blocks in detail to explain their functions, but this is only descriptions according to the functional configuration and the separated block does not necessarily indicate separate device configuration. According to an embodiment, at least two of the blocks shown in FIG. 8 may be integrated into one. For example, each block is the functional configuration, and it is noted that the segmentation 802, the concatenated outer encoding 804, the polar encoding 806, the rate matching 808, the channel interleaver 810, the concatenation 812, the DEMUX or R-DEMUX 814, the constellation mapping 816, and the symbol rate matching 818 may be implemented with one processor.

FIG. 9A through FIG. 9C have described, as an embodiment, the method of using the DEMUX in the odd-numbered transmission and the reverse DEMUX in the even-numbered transmission according to the number of the repeated transmissions. However, this is only the example of the solution for uniformly distributing the reliability of the receiving stage, and it is noted that a DEMUX having various orders may be used according to the repeat and transmit count, in addition to this method. According to an embodiment, besides the DEMUX and the re-DUMUX, for N-ary repeated transmissions (where, N is an integer greater than or equal to 3), if N-ary DEMUXs in total each are used once, the N-ary DEMUXs may be designed to achieve uniform reliability distribution of modulation symbols. As an example, the DEMUX management technique through the cyclic shift of FIG. 10 shall be described.

Figure 10A:
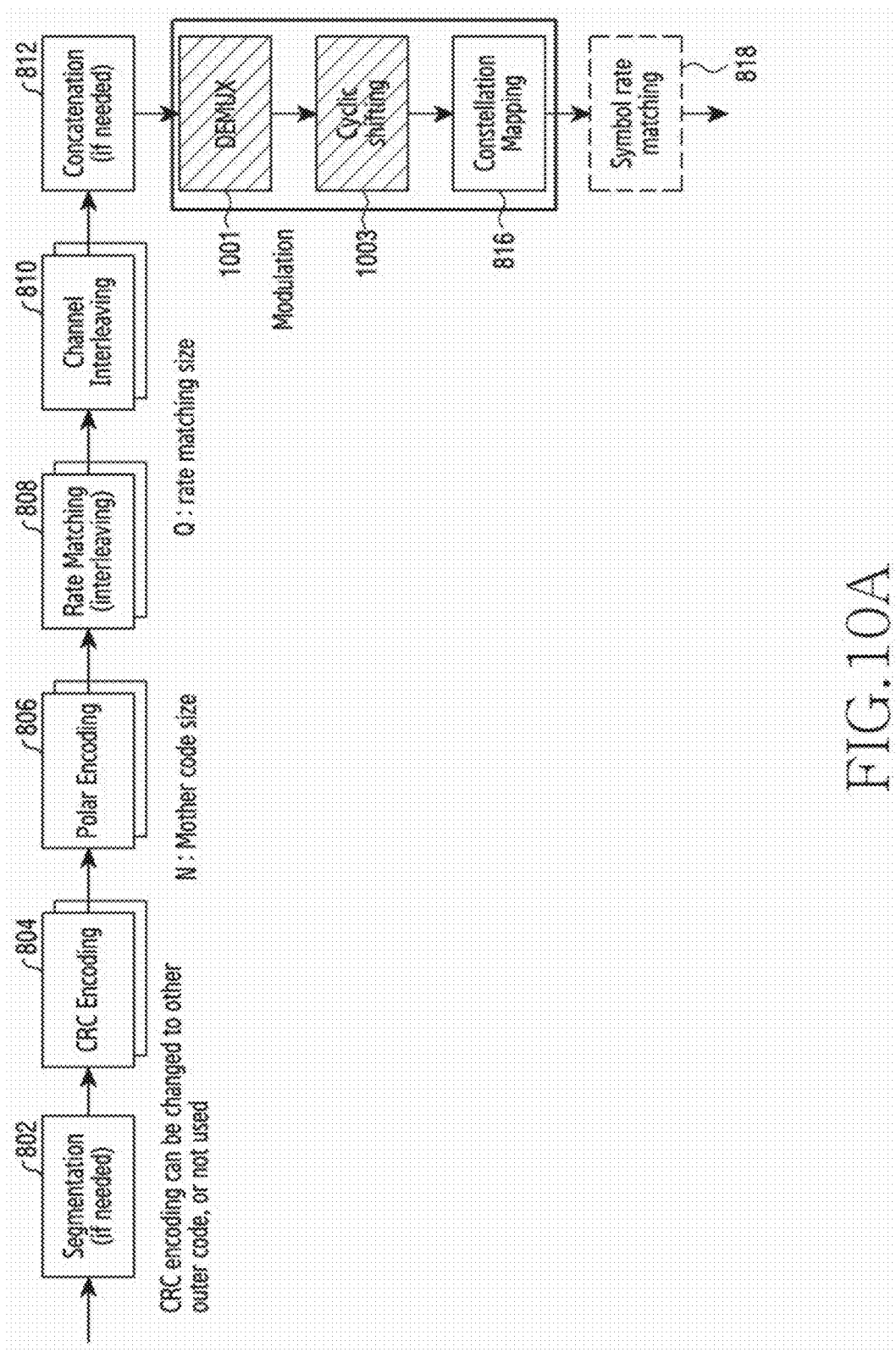
FIG. 10A and FIG. 10B illustrate an example of reliability based DEMUX management according to cyclic shift in a communication system according to one or more embodiments of the present disclosure.
Figure 10B:
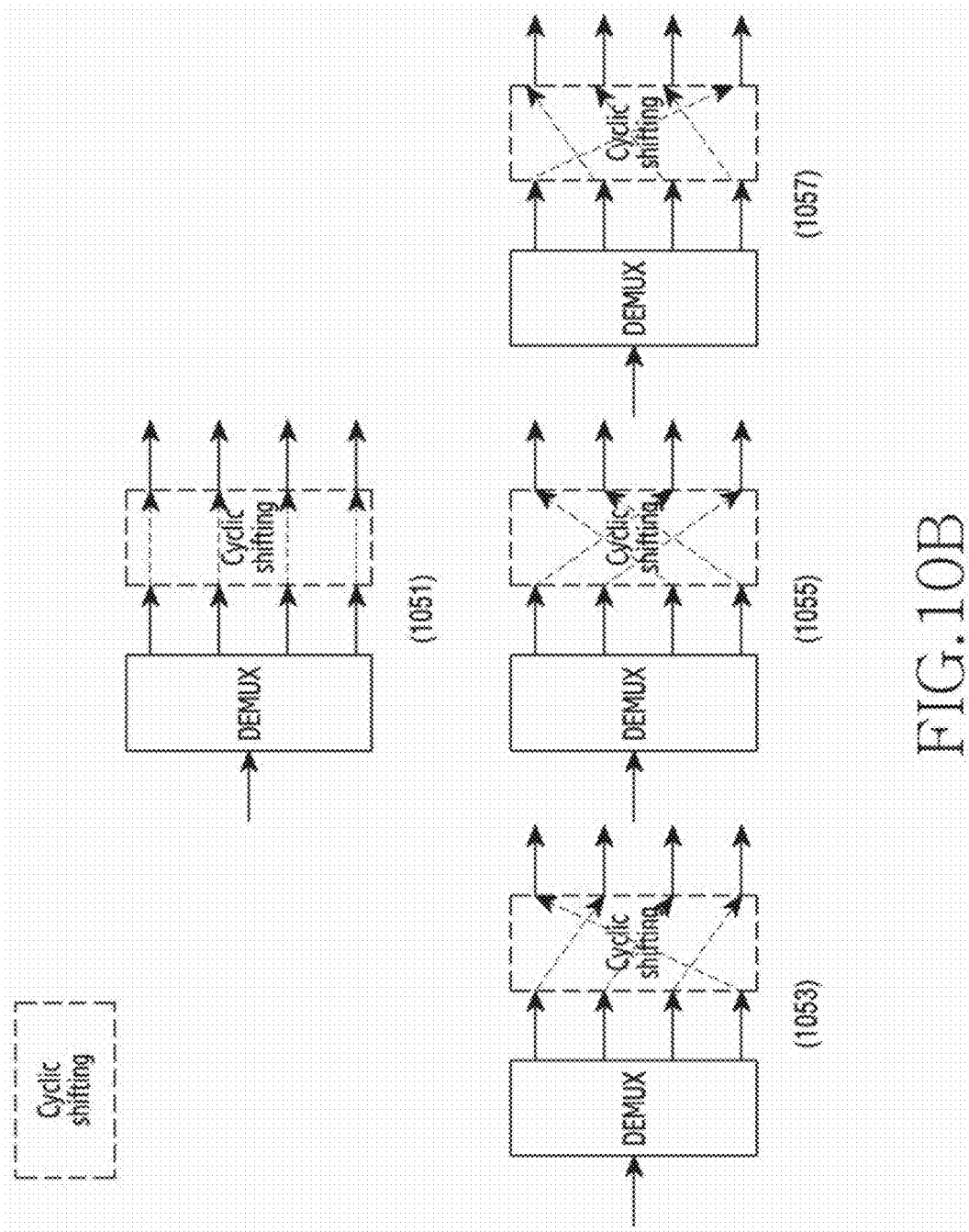

FIG. 10A and FIG. 10B illustrate an example of a reliability based DEMUX management technique according to cyclic shift in a communication system according to one or more embodiments of the present disclosure. FIG. 8 has suggested the method of using the DEMUX in the odd-numbered transmission and the reverse DEMUX in the even-numbered transmission according to the number of the repeated transmissions as an embodiment of the present disclosure. Besides this method, a DEMUX having various orders according to the repeat and transmit count may be used.

Referring to FIG. 10A, the DEMUX or re-DEMUX 814 of FIG. 8 may be implemented by replacing with procedures of a DEMUX 1001 and cyclic shift 1003. That is, even if the same DEMUX 1001 is used for each bit, the reliability of the modulation symbol actually transmitted through the cyclic shift may be configured to distribute differently in each repeated transmission (or in each retransmission). The transmitting stage may use a DEMUX output bit stream by cyclic shifting it. In the 64 QAM, 6 bits constituting the 64 QAM have three different reliability levels and their mapped positions may differ depending on the number of retransmissions or repeated transmissions. Cyclic shifting of the DEMUX output bit stream according to the repeat or transmit count may be used.

FIG. 10B illustrates the example of the DEMUX cyclic shifting considering four (4) repeated transmissions. The 16 QAM is assumed. According to an embodiment, in uplink transmission, parameters related to the cyclic shifting may be configured in advance. Predefined values in standard may be used according to the number of the repeated transmissions or the number of the retransmissions. According to another embodiment, it may be configured by the base station (e.g., RRC) signaling as a higher layer parameter).

In a first transmission 1051, an output $m_i$ according to the DEMUX and first cyclic shifting may be configured as the following Equation 22a. A parameter value which is set for the first cyclic shifting may be 0.

$m_{4k}=i_{4k}$ where $k=0,1,\ldots,E/4$ $m_{4k+1}=i_{4k+2}$ where $k=0,1,\ldots,E/4$ $m_{4k+2}=i_{4k+1}$ where $k=0,1,\ldots,E/4$ $m_{4k+3}=i_{4k+3}$ where $k=0,1,\ldots,E/4$ <Equation 22a>

In a second transmission 1053, an output $m_i$ according to the DEMUX and second cyclic shifting may be configured as the following Equation 22b. A parameter value set for the second cyclic shifting may be 1.

$m_{4k}=i_{4k+3}$ where $k=0,1,\ldots,E/4$ $m_{4k+1}=i_{4k}$ where $k=0,1,\ldots,E/4$ $m_{4k+2}=i_{4k+2}$ where $k=0,1,\ldots,E/4$ $m_{4k+3}=i_{4k+1}$ where $k=0,1,\ldots,E/4$ <Equation 22b>

In a third transmission 1055, an output $m_i$ according to the DEMUX and third cyclic shifting may be configured as following Equation 22c. A parameter value set for the third cyclic shifting may be 2.

$m_{4k}=i_{4k+1}$ where $k=0,1,\ldots,E/4$ $m_{4k+1}=i_{4k+3}$ where $k=0,1,\ldots,E/4$ $m_{4k+2}=i_{4k}$ where $k=0,1,\ldots,E/4$ $m_{4k+3}=i_{4k+2}$ where $k=0,1,\ldots,E/4$ <Equation 22c>

In a fourth transmission 1057, an output $m_i$ according to the DEMUX and fourth cyclic shifting may be configured as following Equation 22d. A parameter value set for the fourth cyclic shifting may be 3.

$m_{4k}=i_{4k+2}$ where $k=0,1,\ldots,E/4$ $m_{4k+1}=i_{4k+1}$ where $k=0,1,\ldots,E/4$ $m_{4k+2}=i_{4k+3}$ where $k=0,1,\ldots,E/4$ $m_{4k+3}=i_{4k}$ where $k=0,1,\ldots,E/4$ <Equation 22d>

As mentioned above, if necessary, the DEMUX, the cyclic shifting, and the constellation mapping may be implemented as one block.

Figure 11:
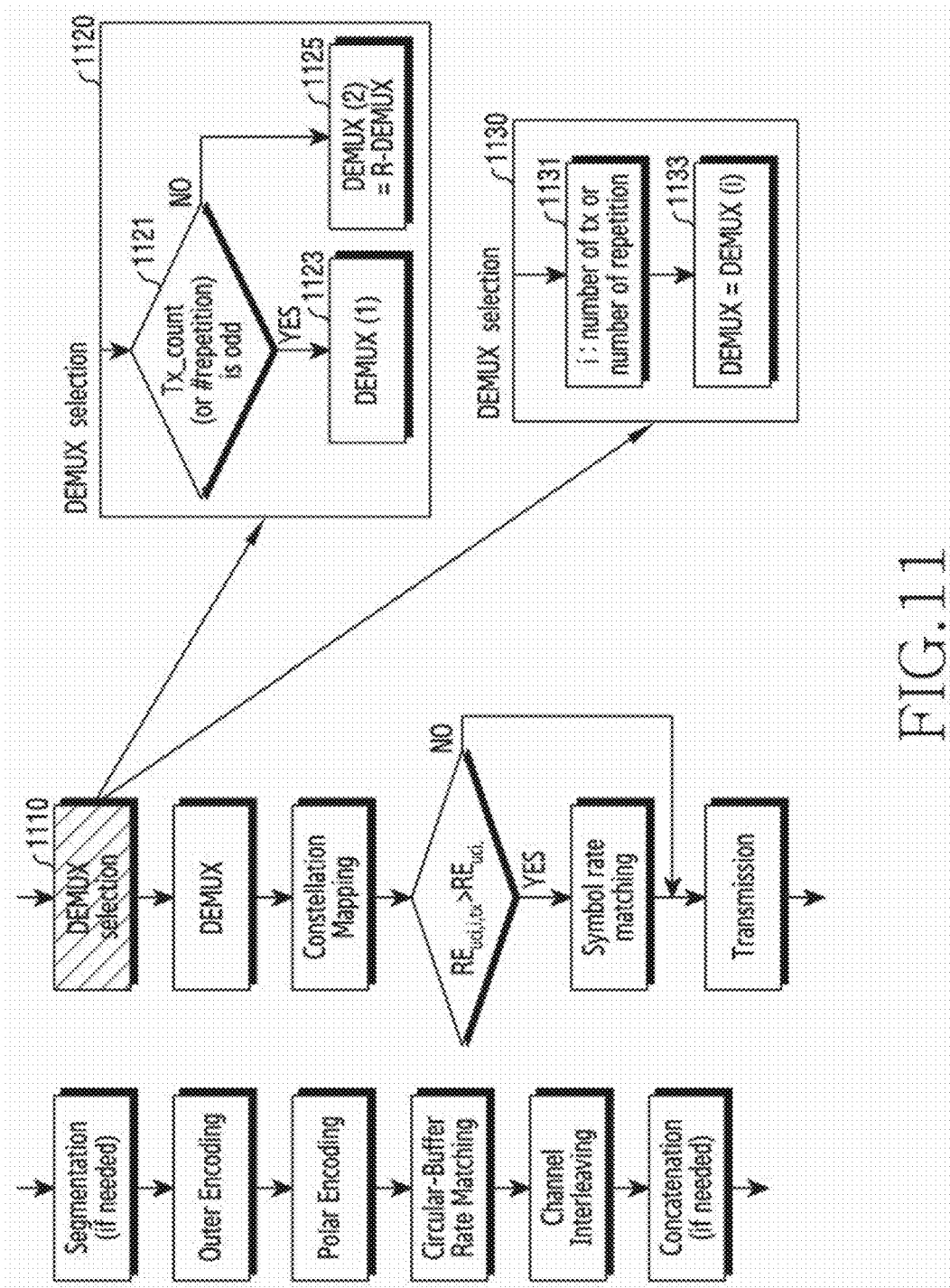
FIG. 11 illustrates an operation flow of a transmitting stage for reliability based DEMUX management in a communication system according to one or more embodiments of the present disclosure.

FIG. 11 illustrates an operation flow of a transmitting stage for a reliability based DEMUX management technique in a communication system according to one or more embodiments of the present disclosure. Operations of FIG. 11 are operations of the transmitting stage, and descriptions corresponding to FIG. 2A, FIG. 4, and FIG. 8 are omitted.

In FIG. 11, the transmitting stage may select the DEMUX management technique 1110 before performing the DEMUX. According to an embodiment, as shown in FIG. 8, the transmitting stage may perform the conventional DEMUX according to a current transmit count (or repeat count) or the re-DEMUX which performs symbol mapping in the reverse order of the conventional DEMUX.

According to a first scheme 1120, in step 1121, the transmitting stage may identify whether a current transmission is an odd-numbered transmission. If the current transmission is an odd-numbered transmission, the transmitting stage may perform step 1123. If the current transmission is an even-numbered transmission, the transmitting stage may perform step 1125. In step 1123, the transmitting stage may perform a DEMUX 1. In step 1125, the transmitting stage may perform a DEMUX 2. In this case, the DEMUX 2 may correspond to the re-DEMUX which is the reverse arrangement (e.g., FIG. 9A through FIG. 9C) of the DEMUX 1.

The first scheme 1120 may be expanded to a second scheme 1130. Rather than simply managing the DEMUX and the re-DEMUX through two transmissions, the N-ary DEMUXs may be configured, by dividing the total transmit count into N. Each DEMUX may be expressed as DEMUX (i) (where, i is an integer greater than or equal to 1 and less than or equal to N). In step 1131, the transmitting stage may identify a current transmit count. In step 1133, the transmitting stage may identify the DEMUX according to the current transmit count. The transmitting stage may identify the DEMUX according to the current transmit count among the total N-ary DEMUXs. According to an embodiment, a parameter related to the total number N of the DEMUXs may be configured in advance. The total number N of the DEMUXs may be predefined (e.g., 2 or 4) according to a standard. According to another embodiment, the parameter related to the total number N of the DEMUXs may be configured by the base station (e.g., RRC signaling as a higher layer parameter).

Although FIG. 11 has described that the different DEMUX is configured for each transmit count, this is only the example of the implementation, and it is noted that it may operate through the cyclic shifting, as shown in FIG. 10. The transmitting stage may identify a transmission number i of the current transmission. The transmission number i may indicate the transmit count (i.e., the retransmit count). The transmitting stage may identify a value cyclic shift (i) according to the transmit number count I, and perform the cyclic shifting according to the identified value cyclic shift (i).

Figure 12:
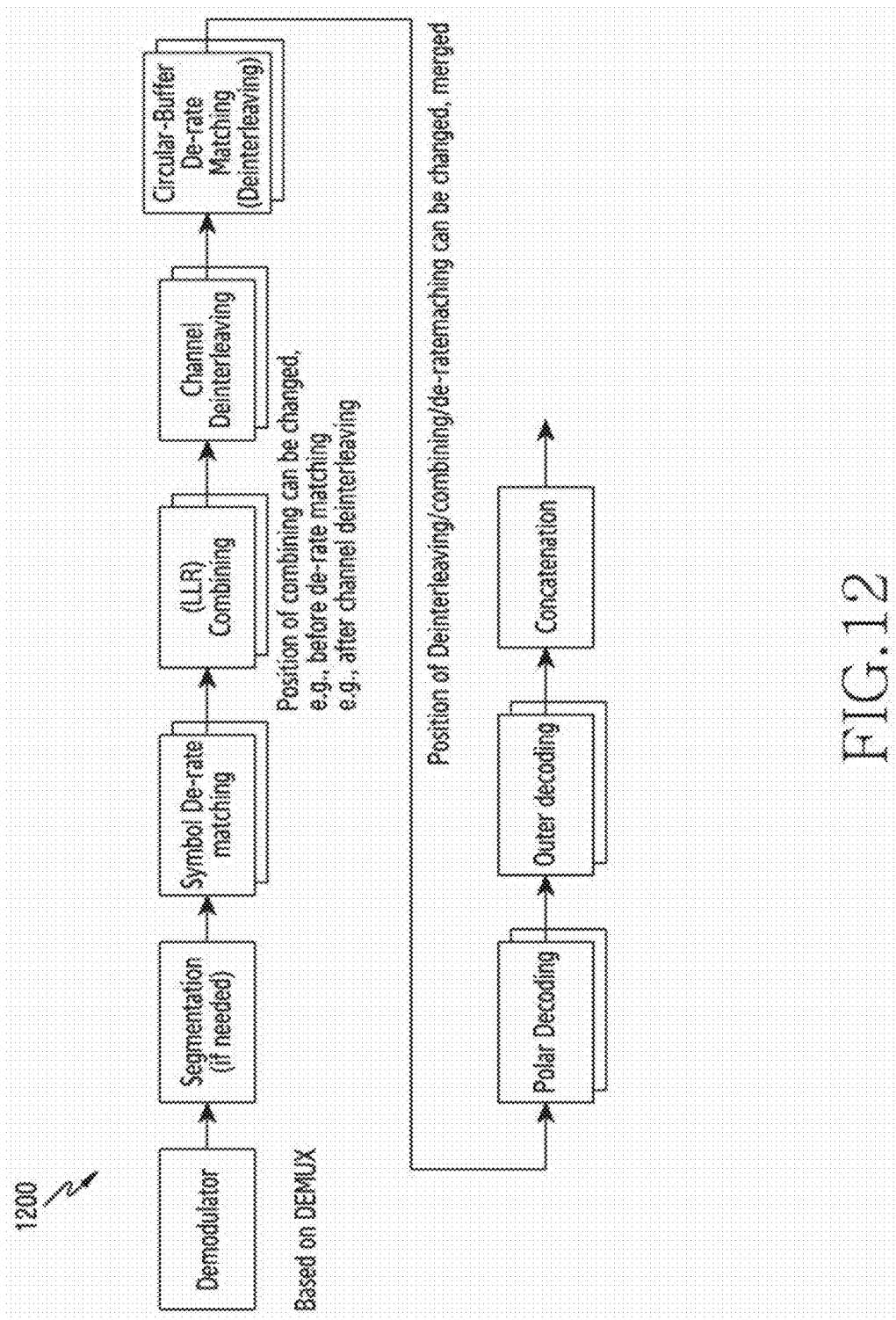
FIG. 12 illustrates an operation flow of a receiving stage for reliability based DEMUX management in a communication system according to one or more embodiments of the present disclosure.

FIG. 12 illustrates an operation flow 1200 of a receiving stage for a reliability based DEMUX management technique in a communication system according to one or more embodiments of the present disclosure. The receiving stage may demodulate a received signal. If necessary, the receiving stage may output segmentation through the segmentation. The receiving stage may perform symbol de-rate matching. This corresponds to the symbol rate matching 818 of the transmitting stage. The receiving stage may perform LLR binding. FIG. 12 illustrates that the LLR combining is performed after the symbol de-rate matching, but the embodiment of the present disclosure is not limited thereto. According to another embodiment, the receiving stage may perform the LLR combining before the symbol de-rate matching. Also, according to yet another embodiment, the receiving stage may perform the LLR combining, after channel deinterleaving to be described. Next, the receiving stage may obtain a transmitted signal through channel deinterleaving, circular buffer de-rate matching, channel decoding (i.e., polar decoding) and outer code decoding.

Although FIG. 12 describes the example of one signal processing, the operations of FIG. 12 may be repeatedly performed in each transmission. In this case, the receiving stage may decode the signal with uniform reliability distribution through the LLR combining. The signal is decoded through the uniform distribution, and the error correction performance may be improved.

FIG. 8 through FIG. 12 have described the DEMUX management method for achieving the uniform reliability distribution at the receiving stage. Hereafter, the present disclosure is to suggest yet another transceiving method to achieve uniform LLR distribution as much as possible after repeated transmission, retransmission or soft combining of the receiving stage of a rate matching repetition generator supported.

3. Reliability Based Interleaving Technique

Figure 13A:
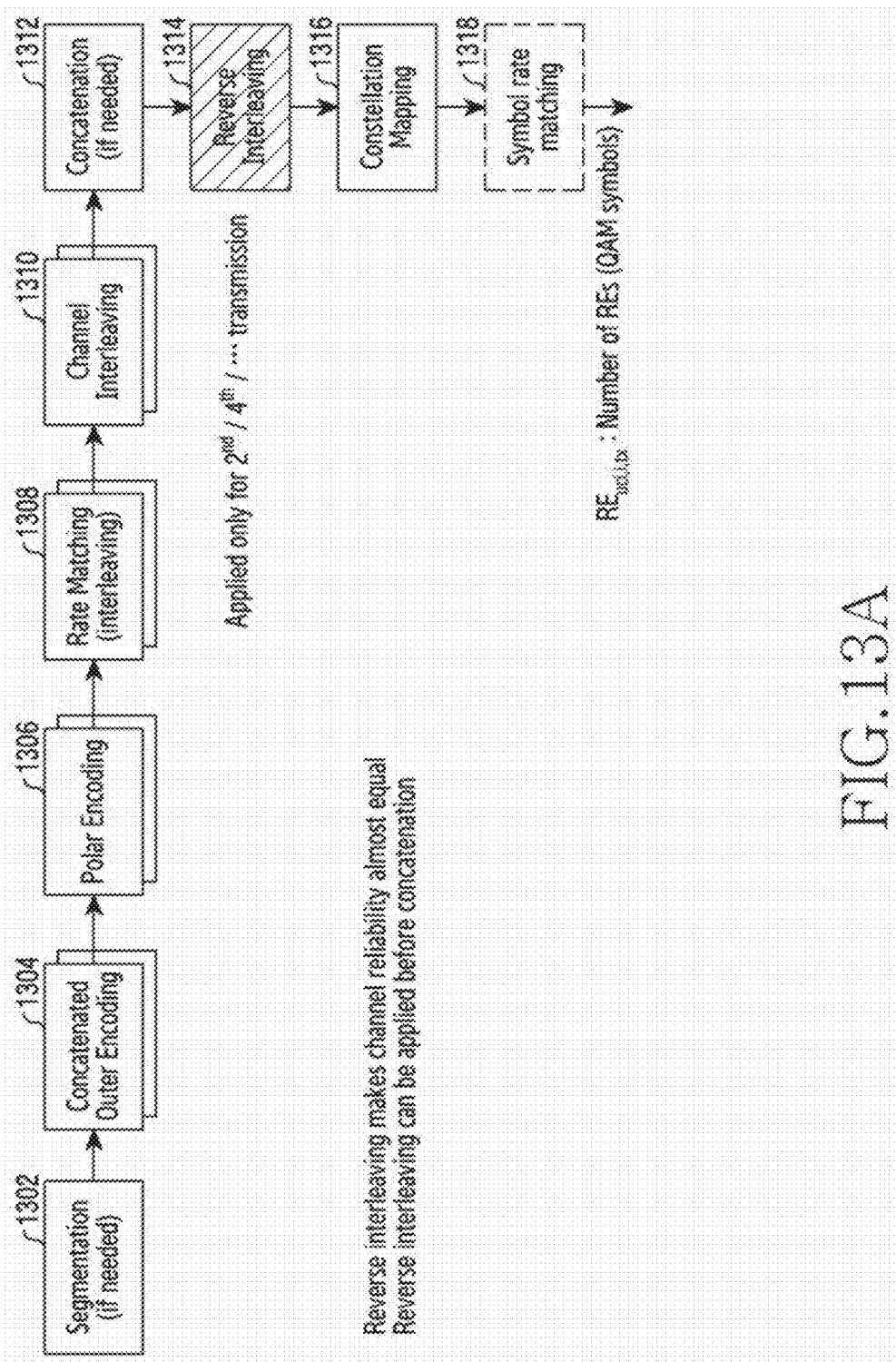
FIG. 13A and FIG. 13B illustrate an example of reliability based interleaving in a communication system according to one or more embodiments of the present disclosure.
Figure 13B:
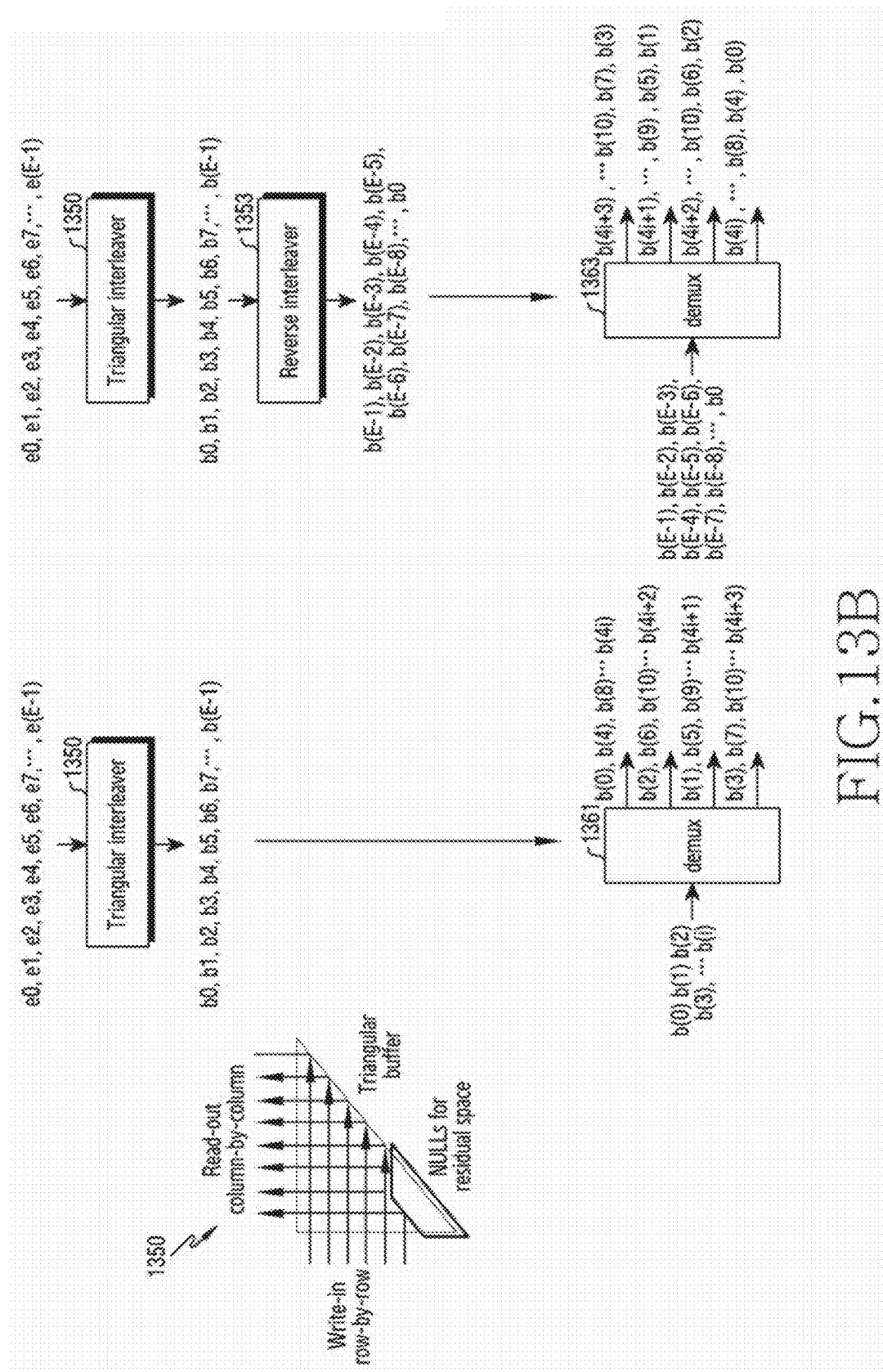

FIG. 13A and FIG. 13B illustrate an example of a reliability based interleaving technique in a communication system according to one or more embodiments of the present disclosure. The reliability based interleaving technique is a solution for differently configuring interleaving of the transmitting stage depending on the transmit count, to achieve uniform reliability distribution at the receiving stage. Instead of the operations of the DEMUX 412 of FIG. 4, the method for variously designing the interleaving according to the transmit or repeat count (reception count) is proposed.

Referring to FIG. 13A, segmentation 1302, concatenated outer encoding 1304, polar encoding 1306, rate matching 1308, channel interleaving 1310, and concatenation 1312 of FIG. 13A correspond to the segmentation 802, the concatenated outer encoding 804, the polar encoding 806, the rate matching 808, the channel interleaving 810, and the concatenation 812 of FIG. 8. Description on the redundant operations is omitted. Also, constellation mapping 1316 and symbol rate matching 1318 of FIG. 13 correspond to the constellation mapping 816 and the symbol rate matching 818 of FIG. 8. Description on the redundant operations is omitted.

Reverse interleaving 1314 of FIG. 13A is configured to receive an output bit stream of the concatenation 1312 and to output it in the reverse order. The transmitting stage receives a bit stream $i=\{i_0, i_1, \ldots, i_{E-1}\}$ and outputs a bit stream $j=\{j_0, j_1, \ldots, j_{E-1}\}$. In this case, the outputted bit stream j satisfies Equation 23.

$$j_k = i_{E-1-k} \text{ where } k=0,1,2,\ldots,E-1 \qquad \text{<Equation 23>}$$

According to an embodiment, the transmitting stage may not apply the reverse interleaving 1314 of FIG. 13 if the transmit count or the repeat count is an odd number. The transmitting stage may apply the reverse interleaving 1314 of FIG. 12 if the transmit count and the repetition are even. A bit mapped to a bit of high reliability in the modulation symbol may be mapped to a bit of low reliability in next transmission, and a bit mapped to a bit of low reliability may be mapped to a bit of high reliability in next transmission. Hence, the LLR distribution becomes as uniform as possible after the soft combining of the receiving stage. If even-numbered transmissions are conducted, since symbols between an odd-numbered transmission and an even-numbered transmission also correspond in reverse order, channel reliability corresponding to each symbol at the receiving stage may be formed uniformly. FIG. 13 illustrates that the reverse interleaving 1314 is performed after the concatenation 1312, but the embodiment of the present disclosure is not limited thereto. According to another embodiment, the reverse interleaving 1314 may be performed before the concatenation 1312.

In the channel coding process using the polar code of the NR, the channel interleaving 1310 may use triangular interleaving. Referring to FIG. 13B, the transmitting stage may perform the channel interleaving 1310 through a triangular interleaver 1350. The triangular interleaver 1350 may receive a bit stream of $e_0, e_1, \ldots, e_{(E-1)}$, and the output a bit stream $b_0, b_1, \ldots, b_{(E-1)}$ the same size.

In a first transmission, the transmitting stage may provide the output bit streams $b_0, b_1, \ldots, b_{(E-1)}$ of the triangular interleaver 1350 as the input to the DEMUX 1361. FIG. 13B illustrates the 16 QAM. The first transmission indicates an initial transmission or an odd-numbered retransmission.

In a second transmission, the transmitting stage may perform reverse interleaving through a reverse interleaver 1353 in addition to the output bit streams $b_0, b_1, \ldots, b_{(E-1)}$ of the triangular interleaver 1350. The reverse interleaver 1353 may receive the bit stream $b_0, b_1, \ldots, b_{(E-1)}$, and output a bit stream $b_{(E-1)}, b_{(E-1)-1}, \ldots, b_1, b_0$ of the same size. The transmitting stage may output the output bit stream $b_{(E-1)}, b_{(E-1)-1}, \ldots, b_1, b_0$ of the reverse interleaver 1353. It may be provided as the input to a DEMUX 1363. According to an embodiment, the DEMUX 1363 may have the same configuration as the DEMUX 1631. According to another embodiment, the DEMUX 1363 may be a DEMUX selected according to the reliability based DEMUX management method described with reference to FIG. 8 through FIG. 12. That is, a combination of the two embodiments may also be understood as an embodiment of the present disclosure. FIG. 13B illustrates the 16 QAM. The second transmission indicates an even-numbered transmission (including retransmission).

Like the 16 QAM, the 64 QAM, and the 256 QAM, in the 16 QAM, the 64 QAM, and the 256 QAM, since the Euclidean distance between the center point of the constellation and each constellation point is different, the reliability of the channel may differ for each symbol. Accordingly, to achieve high channel coding performance, it is required to uniformly distribute the reliability corresponding to each symbol at the receiving stage. In the same manner as FIG. 8 through FIG. 12, high channel coding performance may be achieved, by uniformly distributing the symbol position mapped to each constellation according to repeated transmissions.

Figure 14:
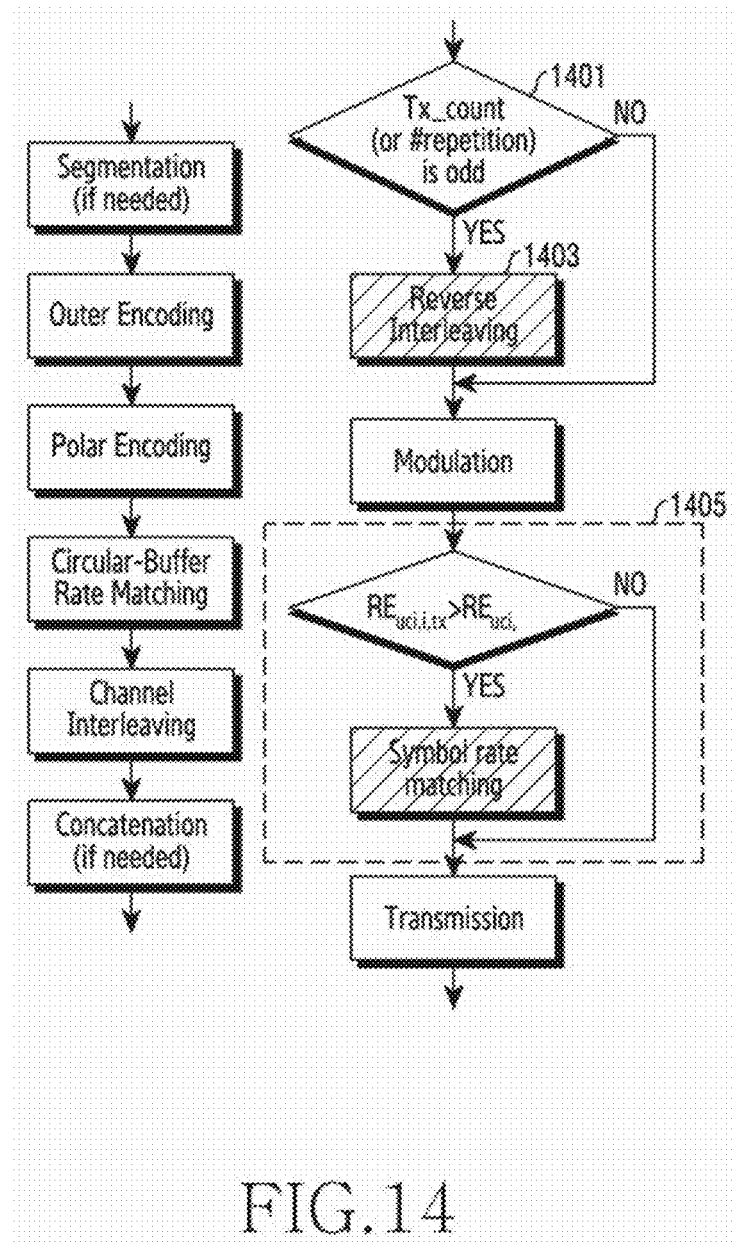
FIG. 14 illustrates an operation flow of a transmitting stage for reliability based interleaving in a communication system according to one or more embodiments of the present disclosure.

FIG. 14 illustrates an operation flow of a transmitting stage for a reliability based interleaving technique in a communication system according to one or more embodiments of the present disclosure. Operations of FIG. 14 are operations of the transmitting stage, and descriptions corresponding to FIG. 2A, FIG. 4, and FIG. 13A are omitted.

In FIG. 14, the transmitting stage may determine whether to perform reverse interleaving before modulation. In step 1401, the transmitting stage may identify whether a current transmission is an odd-numbered transmission. If the current transmission is an odd-numbered transmission, the transmitting stage may perform step 1403. If the current transmission is an even-numbered transmission, the transmitting stage may not perform step 1403. In step 1403, the transmitting stage may perform the reverse interleaving. The transmitting stage may reversely interleave input bit streams. Next, the transmitting stage may modulate the bit streams reversely interleaved. After the modulation, the transmitting stage may determine whether to symbol rate match or not, and perform it if the condition is satisfied. The symbol rate matching corresponds to the symbol rate matching 416 of FIG. 4.

FIG. 14 illustrates that whether to symbol rate match is determined and performed always after the modulation, but this is only the n example and is not construed as limiting the embodiments of the present disclosure. In another embodiment, the transmitting stage may not perform the symbol rate matching 1405.

Figure 15A:
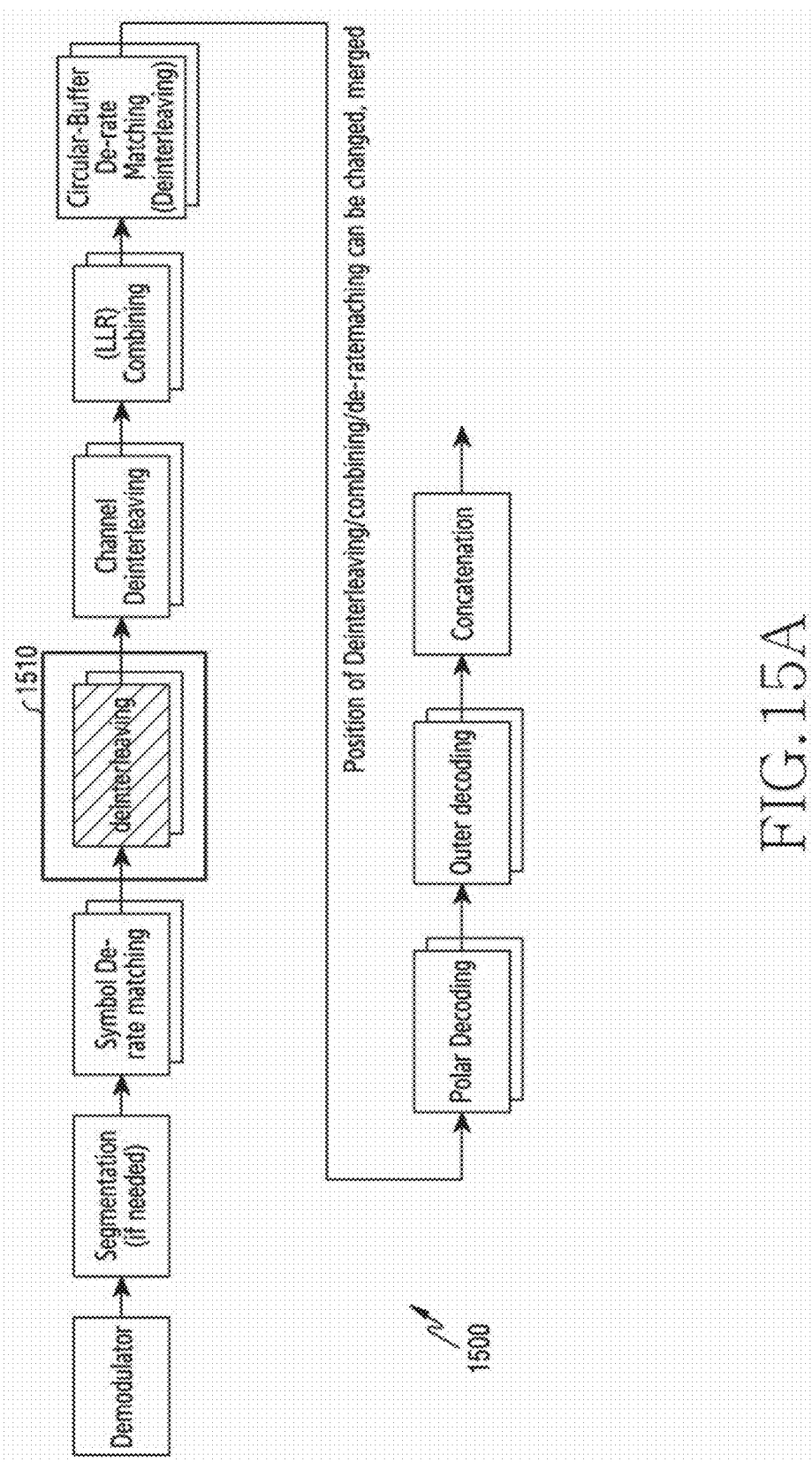
FIG. 15A and FIG. 15B illustrate an operation flow of a receiving stage for reliability based interleaving in a communication system according to one or more embodiments of the present disclosure.
Figure 15B:
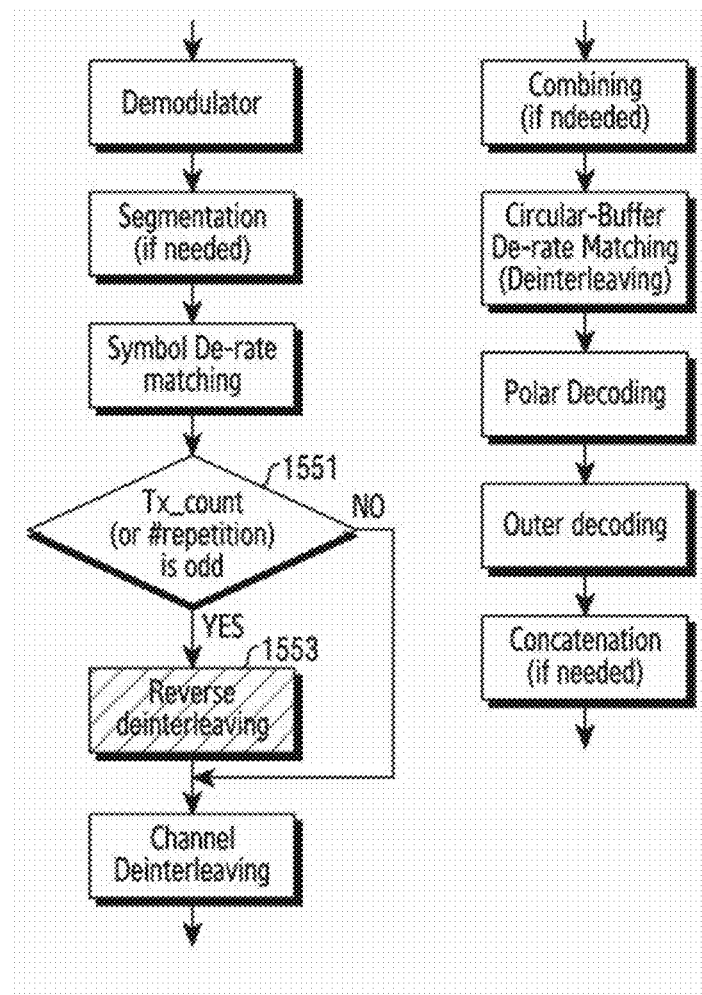

FIG. 15A and FIG. 15B illustrate an operation flow 1500 of a receiving stage for a reliability based interleaving technique in a communication system according to one or more embodiments of the present disclosure.

Referring to FIG. 15A, the receiving stage may demodulate a received signal. If necessary, the receiving stage may output segmentation through segmentation. The receiving stage may perform symbol de-rate matching. This corresponds to the symbol rate matching 1318 of the transmitting stage. The receiving stage may perform deinterleaving 1510. This may correspond to the reverse interleaving 1314 of the transmitting stage. According to an embodiment, the deinterleaving 1510 may not be performed in an odd-numbered transmission. Next, the receiving stage may perform channel deinterleaving, LLR combining, and circular buffer de-rate matching. In so doing, the operations may be changed in order or may be carried out in one operation. The receiving stage may perform decoding. The receiving stage may obtain a transmitted signal through channel decoding (i.e., polar decoding) and outer code decoding. FIG. 15A describes one signal processing example, but the operations of FIG. 15 may be repeated in each transmission. In this case, whether to perform the deinterleaving 1510 may be determined depending on a current transmit count.

Referring to FIG. 15B, the receiving stage may perform the deinterleaving based on a current transmit number (or count, counter). For the deinterleaving corresponding to the reverse interleaving of the transmitting stage, the receiving stage may identify whether the current transmission is an odd-numbered transmission in step 1551. If the current transmission is an odd-numbered transmission, the transmitting stage may perform step 1553. If the current transmission is an even-numbered transmission, the transmitting stage may not perform step 1553. In step 1553, the receiving stage may perform the deinterleaving according to the reverse interleaving.

Since the transmitted bit streams are interleaved in a different order for each transmission, the receiving stage may perform the deinterleaving according to the different order. Next, the receiving stage obtains relatively uniform reliability distribution through the LLR combining. In particular, since an odd-numbered transmission and an even-numbered transmission are paired to perform the reverse interleaving once per pair, uniform reliability distribution of each modulation symbol may be obtained every two transmissions. Hence, a stable decoding result may be derived.

Figure 16A:
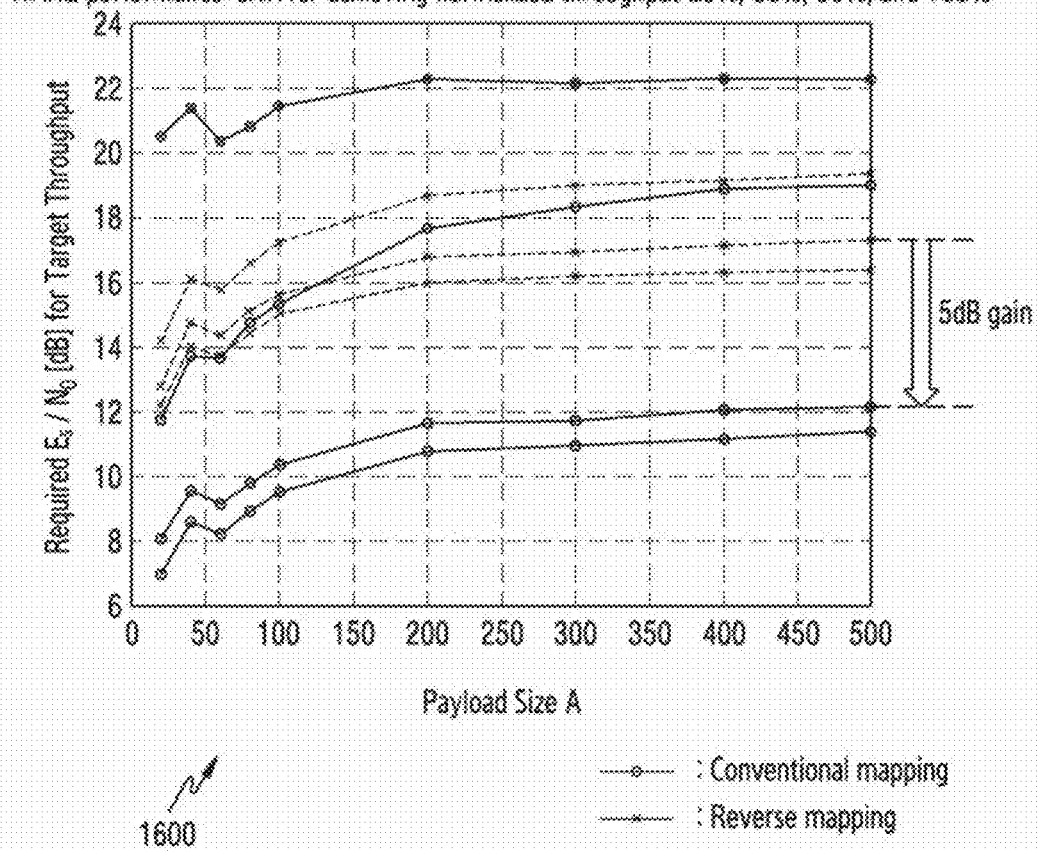
FIG. 16A and FIG. 16B illustrate examples of reliability based interleaving performance in a communication system according to one or more embodiments of the present disclosure.
Figure 16B:
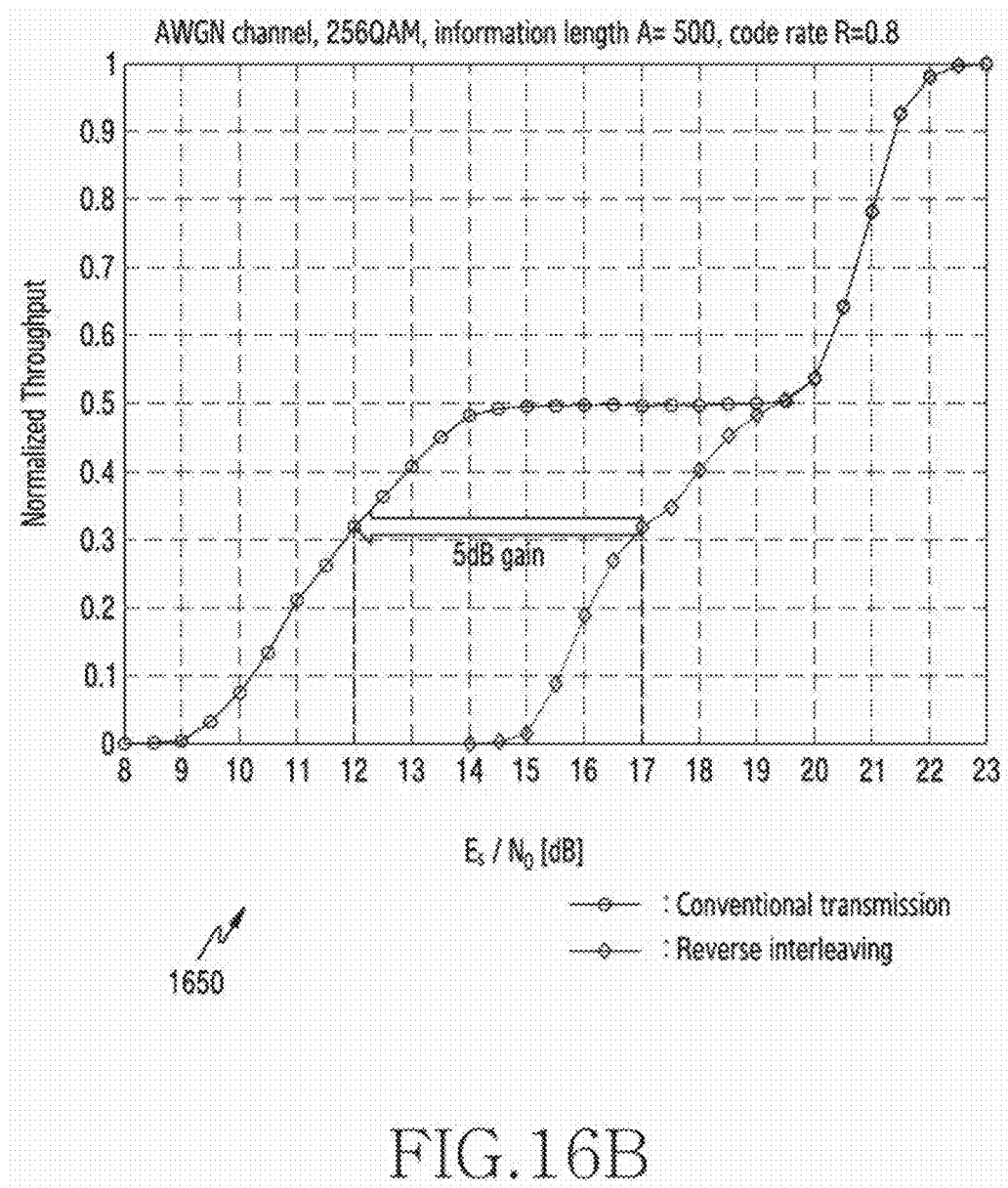

FIG. 16A and FIG. 16B illustrate performance examples of a reliability based interleaving technique in a communication system according to one or more embodiments of the present disclosure.

FIG. 16A shows the performance based on using the reverse interleaving, according to the repeat count and the transmit count. Referring to FIG. 16A, a horizontal axis indicates a payload size A, and a vertical axis indicates a signal to noise ratio (SNR) required to obtain a specific throughput. SNRs for obtaining throughputs of 100%, 50%, 33%, and 25% respectively are shown in order on the graph. The higher a position along the vertical axis, the higher gain according to the channel coding. Performance improvement is identified if the technique suggested in the present disclosure (i.e., the reverse interleaving is applied in an even-numbered transmission, as shown in FIG. 13A). This is because the SNR may be further reduced through the reverse interleaving. For example, performance gain of about 5 dB may be obtained to achieve a normalized throughput of 33% compared to the conventional method if the payload is 500.

FIG. 16B shows the normalized throughput if the payload is 500. Besides, an additive white Gaussian noise (AWGN) channel, the 256 QAM, and the code rate of 0.8 are assumed. The performance gain of about 5 dB may be obtained to achieve the normalized throughput of 33% based on this graph.

FIG. 8 through FIG. 16B have described the solution for uniformly distributing the reliability at the receiving stage, by performing the reverse mapping according to the transmit count or the repeat count, in the retransmission or the repeated transmission. As the reverse mapping solution, the method of selecting the demuxing or using the reverse interleaving according to the transmit count or the repeat count has been proposed. Hereinafter, even if it is not the retransmission or the repeated transmission, a method for improving performance if transmission is required at a lower code rate than the parent code and repetition is required in the rate matching is proposed.

4. Interleaving Scheme Based on Inner Partitioning

Figure 17:
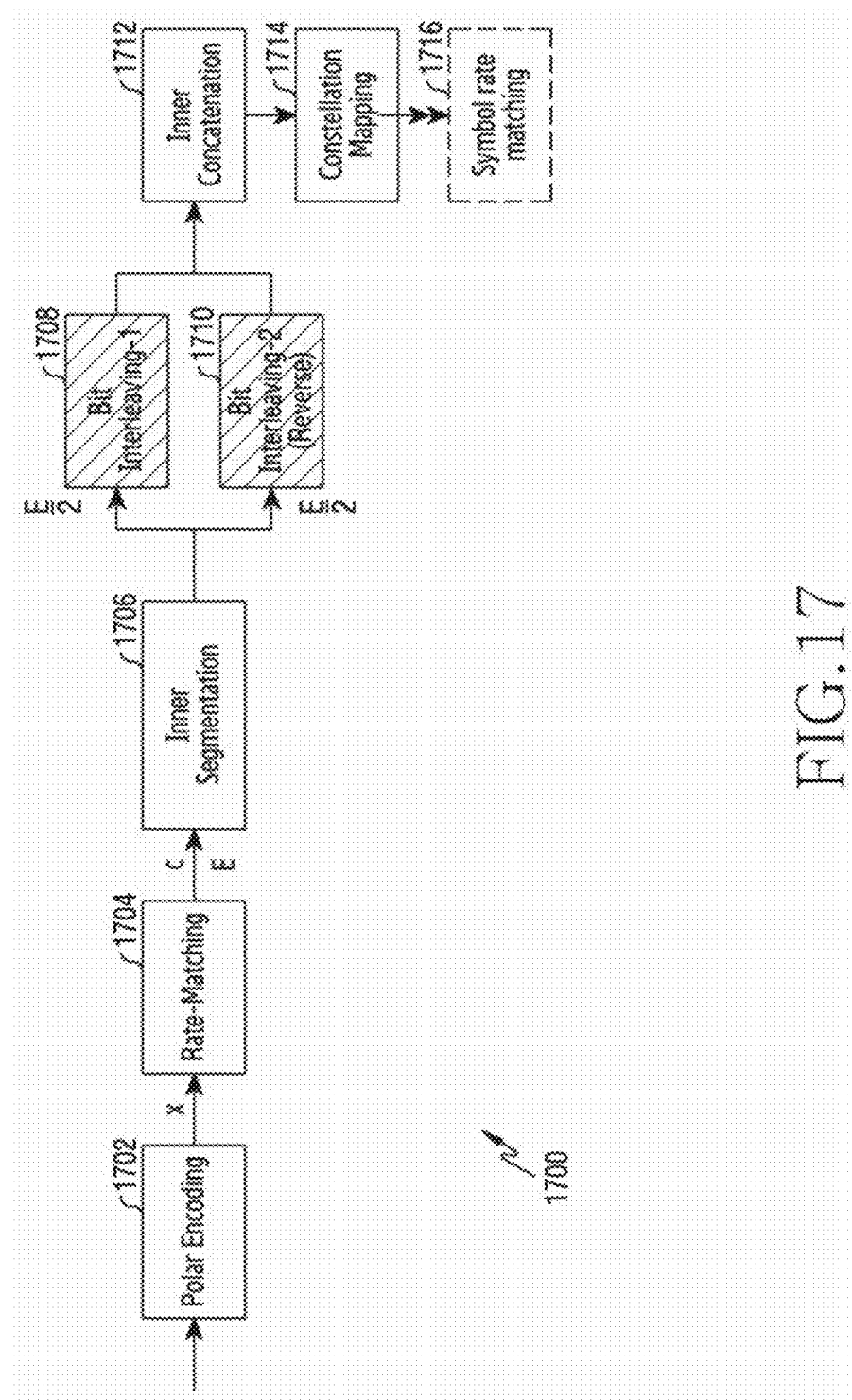
FIG. 17 illustrates an example of inner segmentation based interleaving in a communication system according to one or more embodiments of the present disclosure.

FIG. 17 illustrates an example of an inner segmentation based interleaving technique in a communication system according to one or more embodiments of the present disclosure. The inner segmentation based interleaving indicates a technique of additionally performing the reverse interleaving on only a part of a bit stream. By designing uniform channel reliability, the reverse interleaving may be used to improve the decoding performance of the receiving stage.

Referring to FIG. 17, polar encoding 1702 and rate matching 1704 of FIG. 17 correspond to the polar encoding 806 of FIG. 8 and the rate matching 808 of FIG. 8, and redundant descriptions are omitted. In an inner segmentation 1706 block, the transmitting stage receives an output bit stream $c=\{c_0, c_1, \ldots, c_{E-1}\}$ of the rate matching 1704 and outputs two bit streams $c^1=\{c_0^1, c_1^1, \ldots, c_{E/2-1}^1\}$ and $c^2=\{c_0^2, c_1^2, \ldots, c_{E/2-1}^2\}$. According to another embodiment, if the length E of the output bit stream of the rate matching is not an even number, the transmitting stage may use E'=E+1 instead of E, and input '0' into $c_{E/2-1}^1$ or $c_{E/2-1}^2$. The two bit streams outputted from the inner segmentation 1706 are inputted to a bit interleaving-1 1708 and a bit interleaving-2 1710 and are subject to different interleaving.

According to an embodiment, in the bit interleaving-1 (1708), the transmitting stage receives the first bit stream $c^1$ and outputs $d^1=\{d_0^1, d_1^1, \ldots, d_{E/2-1}^1\}$ by applying the channel interleaving 310 of FIG. 13. In bit interleaving-2 1710, the transmitting stage receives the second bit stream $c^2$ and outputs $d^2=\{d_0^2, d_1^2, \ldots, d_{E/2-1}^2\}$ through the interleaving by applying both the channel interleaving 1310 and the reverse interleaving 1314 of FIG. 13. In inner concatenation 1712, the transmitting stage receives and concatenates the bit streams outputted from the bit interleaving-1 and the bit-interleaving-2. Next, the transmitting stage may perform constellation mapping 1714, and symbol rate matching 1716.

The method suggested in FIG. 17 may be applied if the code rate is lower than the parent code rate and repetition is required. The repeated bits may be inputted to the bit-interleaving-2 1710. Hence, if repetition occurs for the same bit and is transmitted twice or more, at least one bit is inputted to the bit-interleaving-1 and at least another bit is inputted to the bit interleaving-2. At least some of the repeated bits are mapped to bits having different reliability constituting the modulation symbol. Thus, by differently configuring the bit interleaving between the repeated bits, the LLR distribution is configured to be as uniform as possible after the soft combining at the receiving stage.

FIG. 17 illustrates that the inner segmentation is always performed, but the present disclosure is not limited thereto. As described above, the reverse interleaving performed after the inner segmentation, which may be applied only if the code rate is lower than the parent code rate and the repetition is required, may achieve the performance gain only in the repetition. The transmitting stage may perform the reverse interleaving only if this condition is satisfied.

Figure 18A:
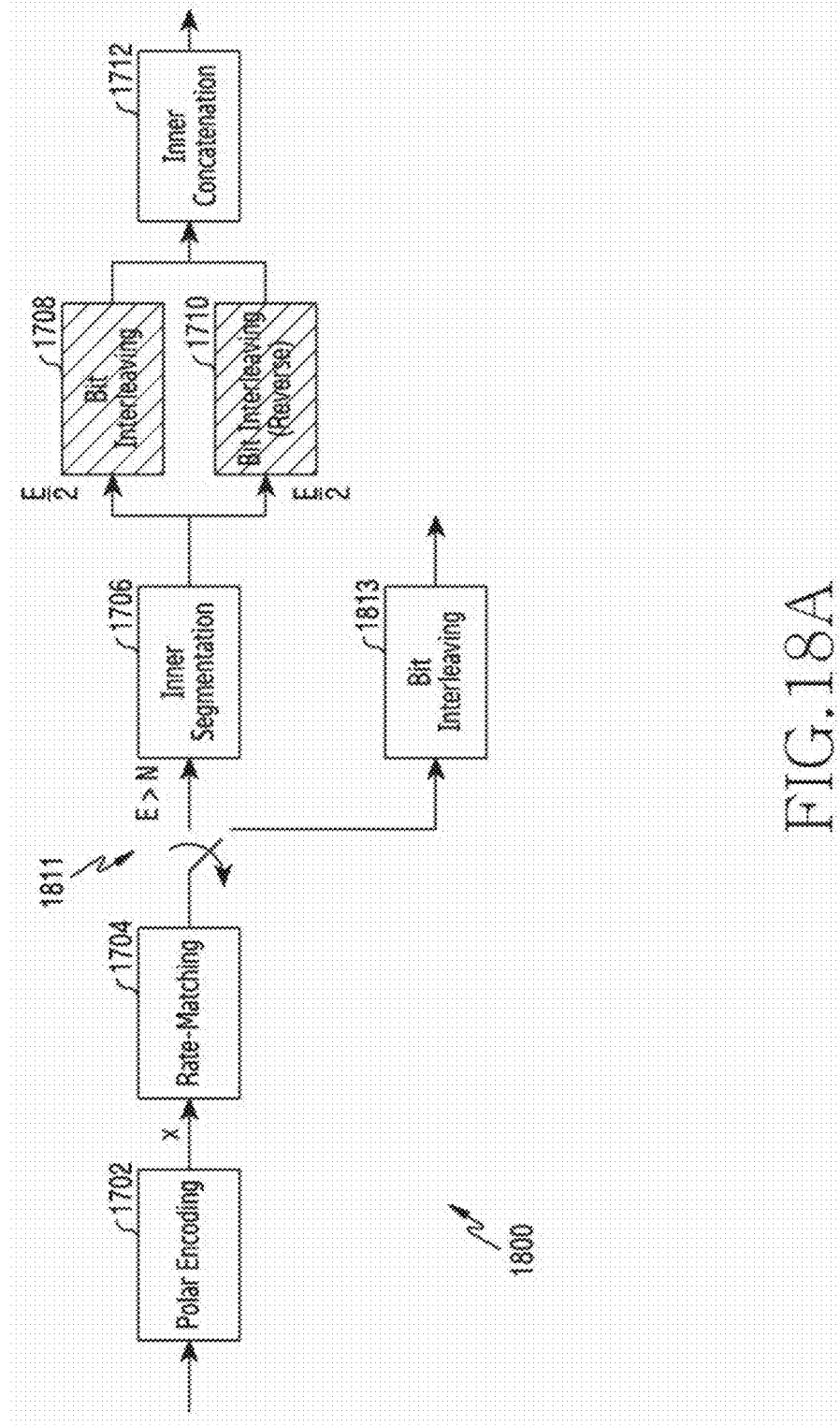
FIG. 18A and FIG. 18B illustrate an example of a functional configuration of a transmitting stage of inner segmentation based interleaving based on a symbol size in a communication system according to one or more embodiments of the present disclosure.
Figure 18B:
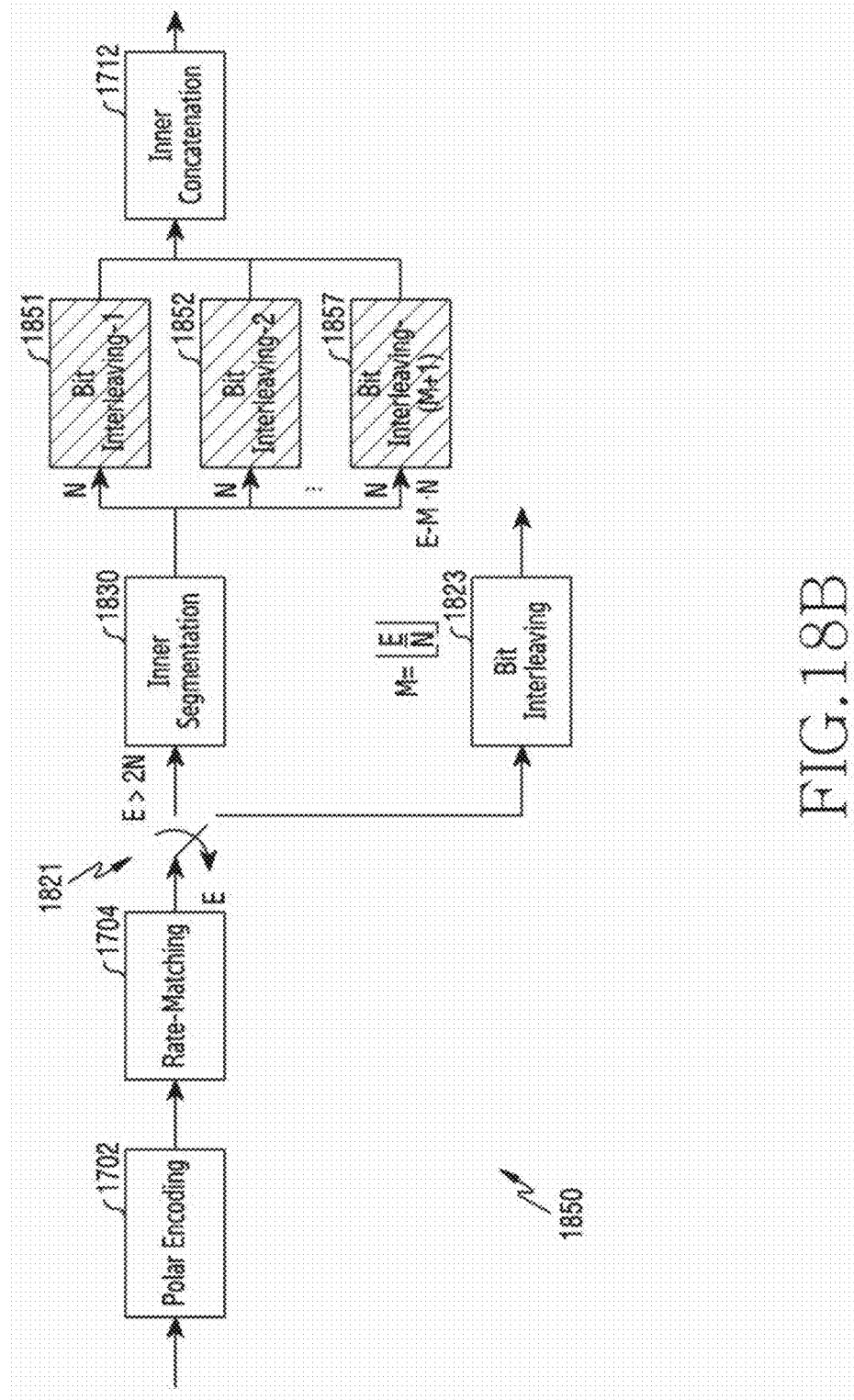

FIG. 18A and FIG. 18B illustrate an example of a functional configuration of a transmitting stage of an inner segmentation based interleaving technique based on a symbol size in a communication system according to one or more embodiments of the present disclosure.

According to an embodiment, referring to a flowchart 1800 of FIG. 18A, the transmitting stage may apply only if the bit size E after the rate matching is greater than the parent code size N. The transmitting stage may determine whether the rate matching size E is greater than the parent code size N (1811). If the rate matching size E is greater than the parent code size N, the transmitting stage may perform the inner segmentation according to FIG. 17. Next, the transmitting stage may perform channel interleaving (e.g., triangular interleaving) on bits of each group, and further reversely interleave bits of some specific groups. The polar encoding 1702, the rate matching 1704, the inner segmentation 1706, the bit interleaving-1 1708, the bit interleaving-2 1710, the inner concatenation 1712, the constellation mapping 1714, and the symbol rate matching 1716 of FIG. 17 may be identically applied. If the rate matching size E is not greater than the parent code size N, the transmitting stage may perform channel interleaving 1813 as in the related art and then perform subsequent operations (e.g., the constellation mapping 1714, the symbol rate matching 1716).

According to another embodiment, referring to a flowchart 1850 of FIG. 18B, the transmitting stage may apply only if the bit size E after the rate matching is greater than the parent code size 2N. The transmitting stage may determine whether the rate matching size E is greater than the parent code size 2N (1821). If the rate matching size E is greater than the parent code size 2N, the transmitting stage may perform the inner segmentation and further interleave bits of some group. Specifically, the transmitting stage may perform inner segmentation 1830. In this case, the inner segmentation 1830 may provide three or more segments rather than two segments. For example, the transmitting stage may provide M-ary segments. In this case, a bit stream corresponding to each segment may have the bit stream of the size N, but a bit stream corresponding to the last segment may have the bit stream of the size EM·N. Herein, M is the total number of the segments, and may be $$\left\lceil \frac{E}{N} \right\rceil.$$

Bit interleaving corresponding to each segment may be performed. The transmitting stage may perform bit interleaving-1 1851 on a bit stream of a first segment. The transmitting stage may perform bit interleaving-2 1852 on a bit stream of a second segment. The transmitting stage may perform bit interleaving-3 1857 on a bit stream of a third segment. In this case, the bit interleavings may be distributed to evenly interleave the bits. For example, with bit interleavings for N-ary groups, bit interleaving-i may be bit interleaving shifted by $$\left\lfloor \frac{E \times i}{N} \right\rfloor.$$

Besides, the polar encoding 1702, the rate matching 1704, the inner segmentation 1706, the bit interleaving-1 1708, the bit interleaving-2 1710, the inner concatenation 1712, the constellation mapping 1714, and the symbol rate matching 1716 of FIG. 17 may be applied in the same manner. If the rate matching size E is not greater than the parent code size 2N, the transmitting stage may perform channel interleaving 1823 as in the related art and then perform subsequent operations (e.g., the constellation mapping 1714, the symbol rate matching 1716).

Although not depicted in FIG. 18A through FIG. 18B, in addition, the transmitting stage may perform the segmentation and the reverse interleaving, only if using the modulation scheme over the 16 QAM or more (i.e., rather than the BPSK/QPSK, the 16 QAM, the 64 QAM, the 256 QAM, the 1024 QAM, etc.).

Figure 19A:
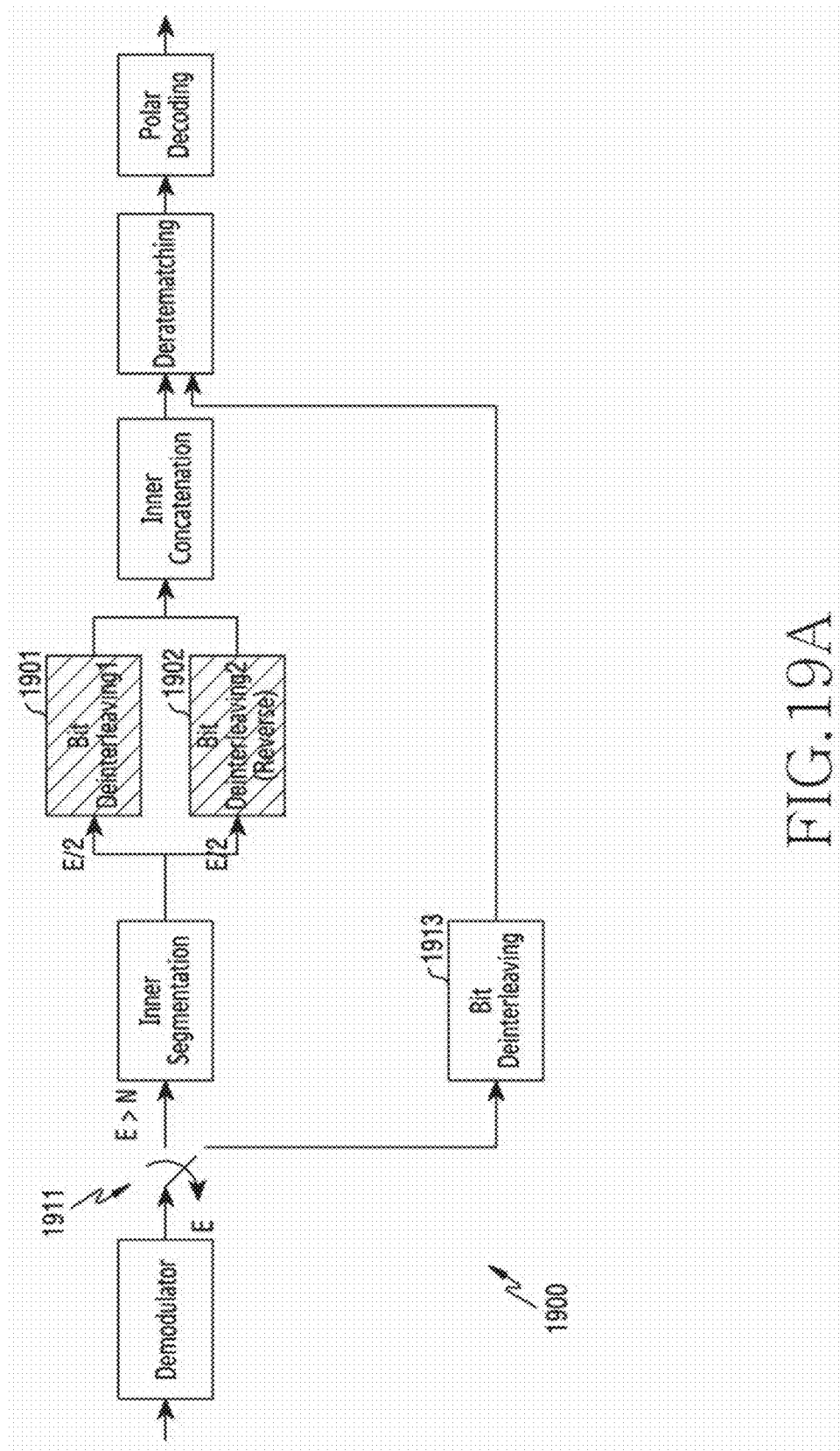
FIG. 19A and FIG. 19B illustrate an example of a functional configuration of a receiving stage of inner segmentation based interleaving based on a symbol size in a communication system according to one or more embodiments of the present disclosure.
Figure 19B:
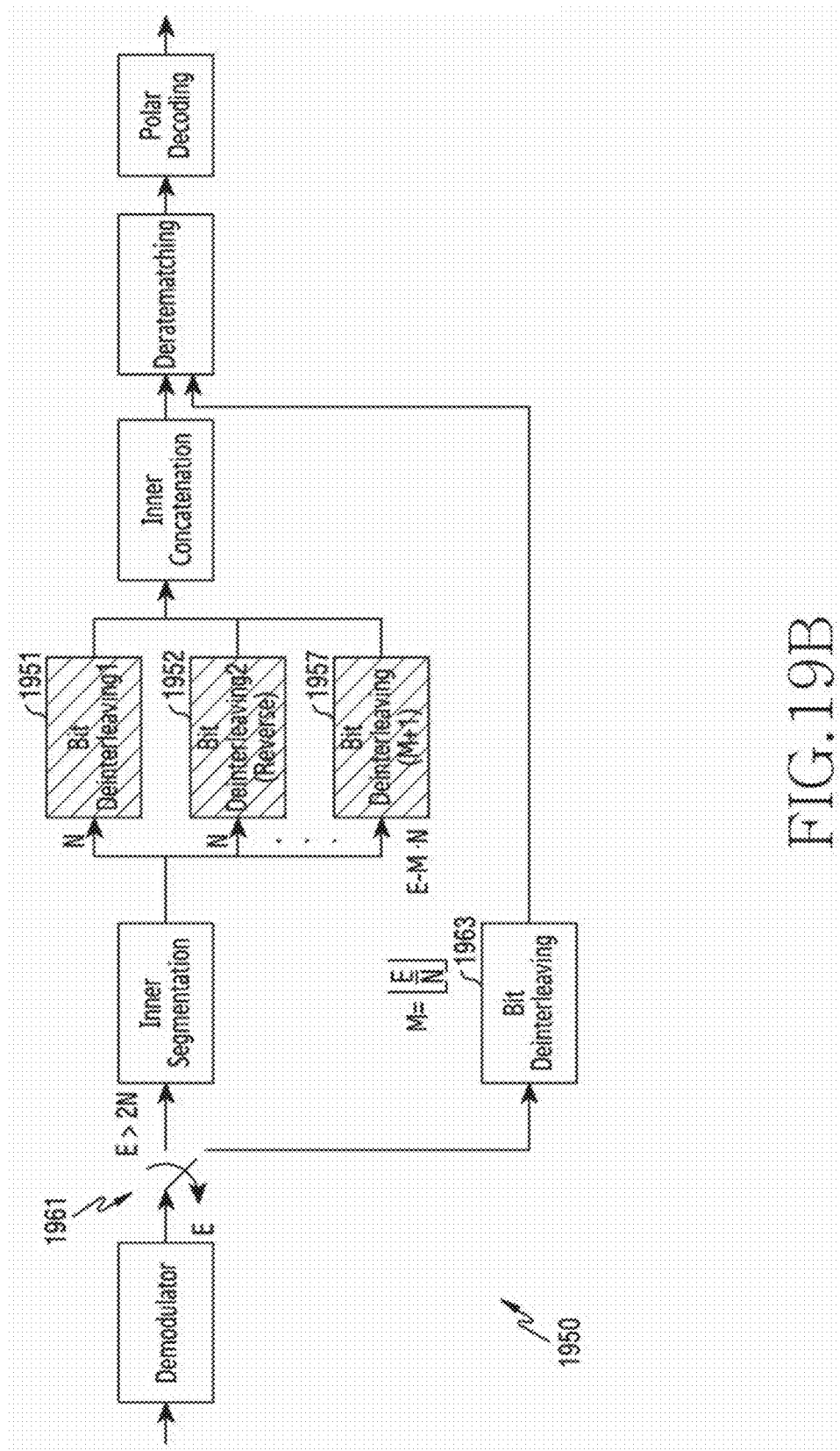

FIG. 19A and FIG. 19B illustrate an example of a functional configuration of a receiving stage of an inner segmentation based interleaving technique according to a symbol size in a communication system according to one or more embodiments of the present disclosure.

A flowchart 1900 of FIG. 19A corresponds to the flowchart 1800 of FIG. 18A. The receiving stage may determine whether the rate matching size E is greater than the mother code size N (1911). If the rate matching size E is greater than the parent code size N, the receiving stage may perform inner segmentation. The receiving stage may perform bit deinterleaving-1 1901 on bits of some group, and perform bit deinterleaving-2 1902 on bits of other some group. That is, the receiving stage may deinterleave bits of some group, and reversely deinterleave bits of other some group. If the rate matching size E is not greater than the parent code size N, the receiving stage may perform bit deinterleaving 1913 (i.e., channel deinterleaving) as in the related art and then perform subsequent operations (e.g., derate matching and polar decoding).

A flowchart 1950 of FIG. 19B corresponds to the flowchart 1850 of FIG. 18B. The receiving stage may determine whether the rate matching size E is greater than the parent code size 2N (1961). If the rate matching size E is greater than the parent code size 2N, the receiving stage may perform the inner segmentation. According to each segment, the bit streams are grouped. The receiving stage may perform bit deinterleaving-1 1951 on bits of a first group, and perform bit deinterleaving-2 1952 on bits of a second group. In the same manner, the receiving stage may perform bit deinterleaving-2 1952 on bits of an n-th group. Each group corresponds to an N bit stream, but the last group may have a bit stream of size EM·N. Herein, M is the total number of the segments, and may be $$\left\lfloor \frac{E}{N} \right\rfloor.$$

The bit deinterleaving applied to each group may be configured to evenly interleave the bit deinterleaving performed on the total N-ary groups, as in the scheme applied to the transmitting stage. For example, bit deinterleaving-i may be bit interleaving shifted by $$\left\lfloor \frac{E \times i}{N} \right\rfloor.$$

If the rate matching size E is not greater than the parent code size 2N, the receiving stage may perform bit deinterleaving 1963 (i.e., channel deinterleaving) as in the related art and then perform subsequent operations (e.g., derate matching and polar decoding).

Figure 20A:
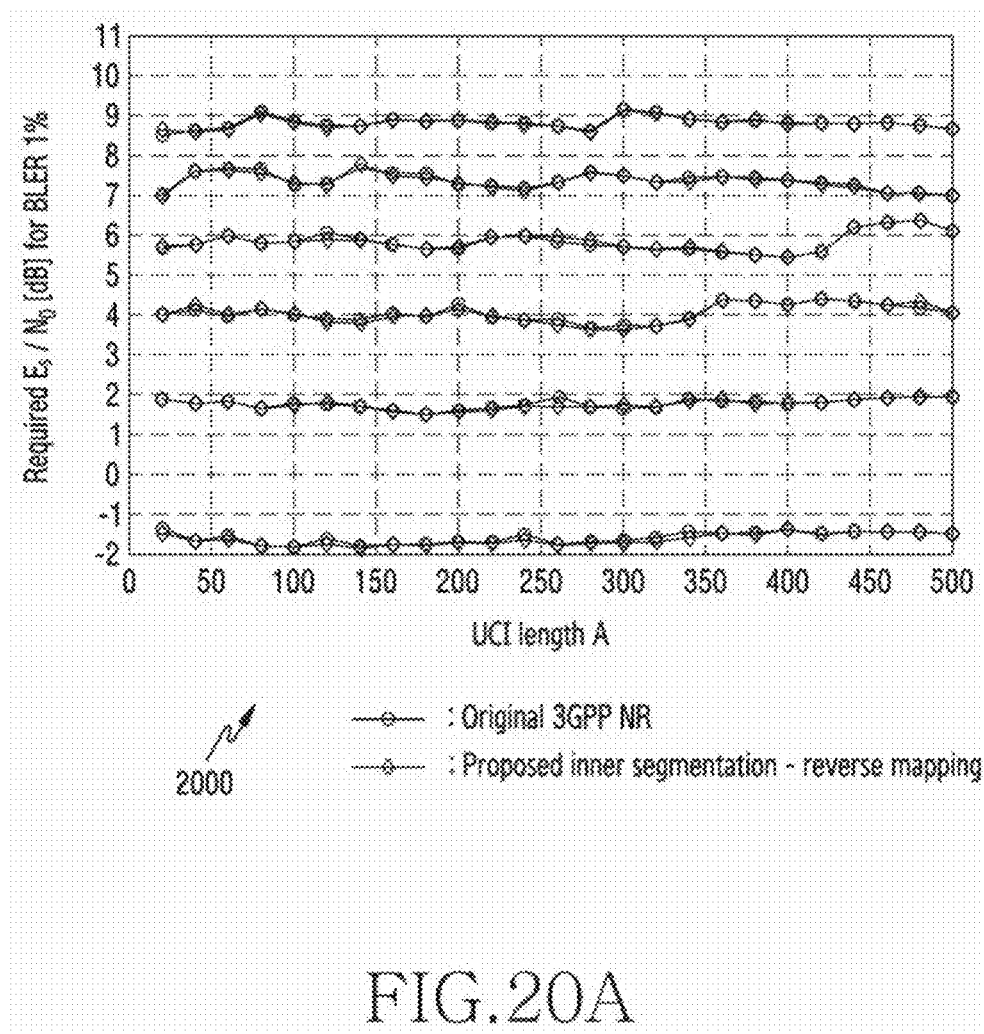
FIG. 20A and FIG. 20B illustrate an example of inner segmentation based interleaving performance in a communication system according to one or more embodiments of the present disclosure.
Figure 20B:
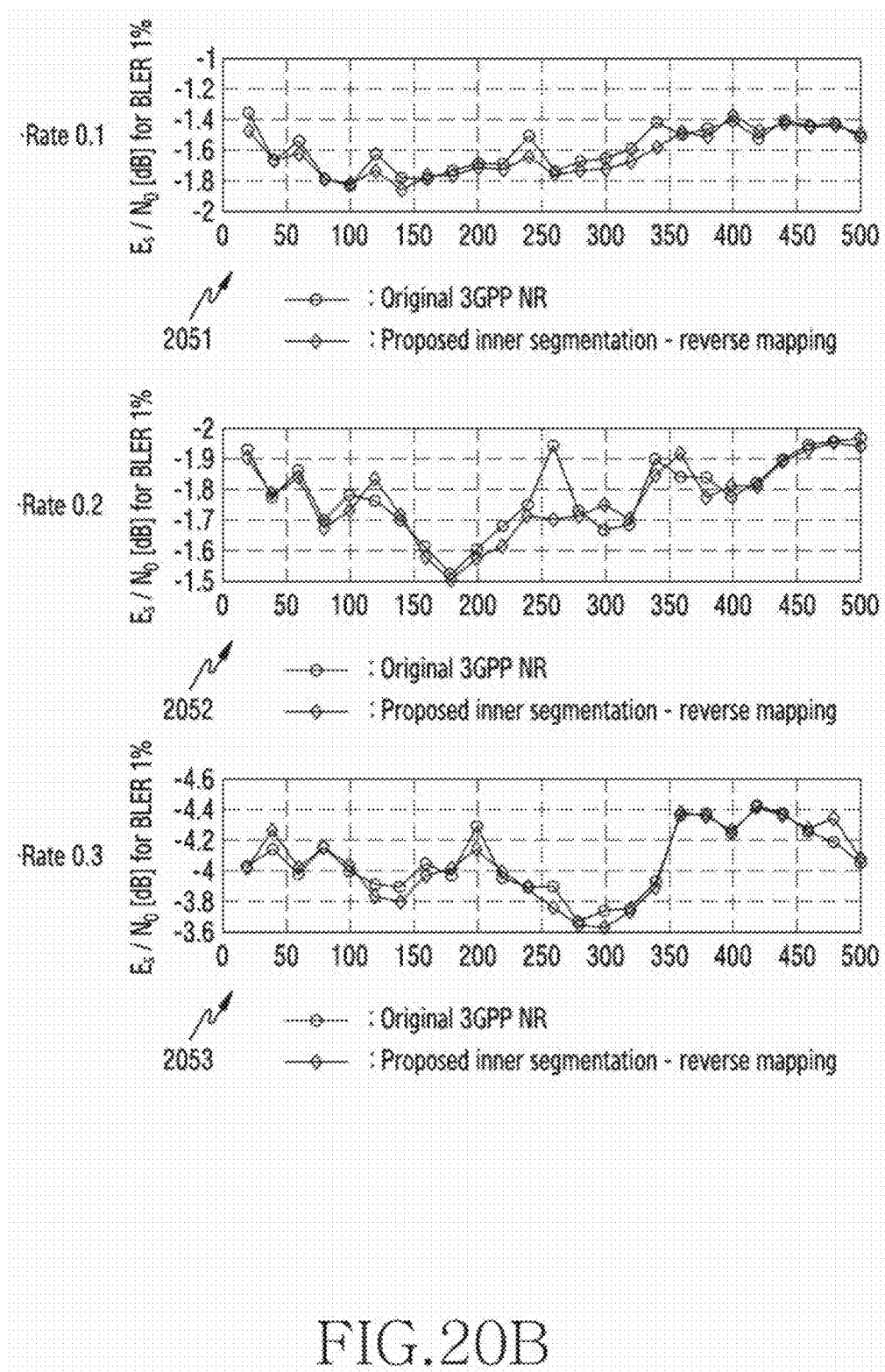

FIG. 20A and FIG. 20B illustrate an example of inner segmentation based interleaving technique performance in a communication system according to one or more embodiments of the present disclosure. FIG. 20A shows a relation between a UCI length (i.e., the payload size A) and an SNR size required for block error rate (BLER) 1%. FIG. 20A shows the performance compared between the reverse interleaving according to the existing 3GPP NR standard and the inner segmentation. FIG. 20B shows the performance comparison based on the rate (in order of 0.1, 0.2, and 0.3). In a high SNR region, channel gain improvement is identified. In addition, the performance based on the length is relatively stable compared to the existing 3GPP NR standard.

5. Inner Segmentation Based Demultiplexing Technique

After the inner segmentation, a method for evenly distributing channel reliability by utilizing the DEMUX instead of the interleaving as in the method using the interleaving, may be also considered. The receiving stage may increase decoding performance, by reversely applying the DEMUX to a portion in which the bit stream is segmented and repeated even in a single transmission, as well as retransmission, to stabilize the reliability such as LLR.

Figure 21:
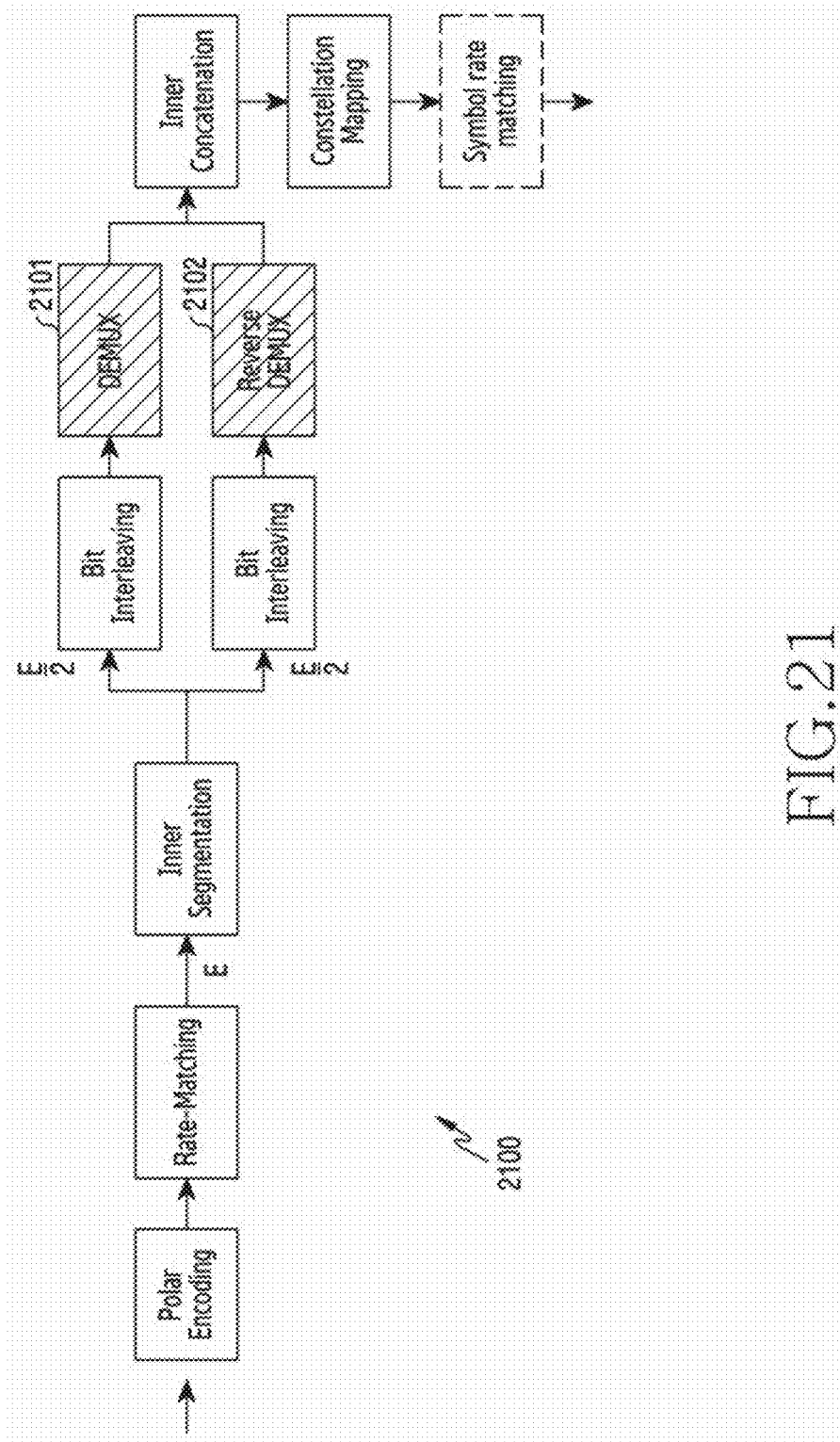
FIG. 21 illustrates an example of inner segmentation based demultiplexing in a communication system according to one or more embodiments of the present disclosure.

FIG. 21 illustrates an example of an inner segmentation based demultiplexing technique in a communication system according to one or more embodiments of the present disclosure. Referring to a flowchart 2100, like the inner segmentation based interleaving, the transmitting stage may output two bit streams, by performing the inner segmentation. Specifically, the transmitting stage may receive a rate matching output bit stream $c=\{c_0, c_1, \ldots, c_{E-1}\}$ and output two bit streams $c^1=\{c_0^1, c_1^1, \ldots, c_{E/2-1}^1\}$ and $c^2=\{c_0^2, c_1^2, \ldots, c_{E/2-1}^2\}$ in an inter segmentation block. According to an embodiment, if the length E of the rate matching output bit stream is not an even number, the transmitting stage may use E'=E+1 instead of E, and input '0' into $c_{E/2-1}^1$ or $c_{E/2-1}^2$. The same bit interleaving may be applied to the two bit streams outputted from the inner segmentation. Herein, for example, the bit interleaving may be the channel interleaving (e.g., triangular interleaving). Next, the transmitting stage may apply a first DEMUX 2101 to the first bit stream. The receiving stage may apply a second DEMUX 2102 to the second bit stream. The second DEMUX may be a re-DEMUX which reverses the distribution of the first DEMUX. As an example, the re-DEMUX as shown in FIG. 9A through FIG. 9C may be used. Next, the transmitting stage may perform inner concatenation, constellation mapping, and symbol rate matching.

FIG. 21 illustrates that the inner segmentation is always performed, but the present disclosure is not limited thereto. As described above, the re-DEMUX performed after the inner segmentation division, which may be applied if the code rate is lower than the parent code rate and repetition is required, may have the performance gain only if repetition occurs. The transmitting stage may perform the reverse interleaving only if this condition is satisfied.

Figure 22A:
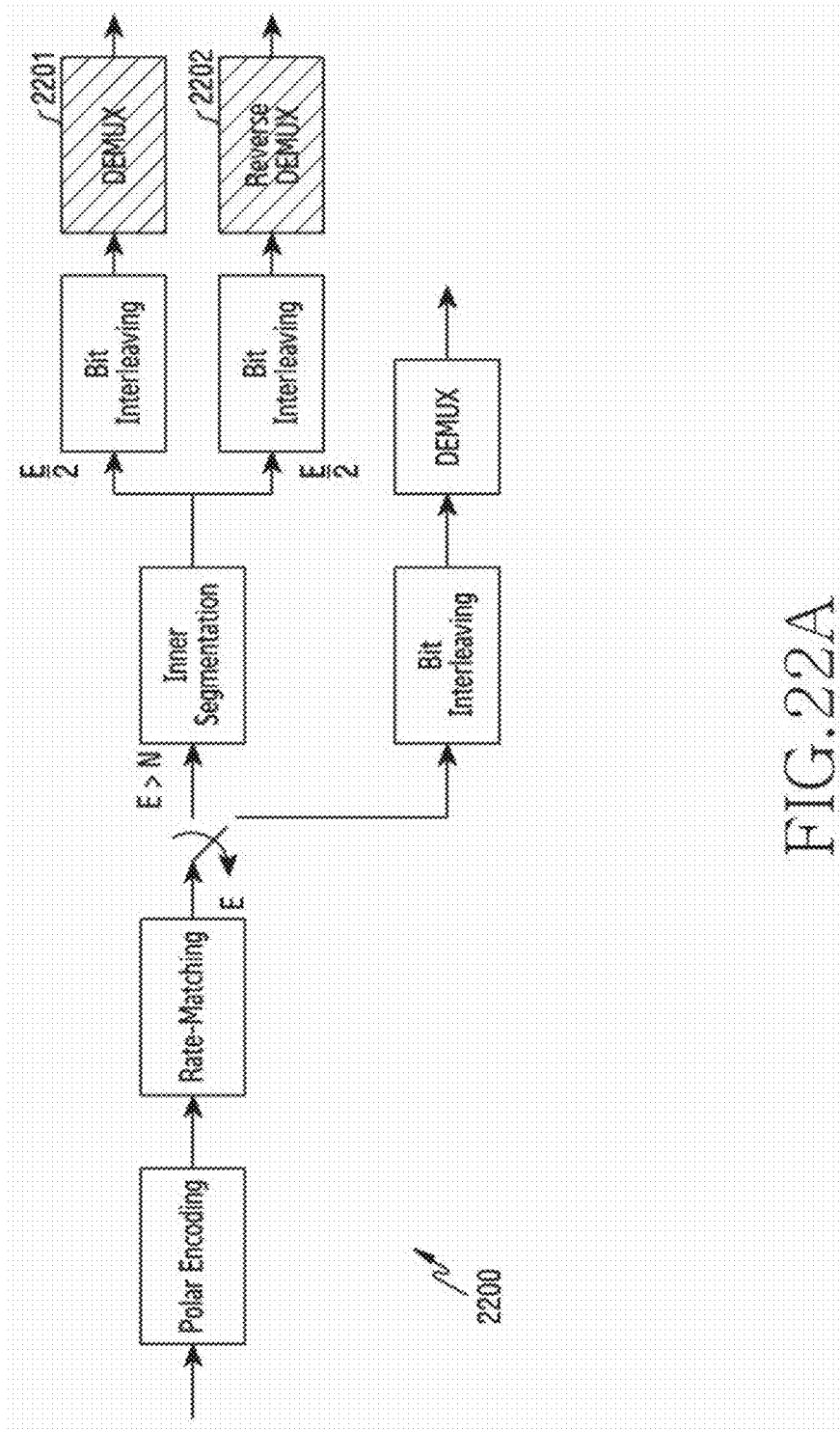
FIG. 22A and FIG. 22B illustrate an example of a functional configuration of a transmitting stage of inner segmentation based interleaving based on a symbol size in a communication system according to one or more embodiments of the present disclosure.
Figure 22B:
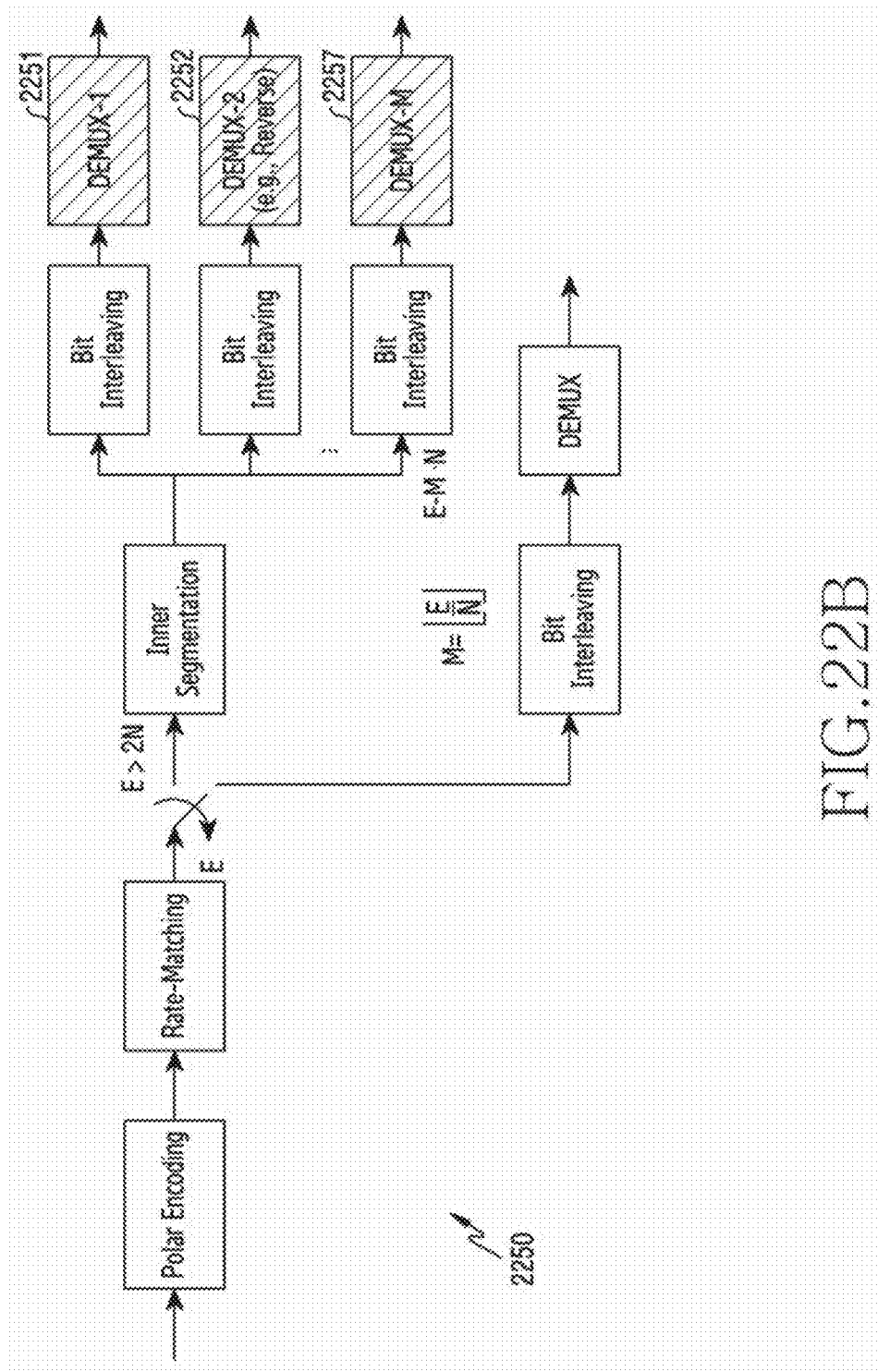

FIG. 22A and FIG. 22B illustrate an example of a functional configuration of a transmitting stage of an inner segmentation based interleaving technique based on a symbol size in a communication system according to one or more embodiments of the present disclosure.

According to an embodiment, referring to a flowchart 2200 of FIG. 22A, the transmitting stage may apply only if the bit size E after the rate matching is greater than the parent code size N. The transmitting stage may determine whether the rate matching size E is greater than the parent code size N. If the rate matching size E is greater than the parent code size N, the transmitting stage may perform the inner segmentation according to FIG. 21. Next, the transmitting stage may perform DEMUX on bits of some group and perform re-DEMUX on bits of some other group. The polar encoding, the rate matching, the inner segmentation, the bit interleaving, the inner concatenation, the constellation mapping, and the symbol rate matching of FIG. 20 may be identically applied. If the rate matching size E is not greater than the parent code size N, the transmitting stage may apply the interleaving and the same DEMUX to the entire bit stream E as in the related art.

According to another embodiment, referring to a flowchart 2250 of FIG. 22B, the transmitting stage may apply only if the bit size E after the rate matching is greater than the parent code size 2N. The transmitting stage may determine whether the rate matching size E is greater than the parent code size 2N (1821). If the rate matching size E is greater than the parent code size 2N, the transmitting stage may perform the inner segmentation. The transmitting stage may inner-segment the entire bit stream E into M-ary groups. In this case, a bit stream corresponding to each segment may have a N-sized bit stream, but a bit stream corresponding to the last segment may have a EM·N-sized bit stream. Herein, M is the total number of the segments, and may be $$\left\lfloor \frac{E}{N} \right\rfloor.$$

The transmitting stage may perform the bit interleaving, on the bit stream of each segment. According to an embodiment, the corresponding bit interleaving may be equally applied between the segmented bit streams. The transmitting stage may identify the DEMUX corresponding to each segment, after the bit interleaving. The transmitting stage may apply DEMUX(i), to a bit stream of an i-th segment. i may be an integer of 1 or more and N or less. DEMUX(1), DEMUX(2), . . . , DEMUX(k), . . . , DEMUX(N) may be designed to have uniform reliability distribution with respect to modulation symbols. According to an embodiment, the DEMUX management technique may be designed like the cyclic shift of FIG. 10. If the rate matching size E is not greater than the parent code size 2N, the transmitting stage may apply the interleaving and the same DEMUX to the entire bit stream E as in the related art.

Although not depicted in FIG. 21A through FIG. 21B, additionally, the transmitting stage may perform the segmentation and the reverse interleaving, only if using the modulation scheme over the 16 QAM (i.e., rather than the BPSK/QPSK, the 16 QAM, the 64 QAM, the 256 QAM, the 1024 QAM, etc.).

Figure 23:
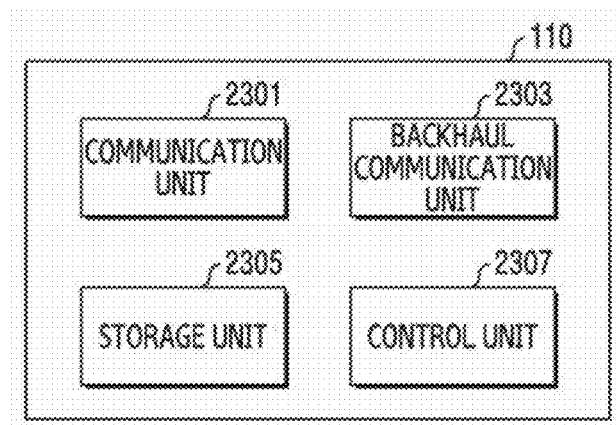
FIG. 23 illustrates a configuration of a base station according to one or more embodiments of the present disclosure.

FIG. 23 illustrates a functional configuration of a base station in a wireless communication system according to one or more embodiments of the present disclosure. A term such as ' . . . unit' or '~er' used hereafter indicates a unit for processing at least one function or operation, and may be implemented using hardware, software, or a combination of hardware and software.

Referring to FIG. 23, the base station includes a communication unit 2301, a backhaul communication unit 2303, a storage unit 2305, and a control unit 2307.

The communication unit 2301 performs functions for transmitting and receiving signals over a radio channel. For example, the communication unit 2301 performs a conversion function between a baseband signal and a bit stream according to a physical layer standard of the system. For example, in data transmission, the communication unit 2301 generates complex symbols by encoding and modulating a transmit bit stream. In addition, in data reception, the communication unit 2301 restores a received bit stream by demodulating and decoding a baseband signal. According to one or more embodiments, the communication unit 2301 may encode a signal using the polar code, or decode an encoded signal using the polar code. The communication unit 2301 may be configured to perform at least one of the operations of the transmitting stage and the operations of the receiving stage described in FIG. 1 through FIG. 22.

The communication unit 2301 upconverts a baseband signal into a radio frequency (RF) band signal and then transmits it via an antenna, and down-converts an RF band signal received via the antenna into a baseband signal. For doing so, the communication unit 2301 may include a transmit filter, a receive filter, an amplifier, a mixer, an oscillator, a digital to analog convertor (DAC), an analog to digital convertor (ADC), and the like. In addition, the communication unit 2301 may include a plurality of transmit and receive paths. Further, the communication unit 2301 may include at least one antenna array including a plurality of antenna elements. In terms of hardware, the communication unit 2301 may include a digital unit and an analog unit, and the analog unit may include a plurality of sub-units according to an operating power, an operating frequency and so on. According to an embodiment, the communication unit 2301 may include a unit for forming a beam, that is, a beamforming unit. For example, the communication unit 2301 may include an MMU for beamforming.

The communication unit 2301 may transmit and receive signals. For doing so, the communication unit 2301 may include at least one transceiver. For example, the communication unit 2301 may transmit a synchronization signal, a reference signal, system information, a message, control information, or data. Also, the communication unit 2301 may perform beamforming. The communication unit 2301 may apply a beamforming weight to a signal to transmit or receive, to give directivity to the signal, according to setting of the control unit 2307. According to an embodiment, the communication unit 2301 may generate a baseband signal according to a scheduling result and a transmit power calculation result. In addition, an RF unit in the communication unit 2301 may transmit the generated signal via the antenna.

The communication unit 2301 transmits and receives the signals as stated above. Hence, whole or part of the communication unit 2301 may be referred to as 'a transmitter', 'a receiver', or 'a transceiver'. Also, in the following explanation, the transmission and the reception over the radio channel are used as the meaning which embraces the above-stated processing of the communication unit 2301.

The backhaul communication unit 2303 provides an interface for communicating with other nodes in a network. That is, the backhaul communication unit 2303 converts a bit sting transmitted from the base station to other node, for example, other access node, another base station, an upper node, or a core network, into a physical signal, and converts a physical signal received from other node into a bit stream.

The storage unit 2305 stores a basic program for operating the base station, an application program, and data such as setting information. The storage unit 2305 may include a memory. The storage unit 2305 may include a volatile memory, a non-volatile memory, or a combination of a volatile memory and a non-volatile memory. The storage unit 2305 provides the stored data at a request of the control unit 2307.

The control unit 2307 controls general operations of the base station. For example, the control unit 2307 transmits and receives signals through the communication unit 2301 or the backhaul communication unit 2303. Also, the control unit 2307 records and reads data in and from the storage unit 2305. The control unit 2307 may execute functions of a protocol stack required by the communication standard. For doing so, the control unit 2307 may include at least one processor. According to one or more embodiments, the control unit 2307 may control the base station to carry out operations according to the one or more embodiments described above.

The configuration of the base station 110 shown in FIG. 23 is merely the example of the base station, and the example of the base station for carrying out one or more embodiments of the present disclosure is not limited from the configuration shown in FIG. 23. That is, some configuration may be added, deleted, or changed, according to one or more embodiments.

FIG. 23 describes the base station as one entity, but the present disclosure is not limited thereto as mentioned above. The base station according to one or more embodiments of the present disclosure may be implemented to build an access network having distributed deployment as well as integrated deployment (e.g., an eNB of LTE). As shown to explain the embodiments of FIG. 2A through FIG. 7, the base station may be divided into a central unit (CU) and a digital unit (DU), the CU may be implemented to perform upper layers (e.g., packet data convergence protocol (PDCP), RRC) and the DU may be implemented to perform lower layers (e.g., medium access control (MAC), physical (PHY)).

As such, the base station having the distributed deployment may further include a configuration for fronthaul interface communication. According to an embodiment, the base station, as the DU, may perform functions for transmitting and receiving signals in a wired communication environment. The DU may include a wired interface, for controlling a direct connection between a device and a device via a transmission medium (e.g., copper wire, optical fiber). For example, the DU may transmit an electrical signal to another device through a copper wire, or perform conversion between an electrical signal and an optical signal. The DU may be connected to the CU of the distributed deployment. However, this description is not to be construed to exclude a scenario in which the DU is connected to the CU via a wireless network. In addition, the DU may be additionally connected to the RU. However, this description is not to be construed as excluding a wireless environment including only the CU and the DU.

Figure 24:
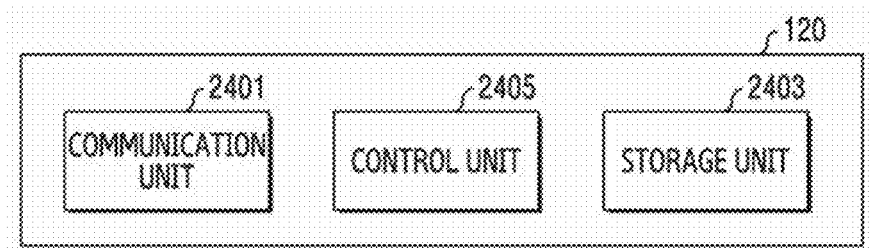
FIG. 24 illustrates a configuration of a terminal according to one or more embodiments of the present disclosure.

FIG. 24 illustrates a functional configuration of a terminal in a wireless communication system according to embodiments of the present disclosure. A term such as ' . . . unit' or '~er' used hereafter indicates a unit for processing at least one function or operation, and may be implemented using hardware, software, or a combination of hardware and software.

Referring to FIG. 24, the terminal includes a communication unit 2401, a storage unit 2403, and a control unit 2405.

The communication unit 2401 performs functions for transmitting and receiving signals over the radio channel. For example, the communication unit 2401 performs a conversion function between a baseband signal and a bit stream according to the physical layer standard of the system. For example, in data transmission, the communication unit 2401 generates complex symbols by encoding and modulating a transmit bit stream. In addition, in data reception, the communication unit 2401 restores a received bit stream by demodulating and decoding a baseband signal. According to one or more embodiments, the communication unit 2401 may encode a signal using the polar code or decode an encoded signal using the polar code. The communication unit 2401 may be configured to perform at least one of the operations of the transmitting stage and the operations of the receiving stage described in FIG. 1 through FIG. 22.

The communication unit 2401 upconverts a baseband signal into an RF band signal and then transmits it via an antenna, and down-converts an RF band signal received via the antenna into a baseband signal. For example, the communication unit 2401 may include a transmit filter, a receive filter, an amplifier, a mixer, an oscillator, a DAC, an ADC, and the like.

In addition, the communication unit 2401 may include a plurality of transmit and receive paths. Further, the communication unit 2401 may include an antenna unit. The communication unit 2401 may include at least one antenna array including a plurality of antenna elements. In terms of the hardware, the communication unit 2401 may include digital circuitry and analog circuitry (e.g., an RF integrated circuit (RFIC)). Herein, the digital circuitry and the analog circuitry may be implemented as a single package. Also, the communication unit 2401 may include a plurality of RF chains. Further, the communication unit 2401 may perform the beamforming. To give directivity to a signal to transmit or receive according to setting of the control unit 2405, the communication unit 2401 may apply a beamforming weight to the signal.

Also, the communication unit 2401 may transmit and receive a signal. For doing so, the communication unit 2401 may include at least one transceiver. The communication unit 2401 may receive a downlink signal. The downlink signal may include a synchronization signal (SS), a reference signal (RS) (e.g., cell-specific reference signal (CRS), demodulation (DM)-RS), system information (e.g., master system information (MIB), system information block (SIB), remaining system information (RMSI), other system information (OSI)), a configuration message, control information or downlink data. Also, the communication unit 2401 may transmit an uplink signal. The uplink signal may include a random access related signal (e.g., a random access preamble (RAP) (or a message 1 (Msg1)), a message 3 (Msg3)), a reference signal (e.g., a sounding reference signal (SRS), DM-RS), or a buffer status report (BSR), and the like.

Specifically, the communication unit 2401 may include an RF processing unit and a baseband processing unit. The RF processing unit performs a function for transmitting and receiving a signal over the wireless channel, such as band conversion and amplification of the signal. That is, the RF processing unit up-converts the baseband signal provided from the baseband processing unit into an RF band signal, transmits it via an antenna, and down-converts the RF band signal received through the antenna into a baseband signal. For example, the RF processing unit may include a transmit filter, a receive filter, an amplifier, a mixer, an oscillator, a DAC, an ADC, and the like. Although only one antenna is shown in FIG. 2H, the terminal may include a plurality of antennas. Also, the RF processing unit may include a plurality of RF chains. Further, the RF processing unit may perform beamforming. For the beamforming, the RF processing unit may adjust a phase and an amplitude of each of the signals transmitted and received via the plurality of the antennas or antenna elements.

The baseband processing unit performs the conversion function between the baseband signal and the bit stream according to the physical layer standard of the system. For example, in data transmission, the baseband processing unit generates complex symbols by encoding and modulating the transmit bit stream. In addition, in data reception, the baseband processing unit restores a received bit stream by demodulating and decoding the baseband signal provided from the RF processing unit. For example, according to the OFDM scheme, in the data transmission, the baseband processing unit generates complex symbols by encoding and modulating the transmit bit stream, maps the complex symbols to subcarriers, and generates OFDM symbols through an inverse fast Fourier transform (IFFT) operation and cyclic prefix (CP) insertion. In addition, in the data reception, the baseband processing unit divides the baseband signal provided from the RF processing unit into OFDM symbol, restores signals mapped to subcarriers through a fast Fourier transform (FFT) operation, and then demodulates and decodes them to recover the received bit stream.

The communication unit 2401 transmits and receives the signals as stated above. Hence, whole or part of the communication unit 2401 may be referred to as a transmitter, a receiver, or a transceiver. Further, the communication unit 2401 may include a plurality of communication modules to support a plurality of different wireless access technologies. Also, the communication unit 2401 may include different communication modules to process signals of different frequency bands. For example, the different radio access technologies may include a wireless local area network (LAN) (e.g., IEEE 802.1x), a cellular network (e.g., LTE, NR), and the like. In addition, the different frequency bands may include a super high frequency (SHF) (e.g., 2.5 GHZ, 5 GHZ) band and a millimeter wave (e.g., 60 GHz) band. In addition, the communication unit 2401 may use the same radio access technology on different frequency bands (e.g., an unlicensed band for licensed assisted access (LAA), citizens broadband radio service (CBRS) (e.g., 3.5 GHZ)).

The storage unit 2403 stores a basic program for operating the terminal, an application program, and data such as setting information. The storage unit 2403 may include a volatile memory, a non-volatile memory, or a combination of a volatile memory and a non-volatile memory. The storage unit 2403 stores data such as a basic program, an application program, and setting information for the operation of the terminal.

The control unit 2405 controls general operations of the terminal. For example, the control unit 2405 transmits and receives signals through the communication unit 2401. Also, the control unit 2405 records and reads data in and from the storage unit 2305. The control unit 2405 may execute the functions of the protocol stack requested by the communication standard. For doing so, the control unit 2405 may include at least one processor. The control unit 2405 may include at least one processor or microprocessor, or may be a part of a processor. In addition, a part of the communication unit 2401 and the control unit 2405 may be referred to as a communication processor (CP). The control unit 2405 may include various modules for performing the communication. According to one or more embodiments, the control unit 2405 may control the terminal to carry out operations according to the one or more embodiments described above.

The control unit 2405 controls general operations of the terminal. For example, the control unit 2405 transmits and receives signals through the communication unit 2401. In addition, the control unit 2405 writes and reads data in the storage unit 2403. For doing so, the control unit 2405 may include at least one processor. For example, the control unit 2405 may include a CP for controlling the communication and an application processor (AP) for controlling an upper layer such as an application program. According to one or more embodiments of the present disclosure, the control unit 2405 may be configured to perform a dynamic spectrum sharing function. According to an embodiment, the control unit 2405 may be configured such that the terminal 120 dynamically uses an LTE cell and a NR cell, in an evolved universal terrestrial radio access (E-UTRA) NR dual connectivity (EN-DC) environment. Also, according to an embodiment, the control unit 2405 may be configured such that the terminal 120 dynamically uses cells by two nodes, in a multi-radio access technology (RAT) dual connectivity (MR-DC) environment as well as the EN-DC environment. In addition, the control unit 2405 may control the terminal to carry out operations according to one or more embodiments described above.

In a first embodiment of the present disclosure, encoding input bits using a polar code includes obtaining a code parameter and a code setting; segmenting an input bit stream; encoding with an outer code; encoding a polar code based on the number of code input bits and the number of codeword bits; rate matching including interleaving based on a preset number of codeword bits; channel interleaving based on a preset modulation scheme; DEMUXING to change one bit stream to a plurality of bit streams based on a preset modulation scheme and a transmit count; mapping a plurality of input bits to one symbol based on the preset modulation scheme; and rate matching on a symbol basis based on a preset number of transmission symbols.

In a second embodiment of the present disclosure, encoding input bits using a polar code includes obtaining a code parameter and a code setting; segmenting an input bit stream; encoding with an outer code; encoding a Polar code based on the number of code input bits and the number of codeword bits; rate matching including interleaving based on a preset number of codeword bits; channel interleaving based on a preset modulation scheme; interleaving based on the preset modulation scheme and a transmit count; mapping a plurality of input bits to one symbol based on the preset modulation scheme; and rate matching on a symbol basis based on the preset number of transmission symbols.

In a third embodiment of the present disclosure, encoding input bits using a polar code includes obtaining a code parameter and a code setting; segmenting an input bit stream; encoding with an outer code; encoding a polar code based on the number of code input bits and the number of codeword bits; inner segmenting based on a preset rate matching size; and bit interleaving based on an order of the segmented bit stream.

In a fourth embodiment of the present disclosure, encoding input bits using a polar code includes obtaining a code parameter and a code setting; segmenting an input bit stream; encoding with an outer code; encoding a polar code based on the number of code input bits and the number of codeword bits; inner segmenting based on a preset rate matching size;

bit-interleaving each segmented bit stream; and DEMUXING based on an of the segmented bit stream.

One or more embodiments of the present disclosure suggest solutions for achieving excellent error correction performance (frame error rate or bit error rate) in polar code encoding in a system having repeated transmission, retransmission, and a low code rate. According to one or more embodiments of the present disclosure, the transmitting stage may determine a rate matching size to select the same parent code of the polar code even if the number of bits transmitted in repeated transmission is different, select a DEMUXING method (e.g., re-DEMUX) based on a transmit count, and perform symbol unit rate matching according to the number of bits transmitted.

According to one or more embodiments of the present disclosure, the transmitting stage may determine the rate matching size to select the same parent code of the polar code even if the number of bits transmitted in repeated transmission is different, select reverse interleaving based on a transmit count, and perform symbol unit rate matching according to the number of bits transmitted.

According to one or more embodiments of the present disclosure, the transmitting stage may rate-match a polar codeword during channel coding using a polar code, segment the rate-matched bitstream into a plurality of bitstreams, and bit-interleave based on an order of the segmented bit stream.

According to one or more embodiments of the present disclosure, the transmitting stage may rate-match a polar codeword in channel coding using a polar code, segments the rate-matched bitstream into a plurality of bitstreams, interleave each segmented bit stream, and select DEMUXING based on an order of the bit stream. Thus, by configuring the transmit signal to have the same parent code size, and uniform reliability distribution at the receiving stage, better error correction performance than the conventional transmission technique may be achieved.

The present disclosure proposes a repeated transmission scheme for obtaining an additional decoding gain, in rate matching for adjusting a code rate on a basic structure of a polar ode determined as a power of length two (2). In the repeated transmission, a channel coding gain may be increased, by performing symbol rate matching, to make the same mother code size. In addition, the embodiments of the present disclosure may maximize the channel coding gain, by solving different reliability according to symbol mapping such as modulation schemes (e.g., 16 QAM, 64 QAM, 256 QAM) at the receiving stage.

The present disclosure has described the channel coding using the polar code and its operations according to one or more embodiments in an exemplary situation used for UCI transmission, but embodiments of the present disclosure are not limited thereto. Channel coding using a polar code and operations according to some embodiments may be used in the same or similar manner in transmitting a broadcast channel (BCH) or downlink control information (DCI). In addition, the repeated transmission to the rate matching on the above-described PUSCH has been described as an example of the repeated transmission, but embodiments of the present disclosure are not limited thereto. It is noted that embodiments of the present disclosure may also be applied to periodic transmission such as broadcast information (e.g., MIB of PBCH) or repetitions configured for a low-power terminal such as an MTC terminal.

Also, the embodiments of the present disclosure have illustrated that the symbol rate matching is performed, but it should be noted that it is not construed as being performed always in all embodiments. In each embodiment, in the reverse mapping (e.g., reliability based DEMUX management, reliability based interleaving, inner segmentation interleaving, inner segmentation based demultiplexing), the symbol rate matching may be or may be not performed after constellation mapping.

According to embodiments of the present disclosure, a method of a transmitting stage in a wireless communication system may include obtaining an encoded bit stream from information bits using a polar code, transmitting a first signal generated through modulation of the bit stream, performing reverse mapping on the bit stream, and transmitting a second signal generated through modulation of the reverse-mapped bit stream.

According to embodiments of the present disclosure, the reverse mapping may be performed through a reverse DEMUX.

According to embodiments of the present disclosure, the reverse mapping may include cyclic shift of a designated size.

According to embodiments of the present disclosure, the reverse mapping may include interleaving according to a transmit count of the bit stream.

According to embodiments of the present disclosure, the reverse mapping may be performed if the modulation is 16 QAM, 64 QAM, 256 QAM, or 1024 QAM.

According to embodiments of the present disclosure, a method of a receiving stage in a wireless communication system may include receiving a first signal generated through modulation of a bit stream, receiving a second signal generated through reverse-mapping and modulation of the bit stream, and obtaining information bits of the bit stream by combining the first signal and the second signal based on the reverse mapping, and the bit stream may be encoded using a polar code.

According to embodiments of the present disclosure, the reverse mapping may be performed through a reverse DEMUX.

According to embodiments of the present disclosure, the reverse mapping may include cyclic shift of a designated size.

According to embodiments of the present disclosure, the reverse mapping may include interleaving according to a transmit count of the bit stream.

According to embodiments of the present disclosure, the reverse mapping may be performed if the modulation is 16 QAM, 64 QAM, 256 QAM, or 1024 QAM.

According to embodiments of the present disclosure, a transmitting stage in a wireless communication system may include at least one processor and at least one transceiver, and the at least one processor may be configured to obtain an encoded bit stream from information bits using a polar code, transmit a first signal generated through modulation of the bit stream, perform reverse mapping on the bit stream, and transmit a second signal generated through modulation of the reverse-mapped bit stream.

According to embodiments of the present disclosure, a receiving stage in a wireless communication system may include at least one processor and at least one transceiver, the at least one processor may be configured to receive a first signal generated through modulation of a bit stream, receive a second signal generated through reverse mapping and modulation of the bit stream, and obtain information bits of the bit stream by combining the first signal and the second signal based on the reverse mapping, and the bit stream may be encoded using a polar code.

According to embodiments of the present disclosure, a method of a transmitting stage in a wireless communication system may include obtaining an encoded bit stream from information bits using a polar code, obtaining an output bit sequence through rate matching of the bit stream, performing first interleaving on a first bit sequence of the output bit sequence, performing second interleaving on a second bit sequence other than the first bit sequence in the output bit sequence, obtaining a code sequence based on concatenation of a result of the first interleaving and a result of the second interleaving, and transmitting a signal according to the code sequence to a receiving stage, and the second interleaving may be reverse of the first interleaving.

According to embodiments of the present disclosure, a method of a receiving stage in a wireless communication system may include receiving a signal according to a code sequence from a transmitting stage, performing first deinterleaving on a first code sequence of the code sequence, performing second deinterleaving on a second code sequence excluding the first code sequence in the code sequence, obtaining an output bit sequence by concatenating a result of the first deinterleaving and a result of the second deinterleaving, and obtaining information bits by de-rate matching and polar-decoding the output bit sequence, and the second deinterleaving may be reverse of the first deinterleaving.

The methods according to the embodiments described in the claims or the specification of the present disclosure may be implemented in software, hardware, or a combination of hardware and software.

As for the software, a computer-readable storage medium storing one or more programs (software modules) may be provided. One or more programs stored in the computer-readable storage medium may be configured for execution by one or more processors of an electronic device. One or more programs may include instructions for controlling the electronic device to execute the methods according to the embodiments described in the claims or the specification of the present disclosure.

Such a program (software module, software) may be stored to a random access memory, a non-volatile memory including a flash memory, a read only memory (ROM), an electrically erasable programmable ROM (EEPROM), a magnetic disc storage device, a compact disc (CD)-ROM, digital versatile discs (DVDs) or other optical storage devices, and a magnetic cassette. Alternatively, it may be stored to a memory combining some or all of those recording media. A plurality of memories may be included.

Also, the program may be stored in an attachable storage device accessible via a communication network such as Internet, Intranet, LAN, wide LAN (WLAN), or storage area network (SAN), or a communication network by combining these networks. Such a storage device may access a device which executes an embodiment of the present disclosure through an external port. In addition, a separate storage device on the communication network may access the device which executes an embodiment of the present disclosure.

In the specific embodiments of the present disclosure, the elements included in the disclosure are expressed in a singular or plural form. However, the singular or plural expression is appropriately selected according to a proposed situation for the convenience of explanation, the present disclosure is not limited to a single element or a plurality of elements, the elements expressed in the plural form may be configured as a single element, and the elements expressed in the singular form may be configured as a plurality of elements.

While the specific embodiment has been described in the explanations of the present disclosure, it will be noted that various changes may be made therein without departing from the scope of the present disclosure. Thus, the scope of the present disclosure is not limited and defined by the described embodiment and is defined not only the scope of the claims as below but also their equivalents.

What is claimed is:

1. A method performed by a transmitting device in a wireless communication system, the method comprising:
   generating, using a polar code, an encoded bit stream from information bits;
   transmitting a first signal generated by a first modulation of a first demultiplexed bit stream, wherein the first demultiplexed bit stream is generated based on the encoded bit stream using a demultiplexer (DEMUX);
   transmitting a second signal generated by a second modulation of a second demultiplexed bit stream, wherein the second demultiplexed bit stream is generated based on the encoded bit stream using the DEMUX and a cyclic shift of a designated size,
   wherein a mapping order of the second demultiplexed bit stream is reverse of a mapping order of the first demultiplexed bit stream.

2. The method of claim 1, wherein information on the cyclic shift of the designated size is configured via a radio resource control (RRC) message.

3. The method of claim 1, wherein the second demultiplexed bit stream is generated based on an interleaving according to a transmit count of the encoded bit stream.

4. The method of claim 1, wherein the first modulation or the second modulation is 16 quadrature amplitude modulation (QAM), 64 QAM, 256 QAM, or 1024 QAM.

5. A method performed by a receiving device in a wireless communication system, the method comprising:
   receiving a first signal generated by a first modulation of a first demultiplexed bit stream, wherein the first demultiplexed bit stream is generated using a demultiplexer (DEMUX);
   receiving a second signal generated by a second modulation of a second demultiplexed bit stream, wherein the second demultiplexed bit stream is generated based on an encoded bit stream using the DEMUX and a cyclic shift of a designated size; and
   obtaining information bits of a bit stream by combining the first signal and the second signal,
   wherein the bit stream is encoded using a polar code, and
   wherein a mapping order of the second demultiplexed bit stream is reverse of a mapping order of the first demultiplexed bit stream.

6. The method of claim 5, wherein information on the cyclic shift of the designated size is configured via a radio resource control (RRC) message.

7. The method of claim 5, wherein the second demultiplexed bit stream is generated based on an interleaving according to a transmit count of the bit stream.

8. The method of claim 5, wherein the first modulation or the second modulation is 16 quadrature amplitude modulation (QAM), 64 QAM, 256 QAM, or 1024 QAM.

9. A transmitting device in a wireless communication system, the transmitting device comprising:
   a transceiver; and
   a controller configured to:
      generate, using a polar code, an encoded bit stream from information bits,
      transmit a first signal generated by a first modulation of a first demultiplexed bit stream, wherein the first demultiplexed bit stream is generated based on the encoded bit stream using a demultiplexer (DEMUX),
      transmit a second signal generated by a second modulation of a second demultiplexed bit stream, wherein the second demultiplexed bit stream is generated based on the encoded bit stream using the DEMUX and a cyclic shift of a designated size,
   wherein a mapping order of the second demultiplexed bit stream is reverse of a mapping order of the first demultiplexed bit stream.

10. A receiving device in a wireless communication system, the receiving device comprising:
   a transceiver; and
   a controller configured to:
      receive a first signal generated by a first modulation of a first demultiplexed bit stream, wherein the first demultiplexed bit stream is generated using a demultiplexer (DEMUX),
      receive a second signal generated by a second modulation of a second demultiplexed bit stream, wherein the second demultiplexed bit stream is generated based on an encoded bit stream using the DEMUX and a cyclic shift of a designated size, and
      obtain information bits of a bit stream by combining the first signal and the second signal,
   wherein the bit stream is encoded using a polar code, and
   wherein a mapping order of the second demultiplexed bit stream is reverse of a mapping order of the first demultiplexed bit stream.

* * * * *